United States Patent
Kamatani et al.

(10) Patent No.: US 10,541,260 B2
(45) Date of Patent: Jan. 21, 2020

(54) ORGANIC PHOTOELECTRIC CONVERSION ELEMENT, OPTICAL AREA SENSOR, IMAGING DEVICE, AND IMAGING APPARATUS

(71) Applicant: CANON KABUSHIKI KAISHA, Tokyo (JP)

(72) Inventors: Jun Kamatani, Tokyo (JP); Naoki Yamada, Inagi (JP); Masumi Itabashi, Yamato (JP); Yosuke Nishide, Kawasaki (JP); Hirokazu Miyashita, Tokyo (JP); Tetsuya Kosuge, Yokohama (JP); Satoru Shiobara, Funabashi (JP); Tetsuo Takahashi, Kawasaki (JP); Akihiro Senoo, Kawasaki (JP); Kentaro Ito, Tokyo (JP); Satoshi Ota, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/578,654

(22) PCT Filed: May 24, 2016

(86) PCT No.: PCT/JP2016/002520
§ 371 (c)(1),
(2) Date: Nov. 30, 2017

(87) PCT Pub. No.: WO2016/194337
PCT Pub. Date: Dec. 8, 2016

(65) Prior Publication Data
US 2018/0108691 A1     Apr. 19, 2018

(30) Foreign Application Priority Data
Jun. 5, 2015 (JP) .................................. 2015-115237

(51) Int. Cl.
*H01L 31/062* (2012.01)
*H01L 27/146* (2006.01)
(Continued)

(52) U.S. Cl.
CPC .. *H01L 27/14605* (2013.01); *H01L 27/14647* (2013.01); *H01L 51/0059* (2013.01);
(Continued)

(58) Field of Classification Search
CPC ......... H01L 27/14647; H01L 27/14605; H01L 51/4246; H01L 27/307; H01L 51/0059;
(Continued)

(56) References Cited

U.S. PATENT DOCUMENTS

2003/0218173 A1* 11/2003 Nishi .................. H01L 27/3209
257/79
2007/0063156 A1   3/2007 Hayashi
(Continued)

FOREIGN PATENT DOCUMENTS

JP      2013-236008 A      11/2013

OTHER PUBLICATIONS

David M. Lemal, "Journal of American Chemical Society", 1964, 86 (12), pp. 2518-2519.
(Continued)

*Primary Examiner* — Stephen M Bradley
*Assistant Examiner* — Wasiul Haider
(74) *Attorney, Agent, or Firm* — Canon USA, Inc., IP Division

(57) ABSTRACT

An organic photoelectric conversion element includes an anode, a cathode, and a photoelectric conversion portion between the anode and the cathode. The photoelectric conversion portion includes a first organic compound layer containing an organic compound. Also, a second organic compound layer is disposed between the cathode and the photoelectric conversion portion. The second organic compound layer contains an organic compound having an ionization potential of 5.1 eV or less and a band gap of 2.5 eV or more.

22 Claims, 1 Drawing Sheet

(51) Int. Cl.
*H01L 51/00* (2006.01)
*H01L 27/30* (2006.01)
*H01L 51/42* (2006.01)

(52) U.S. Cl.
CPC ...... *H01L 51/0067* (2013.01); *H01L 51/0072* (2013.01); *H01L 51/0081* (2013.01); *H01L 27/307* (2013.01); *H01L 51/4246* (2013.01)

(58) Field of Classification Search
CPC ............. H01L 51/0067; H01L 51/0081; H01L 51/424; H01L 51/0072; H01L 51/005; Y02E 10/549
See application file for complete search history.

(56) References Cited

U.S. PATENT DOCUMENTS

| | | |
|---|---|---|
| 2007/0267970 A1 | 11/2007 | Yamamoto |
| 2008/0035965 A1 | 2/2008 | Hayashi |
| 2009/0189058 A1 | 7/2009 | Mitsui |
| 2010/0032661 A1* | 2/2010 | Osterbacka .......... G01N 27/414 257/40 |
| 2011/0310282 A1* | 12/2011 | Toda ................. H01L 27/14632 348/308 |
| 2012/0193612 A1 | 8/2012 | Chun |
| 2013/0168790 A1* | 7/2013 | Hayashi ................ H01L 51/424 257/431 |
| 2015/0060644 A1* | 3/2015 | Fukuhara ............... H04N 5/378 250/208.1 |
| 2015/0162545 A1 | 6/2015 | Kamatani |
| 2015/0162549 A1 | 6/2015 | Kamatani |
| 2016/0248038 A1* | 8/2016 | Philippens .......... H01L 51/0023 |

OTHER PUBLICATIONS

H. W. Wanzlick "Organic Syntheses", Coll. vol. 5, p. 115 (1973) and vol. 47, p. 14 (1967).

* cited by examiner

ORGANIC PHOTOELECTRIC CONVERSION ELEMENT, OPTICAL AREA SENSOR, IMAGING DEVICE, AND IMAGING APPARATUS

CROSS-REFERENCE TO RELATED APPLICATIONS

This application is a National Stage filing of International Application No. PCT/JP2016/002520 filed May 24, 2016, which claims the benefit of Japanese Patent Application No. 2015-115237, filed Jun. 5, 2015, the disclosures of each of which are hereby incorporated by reference herein in their entirety.

TECHNICAL FIELD

The present invention relates to an organic photoelectric conversion element, an optical area sensor, an imaging device, and an imaging apparatus.

BACKGROUND ART

Two-dimensional light-receiving devices are widely used as an imaging device. This type of imaging device includes pixels defined by photoelectric conversion portions two-dimensionally arranged in a semiconductor, and singles produced in the pixels by photoelectric conversion are transferred as charges and read out by a CCD circuit or a CMOS circuit.

A photodiode including a photoelectric conversion portion containing an organic compound has been known.

PTL 1 discloses a highly sensitive, fast-response organic photoelectric conversion element with a high S/N ratio of light current to dark current. The organic photoelectric conversion element includes a hole blocking layer containing a fullerene derivative and an organic compound having an ionization potential of 5.5 eV or more.

In the organic photoelectric conversion element disclosed in PTL 1, the holes generated from the photoelectric conversion layer do not efficiently reach a hole-collecting electrode. Thus, this organic photoelectric conversion element has room for improvement.

CITATION LIST

Patent Literature

PTL 1: Japanese Patent Laid-Open No. 2013-236008

SUMMARY OF INVENTION

The present invention provides an organic photoelectric conversion element in which holes generated by photoelectric conversion can efficiently move to the cathode.

According to an aspect of the present invention, there is provided an organic photoelectric conversion element including an anode, a cathode, and a photoelectric conversion portion. The organic photoelectric conversion portion includes a first organic compound layer. The organic photoelectric conversion element also includes a second organic compound layer between the cathode and the photoelectric conversion portion. The second organic compound layer contains an organic compound having an ionization potential of 5.1 eV or less and a band gap of 2.5 eV or more.

Further features of the present invention will become apparent from the following description of exemplary embodiments with reference to the attached drawings.

DESCRIPTION OF EMBODIMENTS

The present invention provides an organic photoelectric conversion element including an anode, a cathode, and a photoelectric conversion portion between the anode and the cathode. The photoelectric conversion portion includes a first organic compound layer, and a second organic compound layer is disposed between the cathode and the photoelectric conversion portion. The organic compound contained in the second organic compound layer has an ionization potential of 5.1 eV or less and a band gap of 2.5 eV or more.

Since this organic compound layer has an ionization potential of 5.1 eV or less, holes can be efficiently transferred from the photoelectric conversion portion to the cathode. Also, since the organic compound of the second organic compound layer has a band gap of 2.5 eV or more, electrons are prevented from flowing into the photoelectric conversion portion from the cathode.

Embodiments

Figure 1:
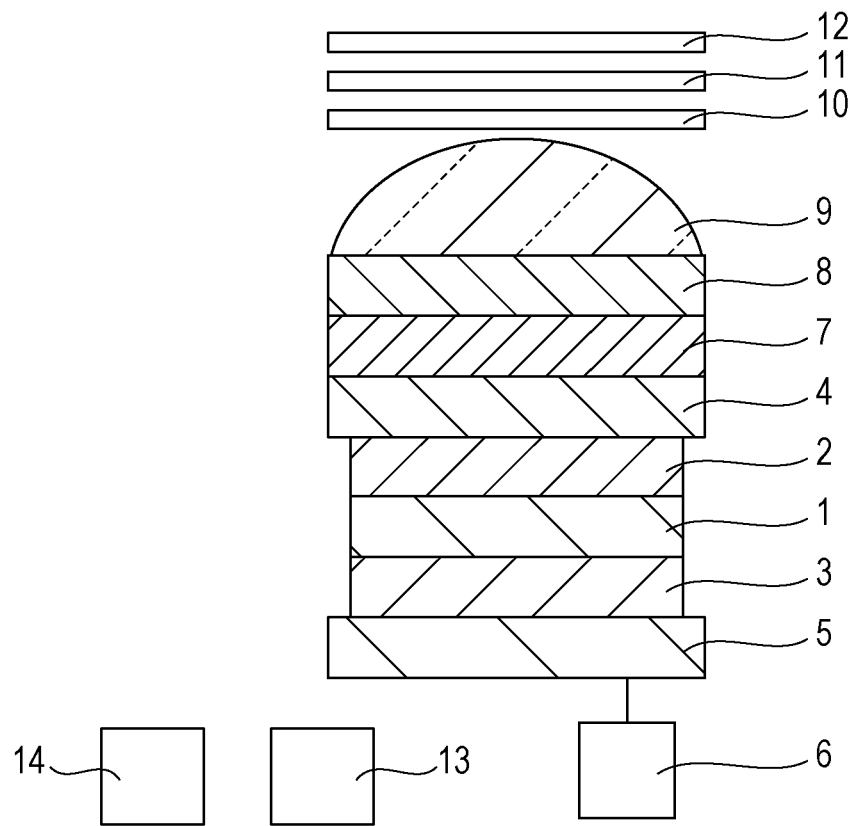
FIG. 1 is a schematic sectional view of an organic photoelectric conversion element according to an embodiment of the present invention.

FIG. 1 is a schematic sectional view of an organic photoelectric conversion element according to an embodiment of the present invention. The organic photoelectric conversion element includes a first organic compound layer 1 between a cathode 4 and an anode 5. The first organic component layer 1 acts as a photoelectric conversion portion that converts light into charges. Since the first organic compound layer is intended to convert light into charges, it may be called a photoelectric conversion layer. In addition to the components described in the following, FIG. 1 includes an optical filter 10, a joint section 11, an image optical system 12, a receiver 13, a transmitter 14, and a wavelength selecting section, or optical filter, 8.

The organic photoelectric conversion element further includes a second organic compound layer 2 between the first organic compound layer and the cathode, and a third organic compound layer 3 between the first organic compound layer and the anode.

The anode 5 is connected to a readout circuit 6. The readout circuit 6 reads information according to the charge generated from the organic conversion portion and transmits the information to, for example, a signal processing section (not shown) disposed at the downstream side. The readout circuit 6 may be connected to the cathode.

The organic photoelectric conversion element also includes an inorganic protective layer 7 over the cathode. The inorganic protective layer is made of, for example, silicon oxide, silicon nitride, aluminum oxide, or the like. The protective layer may be formed by vapor deposition, sputtering, ALD (atomic layer deposition), or the like.

A color filter 8 is disposed on the inorganic protective layer. The color filter may transmit red light of visible light.

If a plurality of organic photoelectric conversion elements are arranged, a plurality of color filters may be provided, one for each organic photoelectric conversion element. Alternatively, a single color filter may be shared by the plurality of organic photoelectric conversion elements. The color filters may be arranged for example, in a Bayer array.

A microlens 9 is disposed on the color filter. The microlens focuses incoming light on the organic photoelectric conversion element. If a plurality of organic photoelectric conversion elements are arranged, a plurality of microlenses may be provided, one for each organic photoelectric conversion element. Alternatively, a single microlens may be shared by the plurality of organic photoelectric conversion elements.

For photoelectric conversion in the organic photoelectric conversion element, it is desirable to apply a voltage between the cathode and the anode. The voltage is desirably in the range of 0.5 V to 15 V.

Figure 2:
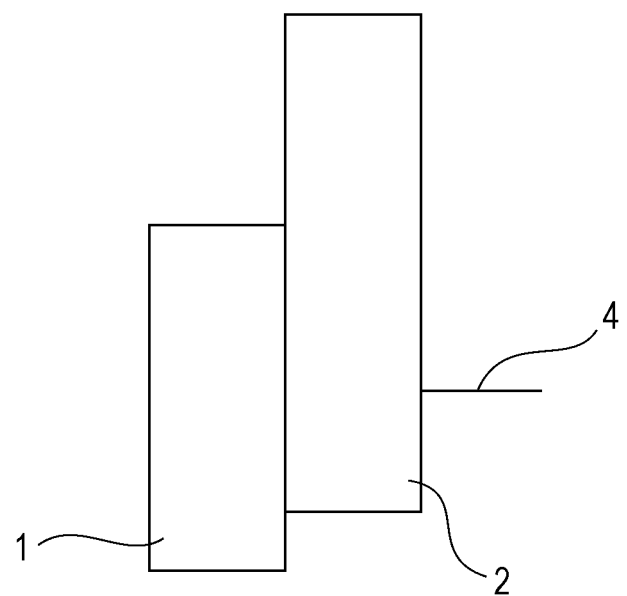
FIG. 2 is a diagram illustrating the energy between the electrodes of an organic photoelectric conversion element according to an embodiment of the present invention.

FIG. 2 is an energy diagram of an organic photoelectric conversion element according to an embodiment of the present invention. FIG. 2 shows only the cathode 4, the first organic compound layer 1, and the second organic compound layer 2, omitting other members or components. In FIG. 2, the line denoted by reference numeral 4 represents the energy level of the work function of the cathode. For the rectangular shapes denoted by reference numerals 1 and 2, the length in the vertical direction represents the band gap of the organic compound contained in the corresponding organic compound layer; the position of the lower side of the rectangular shape represents the ionization potential of the organic compound; and the position of the upper side of the rectangular shape represents the electron affinity.

If any of the organic compound layers contains a plurality of organic compounds, the energy of the organic compound contained with the highest proportion is shown.

In FIG. 2, the lower the position, the higher the energy. Also, the larger the length in the vertical direction of the rectangular shape, the wider the band gap.

Desirably, the organic compound of the second organic compound layer has a lower ionization potential than the organic compound of the first organic compound layer. In this condition, holes can efficiently move from the first organic compound layer to the cathode.

More specifically, the ionization potential of the organic compound in the second organic compound layer is desirably 0.5 eV or more lower than that in the first organic compound layer. Also, the ionization potential of the organic compound in the second organic compound layer is desirably higher than the work function of the cathode.

Hence, it is desirable that the ionization potential of the organic compound in the second organic compound layer be higher than the work function of the cathode and lower than the ionization potential of the organic compound in the first organic compound layer.

Desirably, the organic compound in the second organic compound layer has a lower electron affinity than the organic compound in the first organic compound layer. In this condition, electrons can be prevented from flowing into the first organic compound layer from the cathode. More specifically, the electron affinity of the organic compound in the second organic compound layer is desirably 0.5 eV or more lower than that in the first organic compound layer. Also, the electron affinity of the organic compound in the second organic compound layer is desirably 1.0 eV or more lower than the work function of the cathode.

Desirably, the organic compound in the second organic compound layer is resistant to water. This is because the second organic compound layer is disposed closer to the outside than the first organic compound layer, accordingly, more liable to be affected by moisture entering from the outside. More specifically, it is desirable that the organic compound in the second organic compound layer be less soluble in water or less reactive to water.

The organic compound in the second organic compound layer is more resistant to water than the organic compound contained in the hole blocking layer disclosed in PTL 1.

The water resistance of organic compounds can be estimated in accordance with the following procedure. An organic compound layer is formed to a thickness of 50 nm or more on a silicon substrate by vacuum deposition using resistance heating at $5 \times 10^{-3}$ Pa in a vacuum chamber of a vapor deposition apparatus. Water is dropped onto the organic compound layer and is allowed to stand for 10 minutes.

Then, the thickness of the organic compound layer is measured 10 minutes after water has been dropped. The water resistance thus can be estimated by comparing the thicknesses before and after dropping water. The rate of decrease in thickness at this time can be measured with, for example, an instrument P-16 manufactured by KLA-Tencor. This is calculated using the average of measurements at two points at both ends of a droplet trace.

The rate of decrease in thickness of the water-resistant organic compound layer is desirably in the range of 0% to 50%, more desirably in the range of 0% to 30%, such as in the range of 0% to 10%.

Alternatively, the water resistance may be estimated by measuring the contact angle of the water droplet with the organic compound layer, instead of measuring the rate of decrease in thickness. The contact angle can be measured by a known method. For example, the contact angle may be measured with, for example, a contact angle meter DropMaster 700 and an analysis software program FAMAS (each manufactured by Kyowa Interface Science).

The contact angle with the water-resistant organic compound layer is desirably in the range of 50° to 120°, such as in the range of 70° to 100°.

A high water resistance of an organic compound layer suggests that the organic compound in the organic compound layer is resistant to water. Water-resistant organic compound layers are unlikely to be altered in surface profile of the organic compound layer even if water is dropped thereon. Therefore the contact angle of the water droplet is large or the rate of decrease in thickness is low.

Desirably, the second organic compound layer contains at least one selected from the group consisting of imidazolidene derivatives, benzoimidazolidene derivatives, and acridinylidene derivatives.

The second organic compound layer may be in contact with the cathode.

The ionization potential can be measured in accordance with the following procedure.

An organic compound layer is formed on an Al/Nd substrate by vacuum deposition using resistance heating at $5 \times 10^{-3}$ Pa in a vacuum chamber. Desirably, the layer is deposited to a thickness in the range of about 150 nm to 200 nm. Then, the ionization potential of the resulting layer is measured with an atmospheric photoelectron spectrometer, for example, AC-2 manufactured by Riken Keiki.

The band gap can be measured in accordance with the following procedure.

An organic compound layer is formed on an Al/Nd substrate by vacuum deposition using resistance heating at $5 \times 10^{-3}$ Pa in a vacuum chamber. Desirably, the layer is deposited to a thickness in the range of about 150 nm to 200 nm. For determining band gap, an absorption spectrum is measured with an ultraviolet-visible spectrophotometer or the like. The band gap is determined from the absorption edge of the absorption spectrum. The ultraviolet-visible spectrophotometer may be, for example, V-560 manufactured by JASCO Corporation.

Structure of Organic Photoelectric Conversion Element

The first organic compound layer of the organic photoelectric conversion element according to an embodiment of the present invention is intended to receive light and generate charges according to the amount of the light. The first organic compound layer may be called a photoelectric conversion layer because of the function thereof. The first organic compound layer may contain a plurality of organic compounds.

When the first organic compound layer contains a plurality of organic compounds, a mixture of the plurality of organic compounds may form a single layer, or the plurality of organic compounds may form a multilayer composition including a plurality of layers.

If the plurality of organic compounds form a multilayer composite, it is desirable to form the layers of the composite in the direction from the anode to the cathode.

Advantageously, the first organic compound layer contains a p-type organic semiconductor or an n-type organic semiconductor. More advantageously, the first organic compound layer has, at least in part, a bulk hetero layer (mixed layer) containing a mixture of a p-type organic compound and an n-type organic compound.

The bulk hetero layer of the first organic compound layer can increase the photoelectric conversion efficiency (sensitivity) of the photoelectric conversion element. When the bulk hetero layer contains organic compounds with an optimum proportion, the mobilities of electrons and holes in the first organic compound layer are increased, and accordingly the optical response speed of the organic photoelectric conversion element can be increased.

Advantageously, the first organic compound layer contains fullerene or a fullerene derivative as the n-type organic semiconductor. A chain of molecules of the fullerene or fullerene derivative in the first organic compound layer defines a path of electrons and thus increases electron transportability, consequently increasing the optical response speed of the organic photoelectric conversion element. The fullerene or fullerene derivative content is desirably in the range of 40% by volume to 85% by volume relative to the total volume of the materials of the photoelectric conversion layer or the first organic compound layer.

Exemplary fullerenes or fullerene derivatives include Fullerene C60, Fullerene C70, Fullerene C76, Fullerene C78, Fullerene C80, Fullerene C82, Fullerene C84, Fullerene C90, Fullerene C96, Fullerene C240, Fullerene 540, mixed fullerenes, and fullerene nanotubes.

The fullerene derivative is a fullerene having a substituent. The substituent may be an alkyl group, an aryl group, a heterocyclic group, or the like.

The p-type organic semiconductor that may be contained in the first organic compound layer can act as an organic semiconductor donor, and is typically a hole-transporting, electron-donating organic compound. More specifically, the p-type organic semiconductor is one of the two organic compounds, having a lower ionization potential than the other.

Examples of the p-type organic semiconductor that can be used in the first organic compound layer include triarylamine compounds, pyran compounds, quinacridone compounds, benzidine compounds, pyrazoline compounds, styrylamine compounds, hydrazone compounds, triphenylmethane compounds, carbazole compounds, polysilane compounds, thiophene compounds, phthalocyanine compounds, cyanine compounds, merocyanine compounds, oxonol compounds, polyamine compounds, indole compounds, pyrrole compounds, pyrazole compounds, polyarylene compounds, condensed aromatic hydrocarbons (naphthalene derivatives, anthracene derivatives, phenanthrene derivatives, tetracene derivatives, pyrene derivatives, perylene derivatives, fluoranthene derivatives), and metal complexes having nitrogen-containing heterocyclic compounds as ligands. Among these advantageous are triarylamine compounds, pyran compounds, quinacridone compounds, pyrrole compounds, phthalocyanine compounds, merocyanine compounds, and condensed aromatic hydrocarbons.

Fluoranthene derivatives are compounds having a fluoranthene skeleton in the chemical structure thereof. Similarly, naphthalene derivatives, anthracene derivatives, phenanthrene derivatives, tetracene derivatives, pyrene derivatives, and perylene derivatives are each a compound having the skeleton of the corresponding chemical compound in the chemical structure thereof.

Desirably, the first organic compound layer is not luminescent. More specifically, "not luminescent" implies that the layer has a luminescent quantum efficiency of 1% or less, desirably 0.5% or less, such as 0.1% or less, in the visible wavelength region (400 nm to 730 nm). If the luminescent quantum efficiency of the photoelectric conversion portion exceeds 1%, sensing performance or imaging performance is adversely affected when the organic photoelectric conversion element is applied to a censor or an imaging device.

The organic photoelectric conversion element according to an embodiment of the present invention may further include a third organic compound layer between the anode and the first organic compound layer. The third organic compound layer is intended to prevent holes from entering the first organic compound layer from the anode and desirably has a high ionization potential.

The organic compound layer according to an embodiment may include a substrate. The substrate may be a silicon substrate, a glass substrate, a flexible substrate, or the like.

The cathode of the organic photoelectric conversion element is an electrode that collects holes of the charges generated in the photoelectric conversion portion. The cathode may be made of an electrically conductive transparent material. In a structure where the cathode is disposed near the side of the organic photoelectric conversion element through which light enters, it is desirable that the cathode be optically transparent. The cathode may be called a hole-collecting electrode or a negative electrode.

Examples of the cathode material include metals, metal oxides, metal nitrides, metal borides, organic electroconductive compounds, and mixture thereof. More specifically, cathode materials include elemental metals, such as gold, platinum, silver, copper, nickel, palladium, cobalt, selenium, vanadium, tungsten, aluminum, titanium, and manganese; mixtures or alloys of these elemental metals; antimony- or fluorine-doped tin oxide (ATO, FTO); electroconductive metal oxides, such as tin oxide, zinc oxide, indium oxide, indium tin oxide (ITO), and indium zinc oxide (IZO); inorganic electroconductive compounds, such as copper iodide and copper sulfide; organic electroconductive materials, such as polyaniline, polythiophene, and polypyrrole; and composites including an organic electroconductive material layer and an ITO or titanium nitride layer.

The anode of the organic photoelectric conversion element is an electrode that collects electrons of the charges generated in the photoelectric conversion portion. In a structure where the anode is disposed on the side of the organic photoelectric conversion element through which light enters, it is desirable that the anode be optically transparent. The anode may be called an electron-collecting electrode or a positive electrode.

Examples of the cathode material include metals, metal oxides, metal nitrides, metal borides, organic electroconductive compounds, and mixture thereof. More specifically, cathode materials include elemental metals, such as gold, platinum, silver, copper, nickel, palladium, cobalt, selenium, vanadium, tungsten, aluminum, titanium, and manganese; mixtures or alloys of these elemental metals; antimony- or fluorine-doped tin oxide (ATO, FTO); electroconductive metal oxides, such as tin oxide, zinc oxide, indium oxide, Al-doped zinc oxide (AZO), indium tin oxide (ITO), indium zinc oxide (IZO), and $TiO_2$; inorganic electroconductive compounds, such as copper iodide and copper sulfide; organic electroconductive materials, such as polyaniline, polythiophene, and polypyrrole; and composites including an organic electroconductive material layer and an ITO or titanium nitride layer.

One of the anode and the cathode that is connected to the readout circuit may be called the pixel electrode.

If a capacitor element including an insulating layer is disposed between the anode and the cathode, the anode and the cathode may be called the pixel electrode and the opposing electrode, respectively.

If either electrode is made of ITO, the ITO electrode can be formed by an electron beam method, sputtering, resistance heating vapor deposition, a chemical reaction method (for example, sol-gel method), coating with an indium tin oxide dispersion, and so forth. The resulting ITO electrode may be subjected to UV-ozone treatment, plasma treatment, or the like. If either electrode is made of TiN, the TiN electrode can be formed by reactive sputtering or any other method, and the resulting TiN electrode may be subjected to annealing, UV-ozone treatment, plasma treatment, or the like.

The organic compound layer of the photoelectric conversion element according to an embodiment of the present invention may contain an organic compound represented by any one of general formulas (1) to (6):

[Chem. 1]

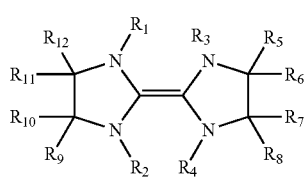

(1)

In formula (1), $R_1$ to $R_4$ each represent a group selected from the groups consisting of substituted or unsubstituted phenyl groups, substituted or unsubstituted benzyl groups, substituted or unsubstituted biphenyl groups, substituted or unsubstituted naphthyl groups, substituted or unsubstituted phenanthrenyl groups, substituted or unsubstituted fluorenyl groups, substituted or unsubstituted triphenylenyl groups, substituted or unsubstituted dibenzofuranyl groups, and substituted or unsubstituted dibenzothiophenyl groups.

$R_5$ to $R_{12}$ each represent a hydrogen atom or a group selected from the group consisting of alkyl groups having a carbon number in the range of 1 to 4 and substituted or unsubstituted aryl groups.

The aryl group may have an alkyl group having a carbon number in the range of 1 to 4 as a substituent.

[Chem. 2]

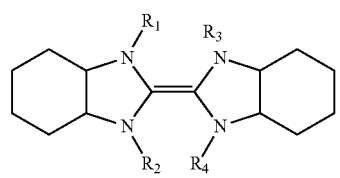

(2)

In formula (2), $R_1$ to $R_4$ each represent a group selected from the groups consisting of substituted or unsubstituted phenyl groups, substituted or unsubstituted biphenyl groups, substituted or unsubstituted naphthyl groups, substituted or unsubstituted phenanthrene groups, substituted or unsubstituted fluorenyl groups, substituted or unsubstituted triphenylene groups, substituted or unsubstituted dibenzofuran groups, and substituted or unsubstituted dibenzothiophene groups.

[Chem. 3]

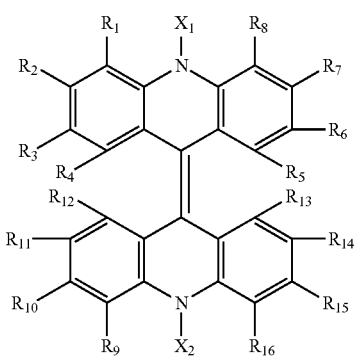

(3)

In formula (3), $X_1$ and $X_2$ each represent an aryl group. The aryl group may have a halogen atom or an alkyl group. $R_1$ to $R_{16}$ each represent a hydrogen atom or a substituent selected from the group consisting of halogen atoms, alkyl groups, and aryl groups.

[Chem. 4]

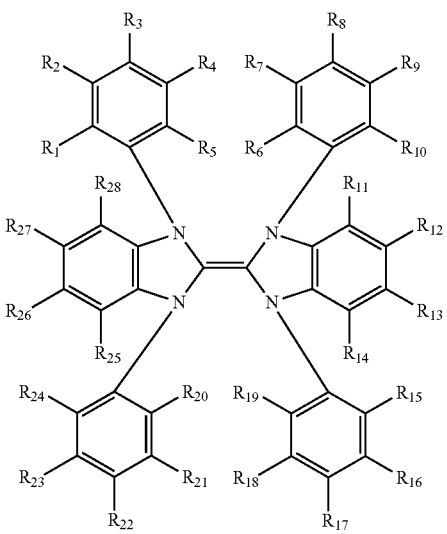

(4)

In formula (4), $R_1$ to $R_{28}$ each represent a hydrogen atom or a substituent selected from the group consisting of halogen atoms, alkyl groups having a carbon number in the range of 1 to 8, and substituted or unsubstituted aryl groups.

[Chem. 5]

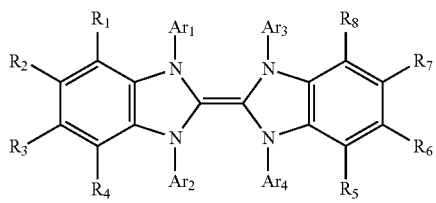

(5)

In formula (5), $Ar_1$ to $Ar_4$ each represent a substituted or unsubstituted condensed ring.

$R_1$ to $R_8$ each represent a hydrogen atom or a substituent selected from the group consisting of halogen atoms, alkyl groups having a carbon number in the range of 1 to 8, and substituted or unsubstituted aryl groups.

[Chem. 6]

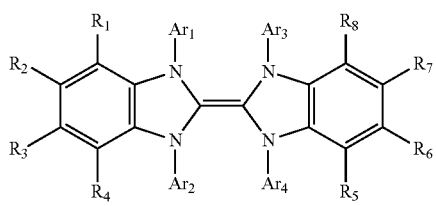

(6)

In general formula (6), $Ar_1$ to $Ar_4$ each represent a substituted or unsubstituted heteromonocyclic group.

$R_1$ to $R_8$ each represent a hydrogen atom or a substituent selected from the group consisting of halogen atoms, alkyl groups having a carbon number in the range of 1 to 8, and substituted or unsubstituted aryl groups.

The halogen atoms in general formulas (1) to (6) include fluorine, chlorine, bromine, and iodine. Fluorine is advantageous.

Advantageously, the alkyl groups in the above general formulas have a carbon number in the range of 1 to 8. Examples of the alkyl groups having a carbon number in the range of 1 to 8 include methyl, ethyl, n-propyl, isopropyl, n-butyl, isobutyl, sec-butyl, tert-butyl, n-pentyl, n-hexyl, and n-octyl.

Examples of the aryl groups include phenyl, naphthyl, phenanthrenyl, chrysenyl, pyrenyl, fluorenyl, and fluoranthenyl. Phenyl is particularly advantageous.

Examples of the condensed rings include naphthyl, indenyl, phenanthrenyl, anthracenyl, pyrenyl, fluorenyl, quinolinyl, isoquinolinyl, azaphenanthrenyl, phenanthronyl, benzothienyl, dibenzothienyl, benzofuranyl, and dibenzofuranyl.

Among these condensed rings, naphthyl, indenyl, phenanthrenyl, anthracenyl, pyrenyl, and fluorenyl are hydrocarbons consisting entirely of hydrogen and carbon.

On the other hand, quinolinyl, isoquinolinyl, azaphenanthrenyl, phenanthronyl, benzothienyl, dibenzothienyl, benzofuranyl, and dibenzofuranyl are condensed rings each containing a heteroatom. Advantageously, the condensed rings each consist entirely of hydrogen and carbon.

Each heteromonocyclic group may be a 6-membered aromatic ring including carbon and nitrogen atoms or a 5-membered ring including a carbon atom and any of nitrogen, sulfur, and oxygen atoms. More specifically, examples of the heteromonocyclic groups include pyridyl, pyrazyl, pyrimidyl, pyrididazoyl, triazyl, pyrrole, furanyl, thienyl, imidazole, pyrazole, oxazole, thiazole, imidazoline, and thiazine.

If the above-described groups of general formulas (1) to (6) have a substituent, the substituent is selected from the group consisting of halogen atoms, alkyl groups, and aryl groups. In this instance, the halogen atom is desirably fluorine. The alkyl group desirably has a carbon number in the range of 1 to 8. The aryl group is desirably phenyl, naphthyl, phenanthrenyl, chrysenyl, pyrenyl, fluorenyl, and fluoranthenyl, and more desirably phenyl.

Examples of the organic compound expressed by general formula (1) are shown below.

[Chem. 7]

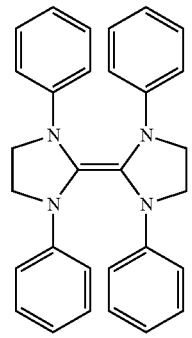

A1

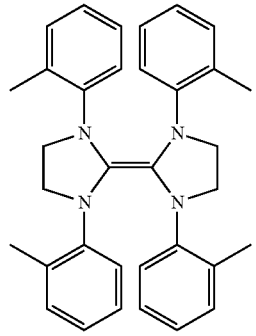

A2

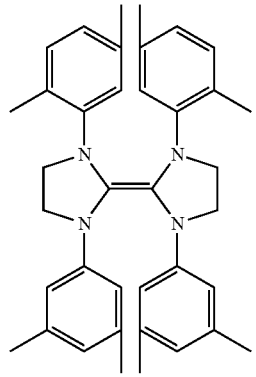

A3

A4
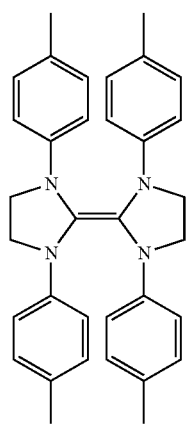
A5
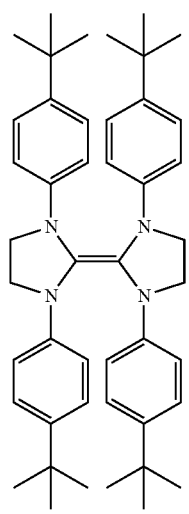
A6
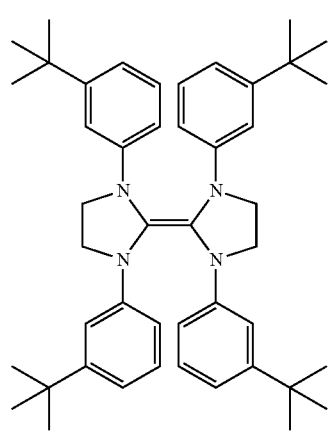
A7
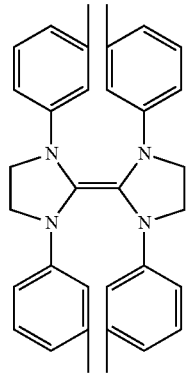
A8
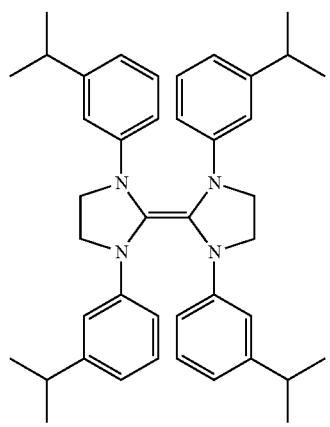
A9
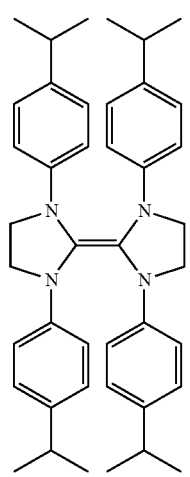
A10
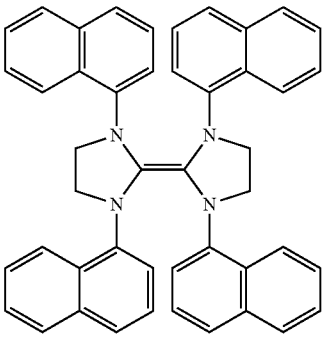

A11
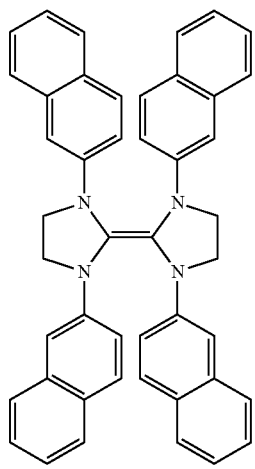
A12
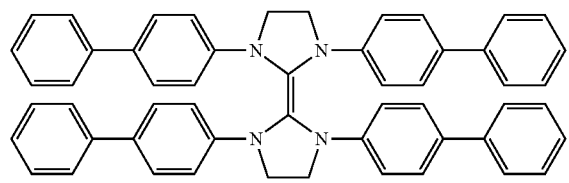
A13
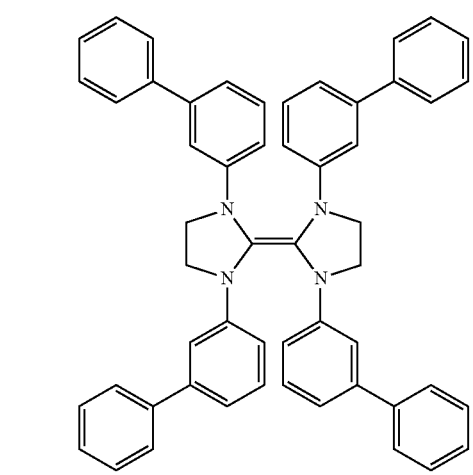
A14
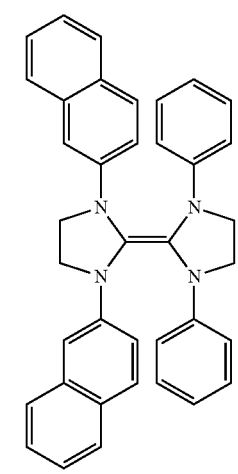
A15
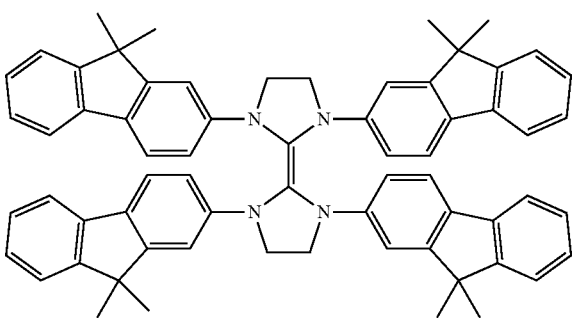
A16
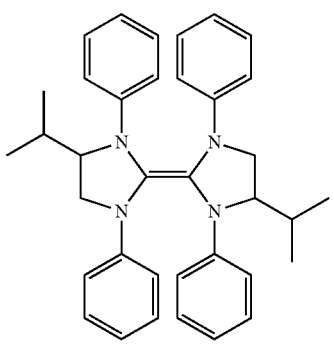
A17
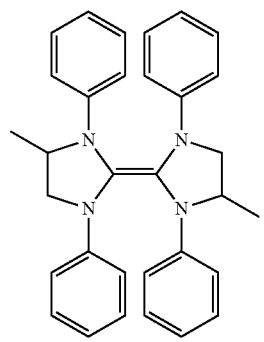
A18
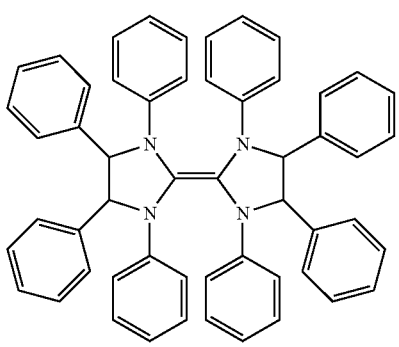

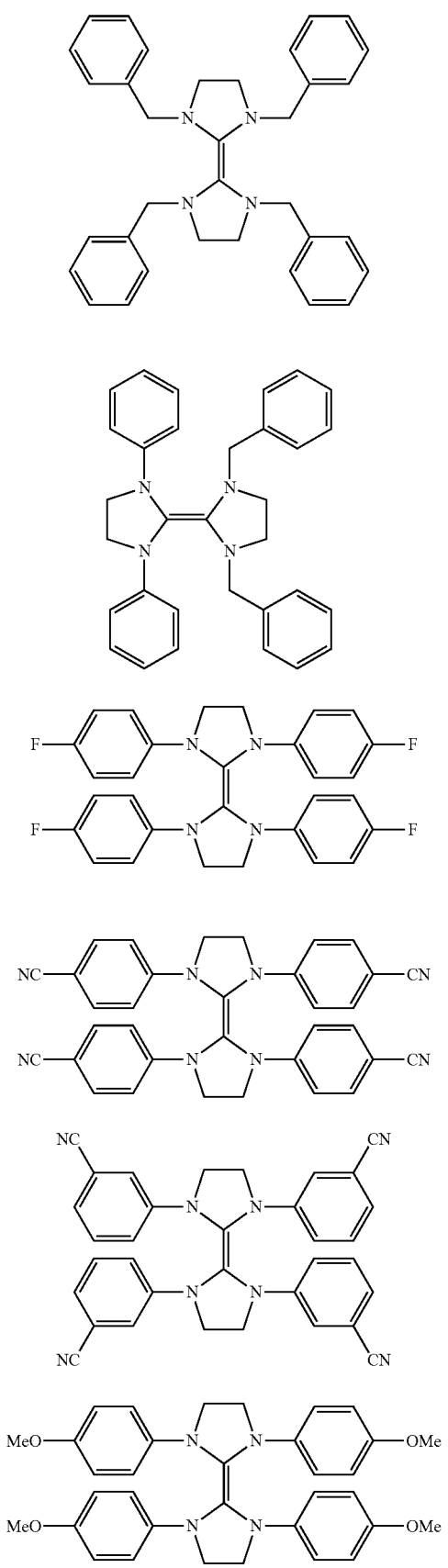
Examples of the organic compound expressed by general formula (2) are shown below.

[Chem. 9]
A1
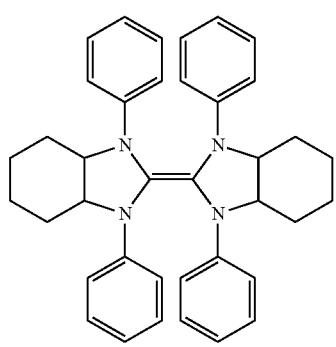
A2
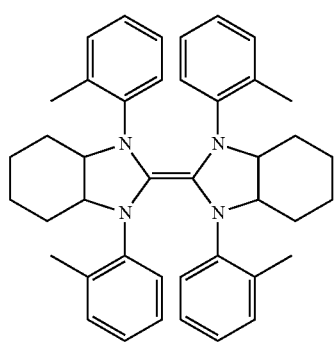
A3
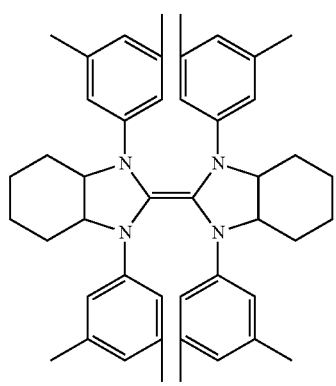
A4
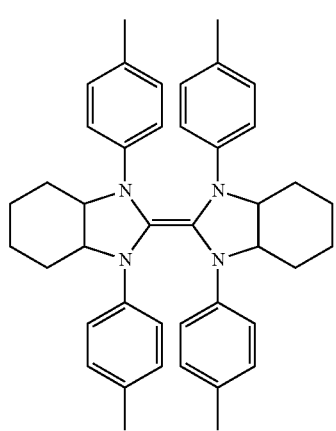
-continued
A5
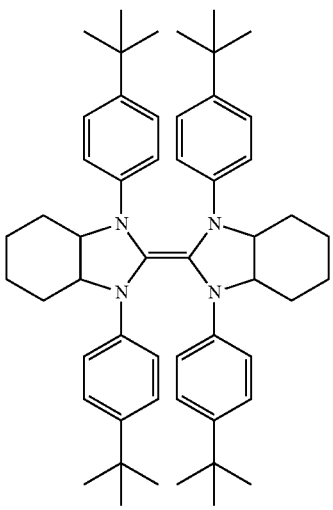
A6
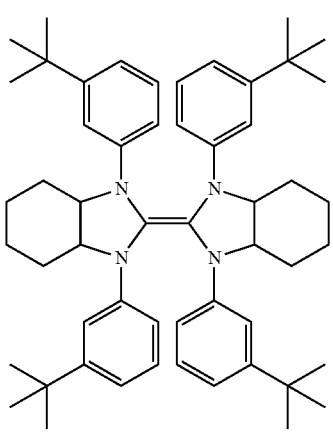
A7
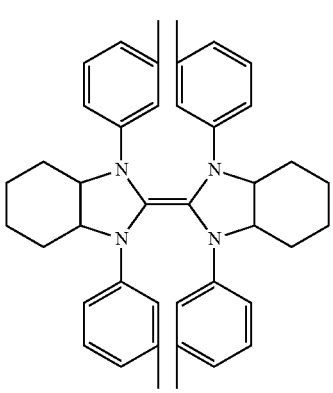
A8
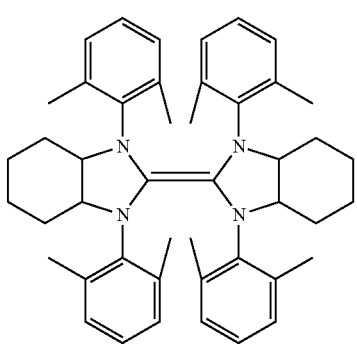

A9
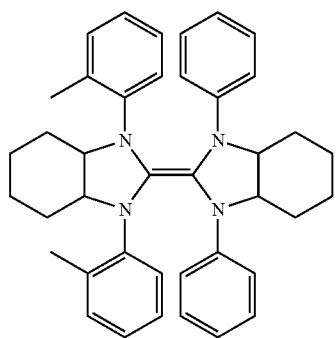
A10
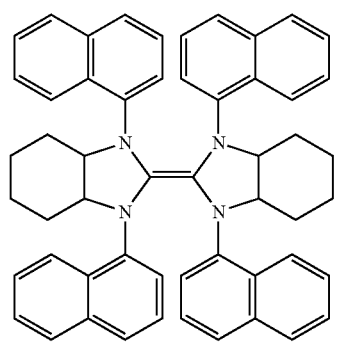
A11
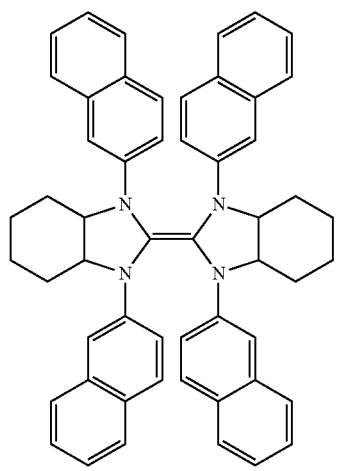
A12
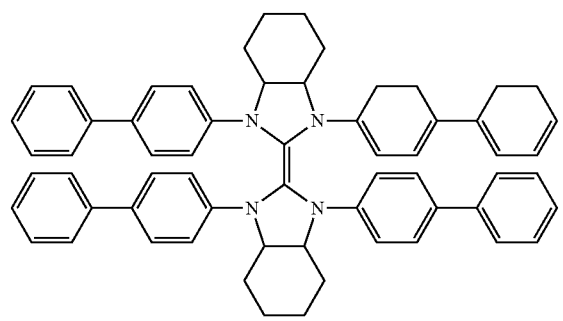
A13
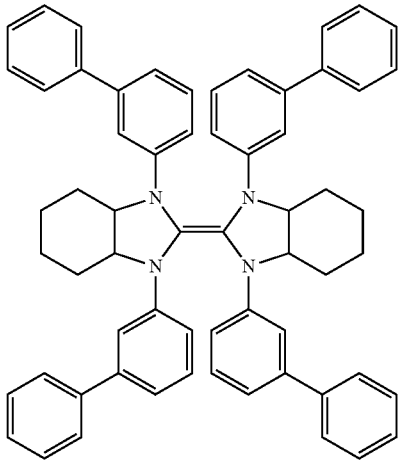
A14
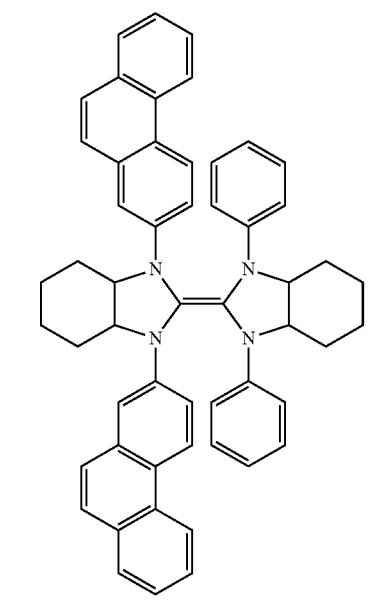
A15
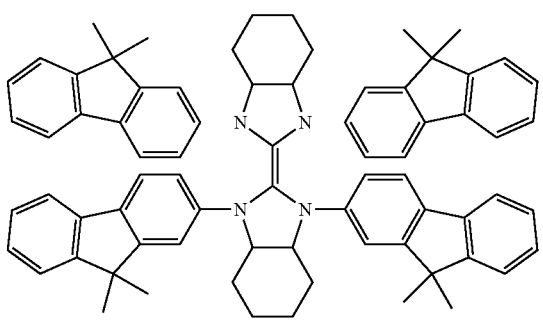

A16
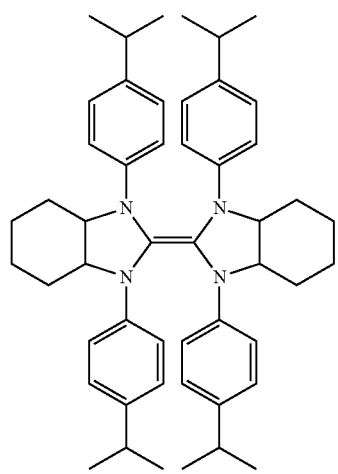
B1
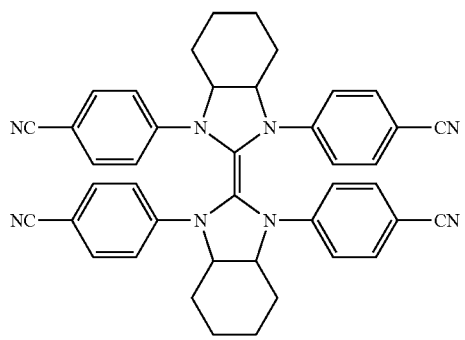
B2
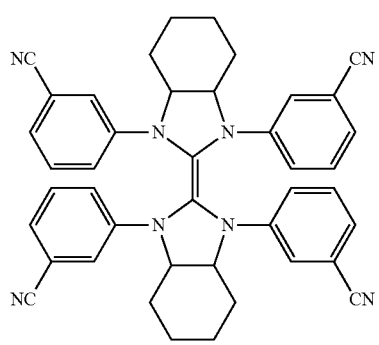
B3
B4
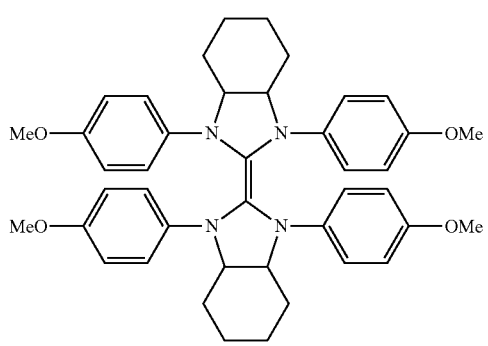
B5
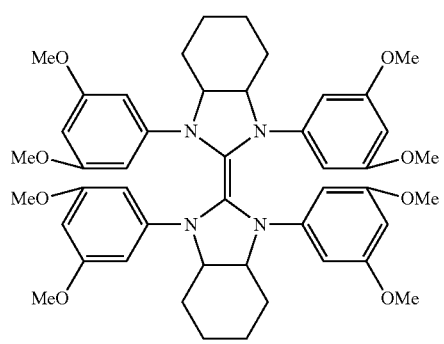
B6
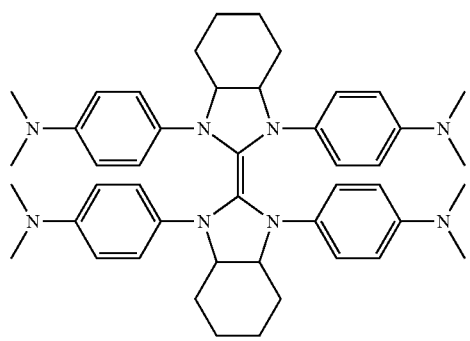
B7
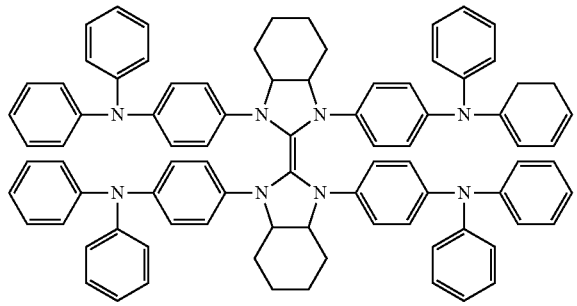

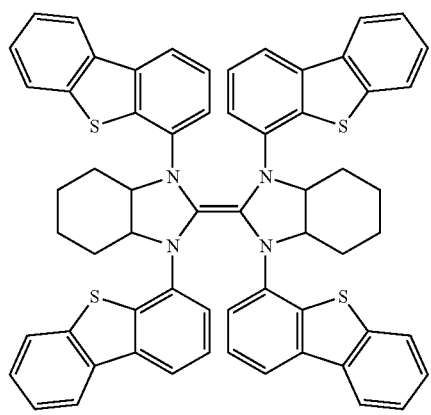
B8
Examples of the organic compound expressed by general formula (3) are shown below.
[Chem. 10]
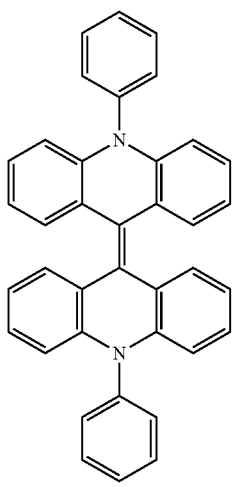
A-1
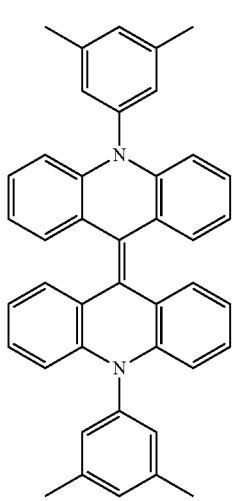
A-2
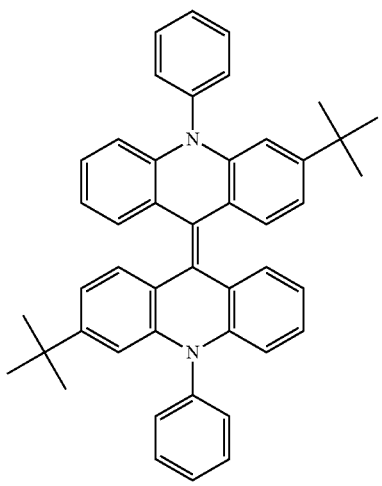
A-3
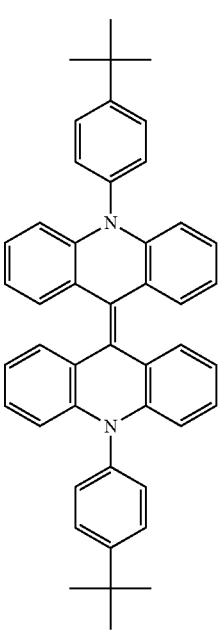
A-4
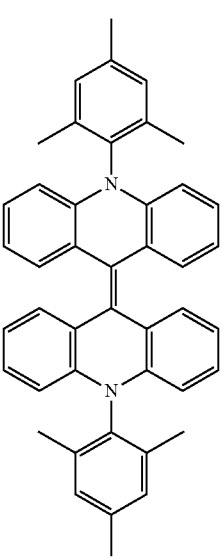
A-5

A-6
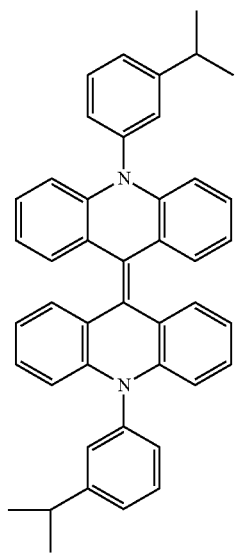
A-7
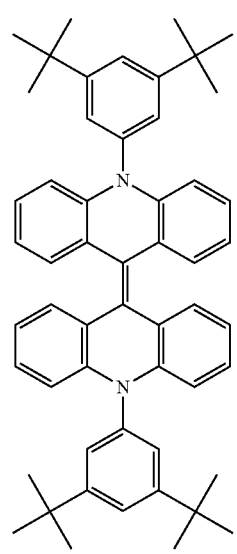
A-8
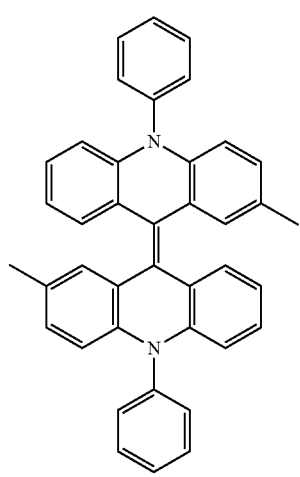
A-9
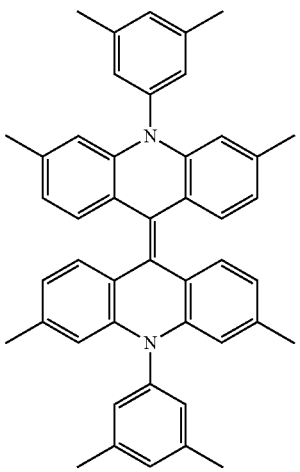
A-10
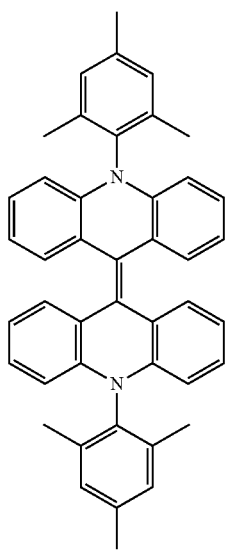
A-11
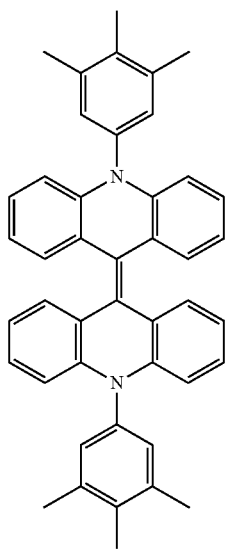

A-12
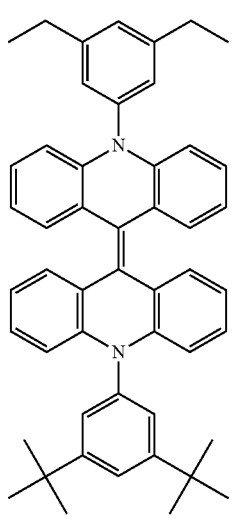
A-13
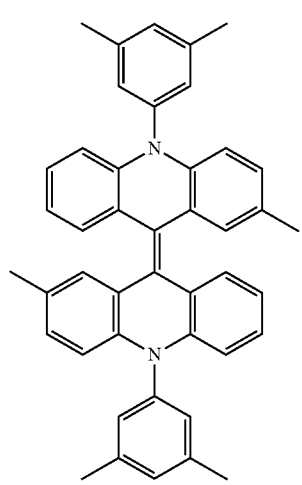
A-14
A-15
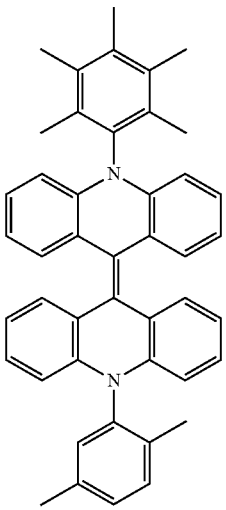
[Chem. 11]
B-1
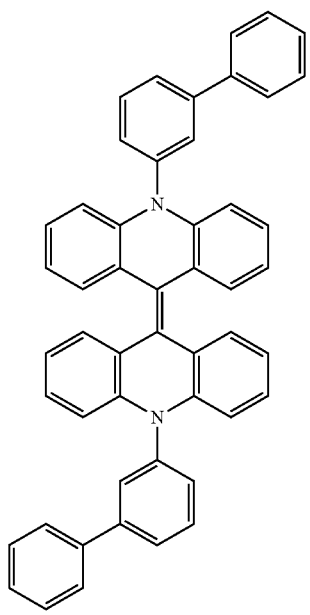

B-2
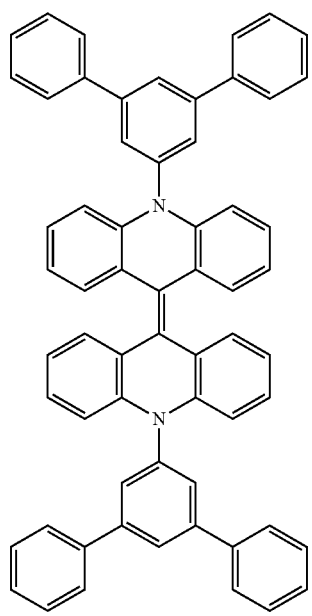
B-4
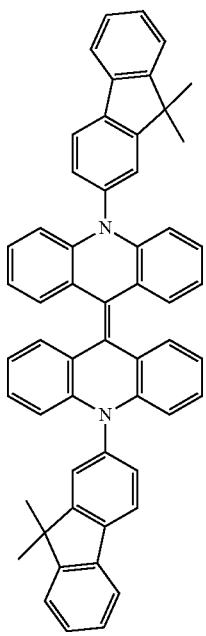
B-3
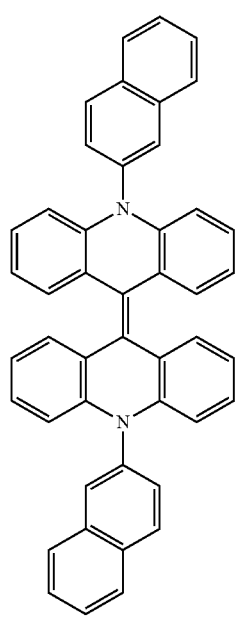
B-5
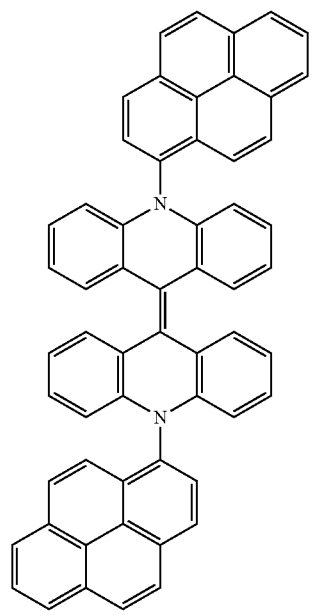

B-6
B-7
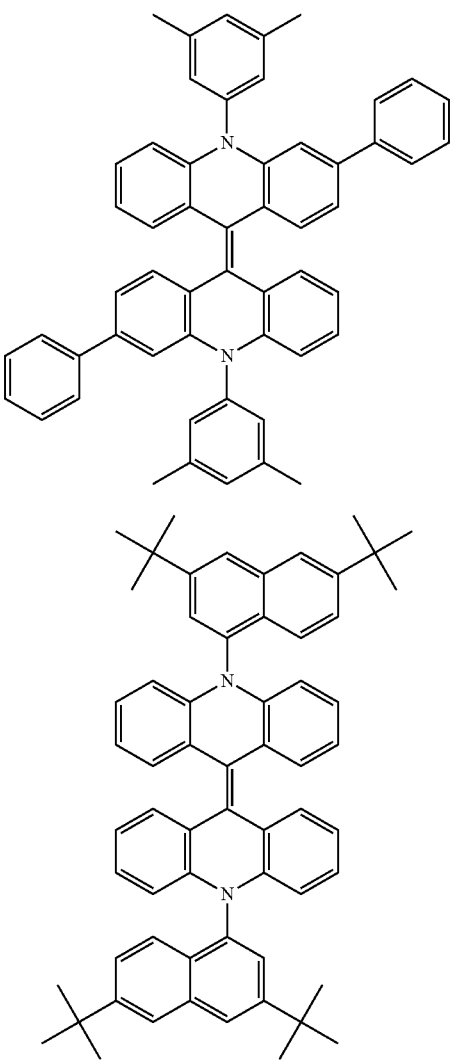
B-8
B-9
[Chem. 12]
C-1

C-2
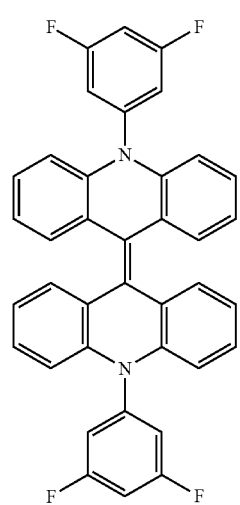
C-3
C-4
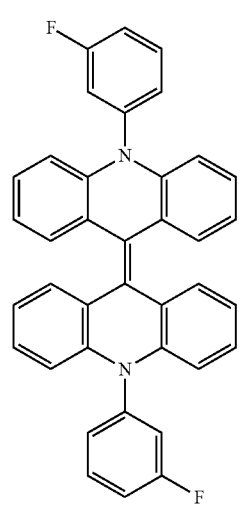
C-5
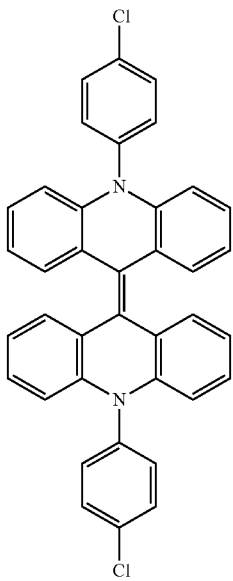
C-6
C-7
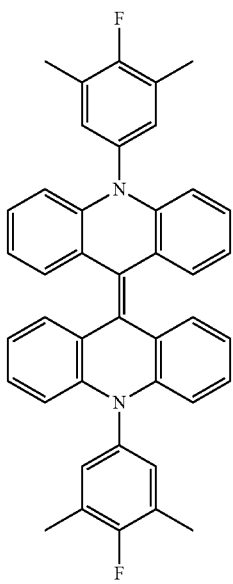

-continued
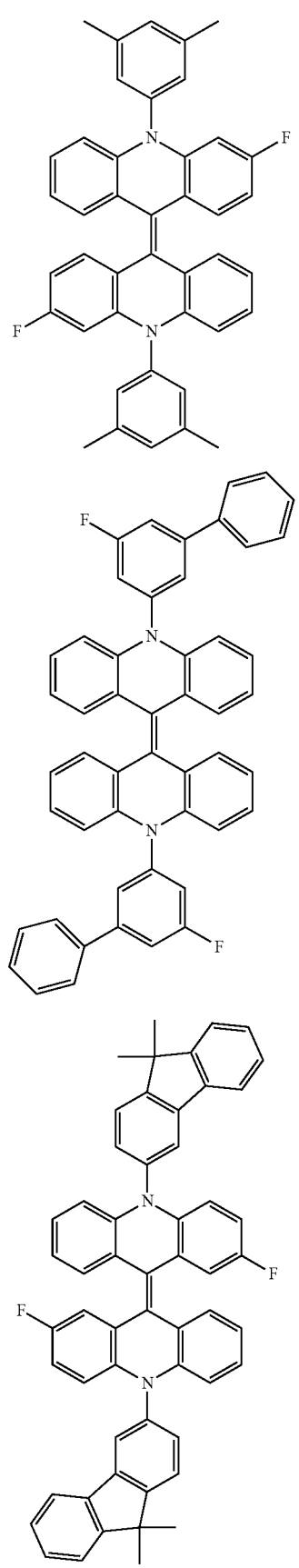
C-8
C-9
C-10
Examples of the organic compound expressed by general formula (4) are shown below.
[Chem. 13]
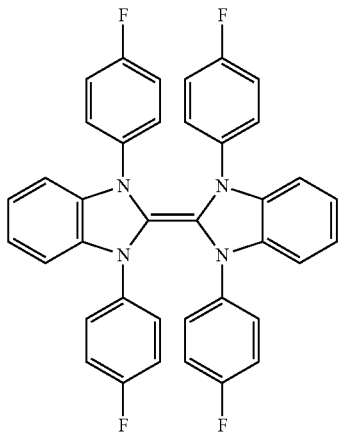
A1
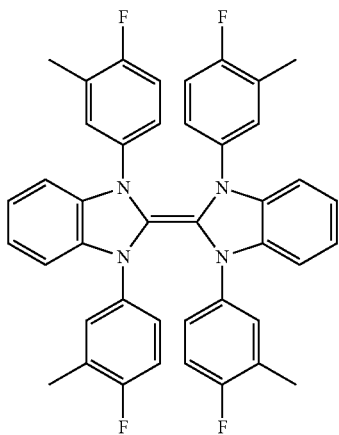
A2
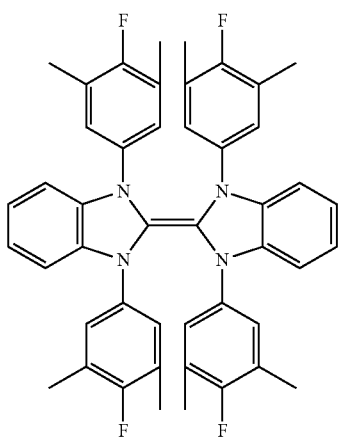
A3

A4
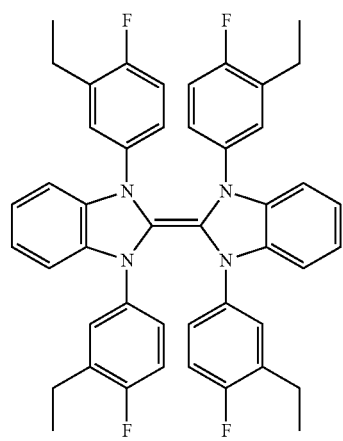
A5
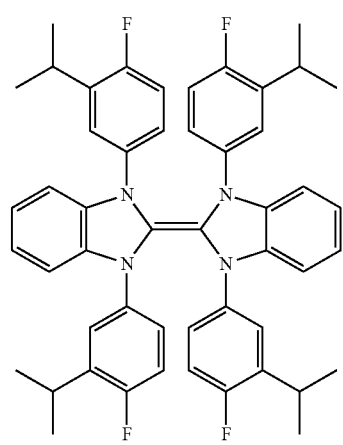
A6
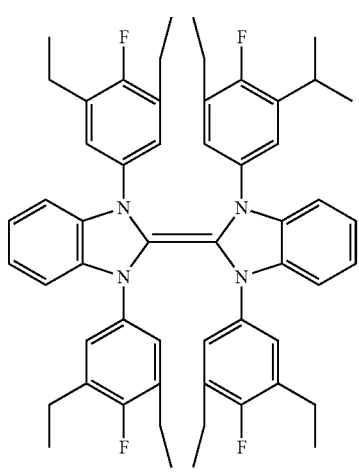
A7
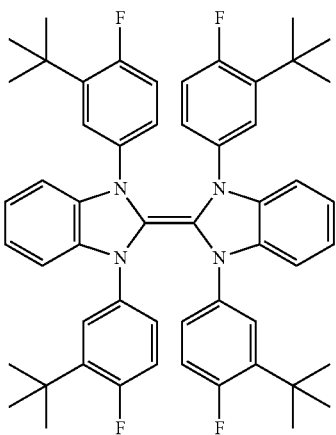
A8
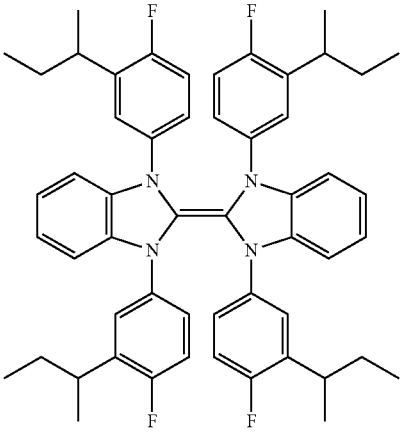
A9
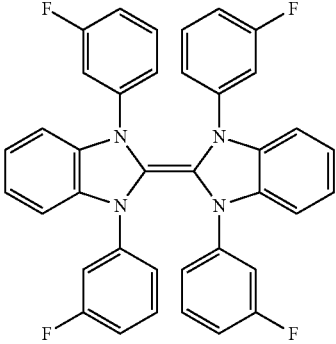
A10
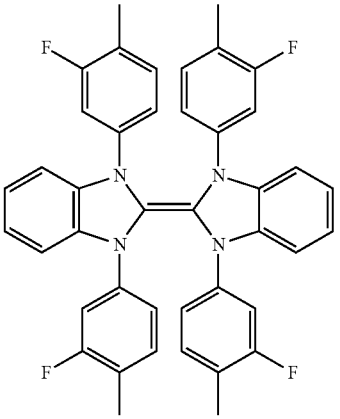

A11 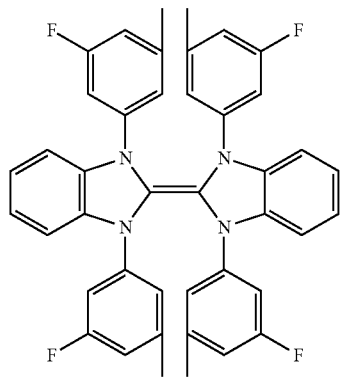
A12 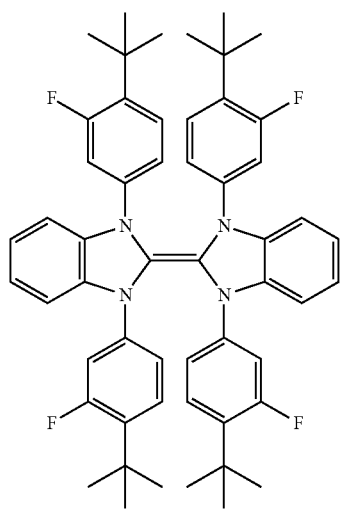
A13 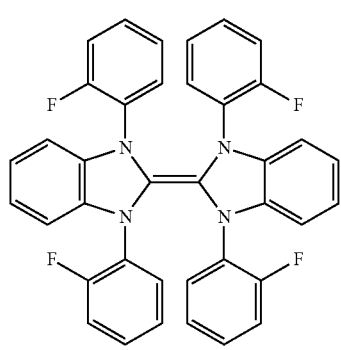
A14 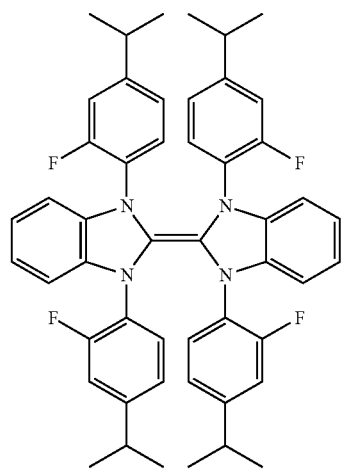
A15 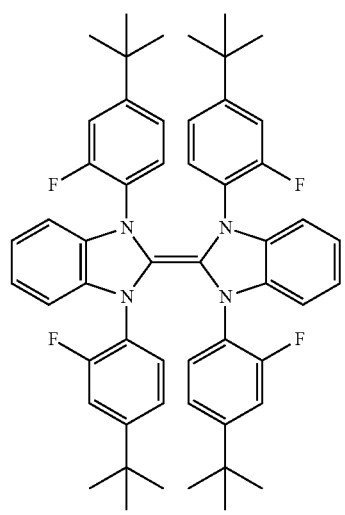
A16 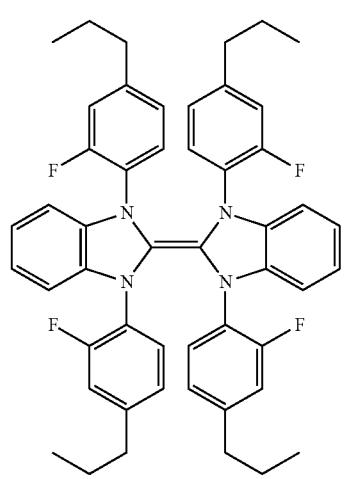

-continued
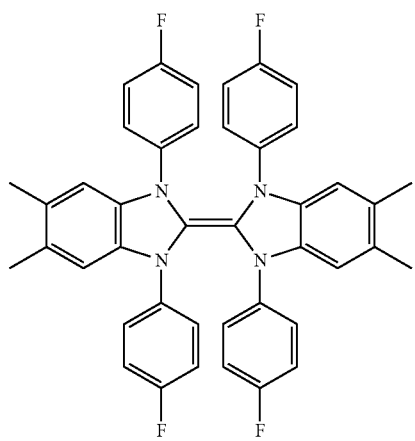
A17
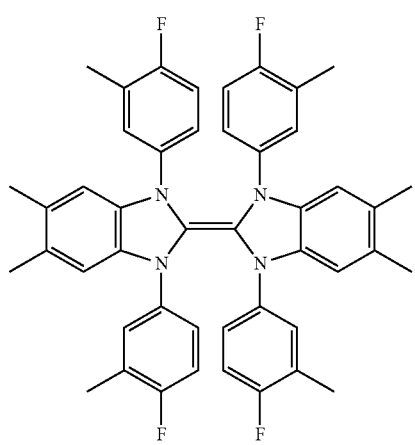
A18
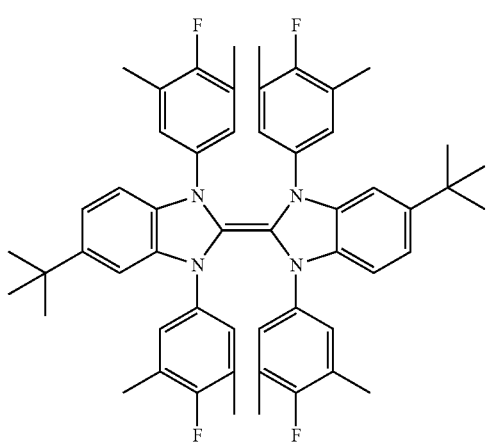
A19
-continued
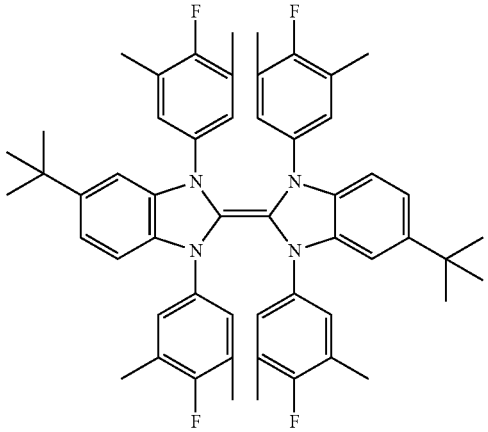
A20
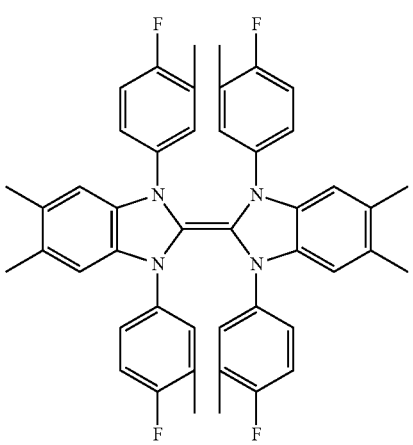
A21
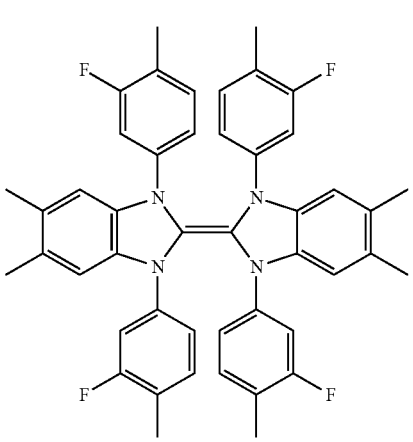
A22

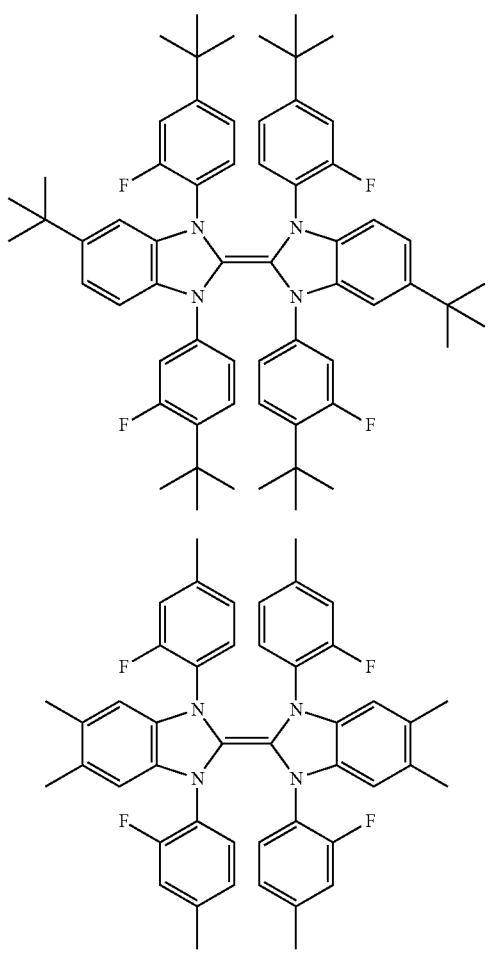
A23
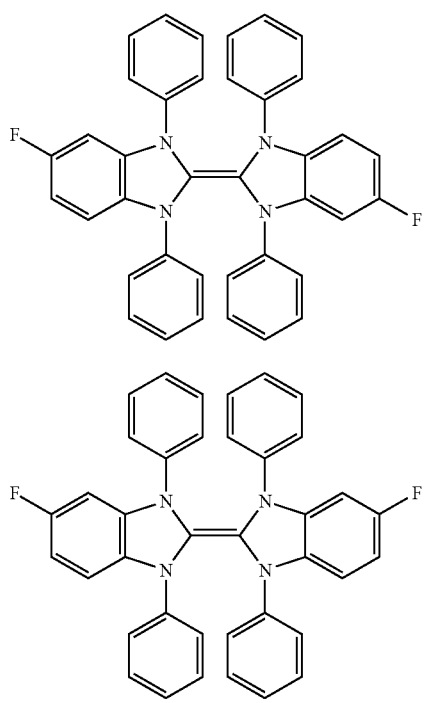
A24
[Chem. 14]
A25
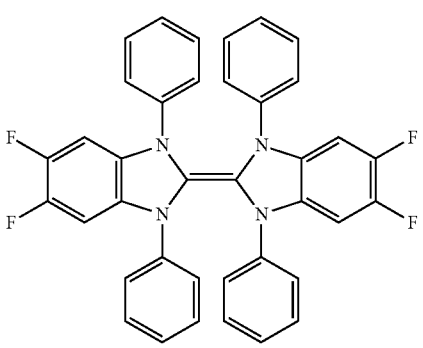
A27
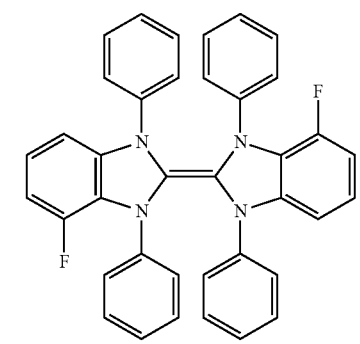
A28
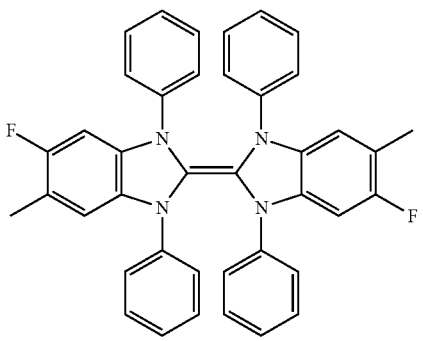
A29
A26
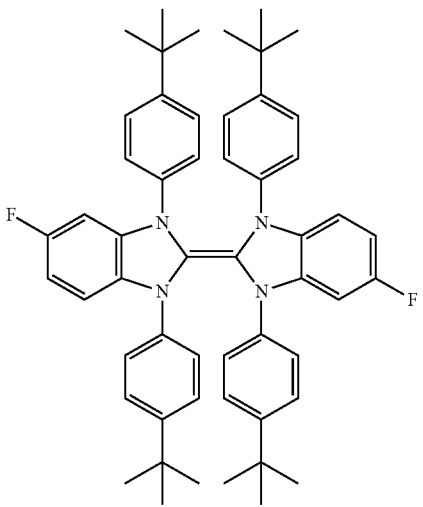
A30

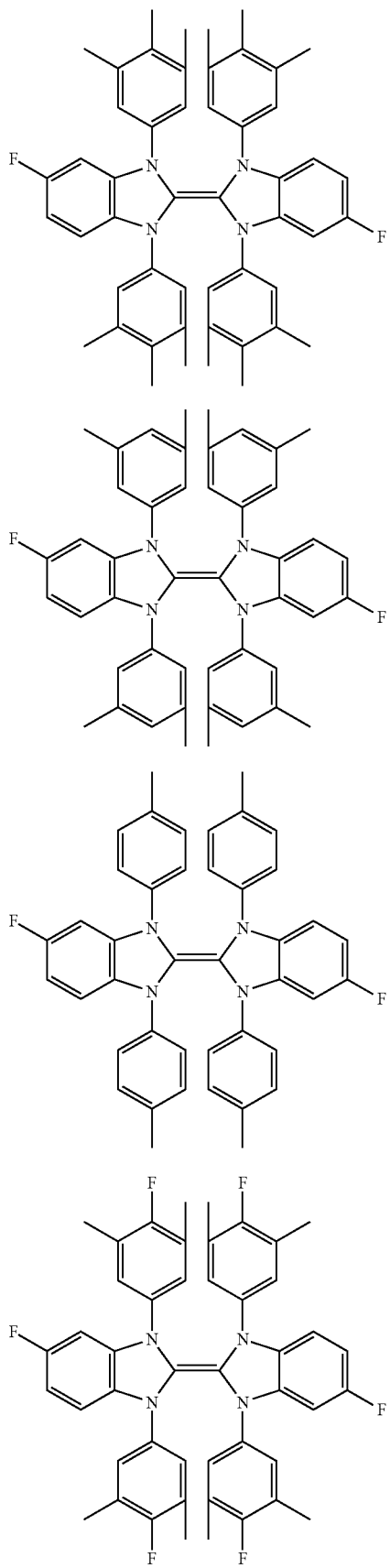
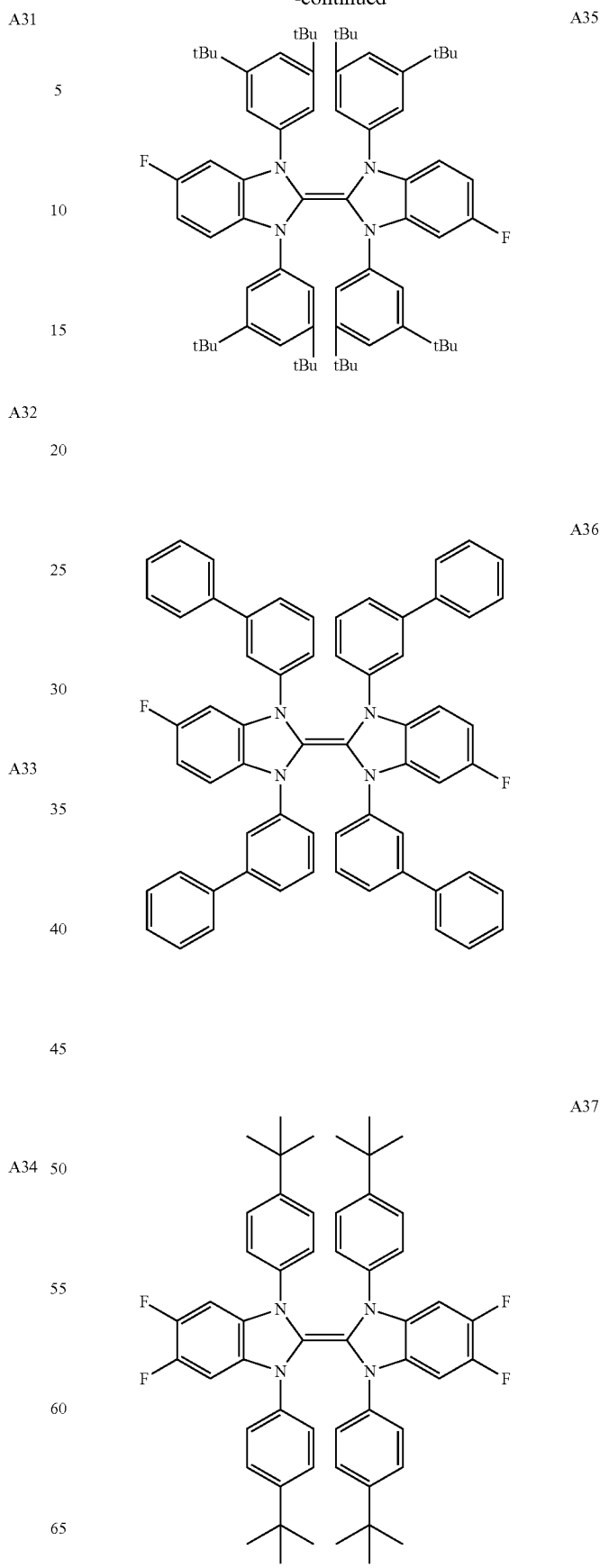

A38
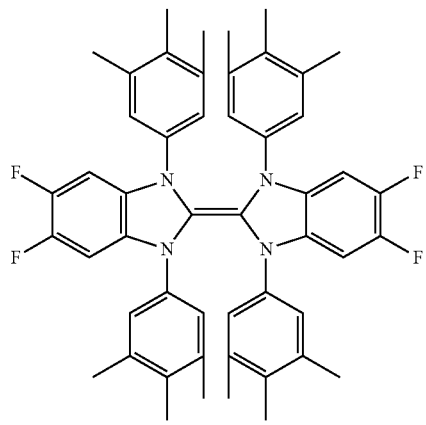
A39
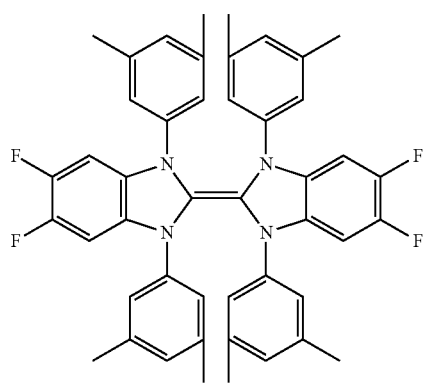
A40
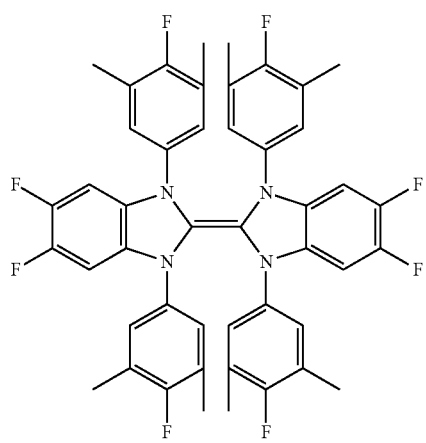
[Chem. 15]
B1
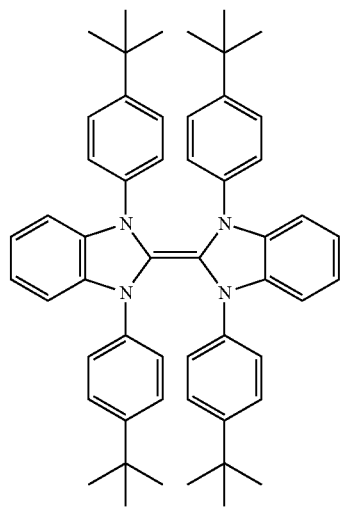
B2
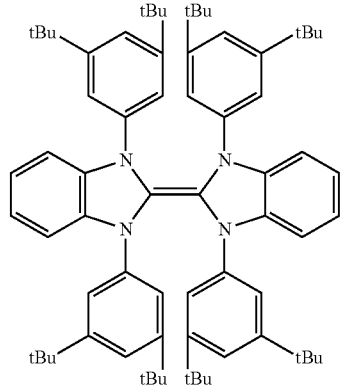
B3
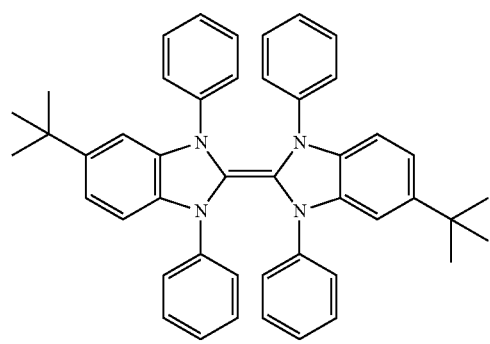
B4
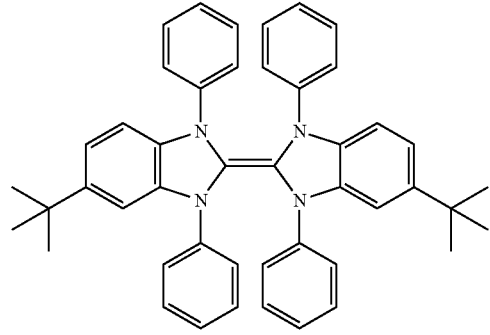

-continued
B5
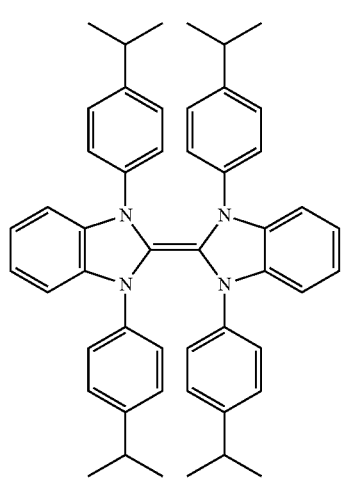
B6
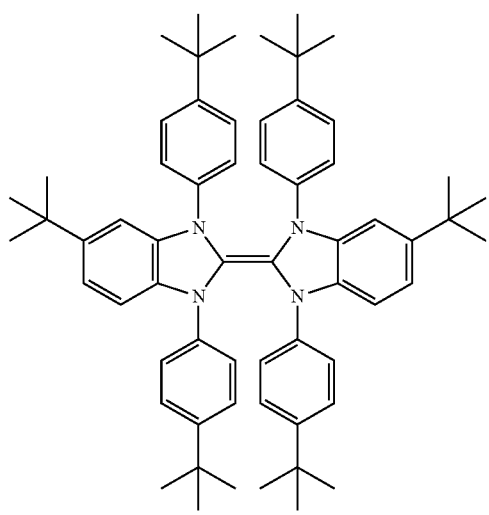
B7
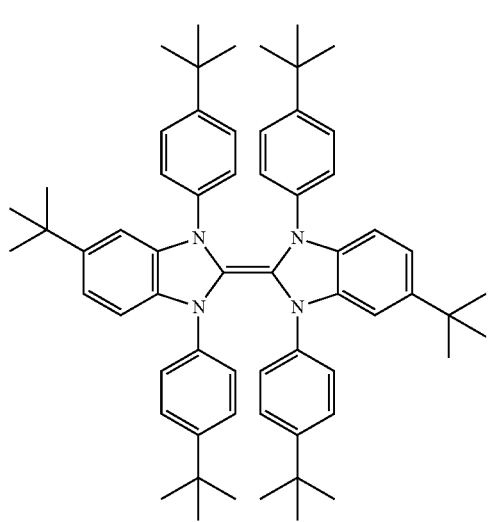
-continued
B8
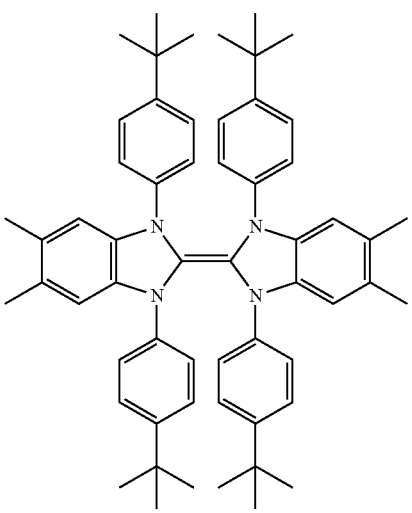
B9
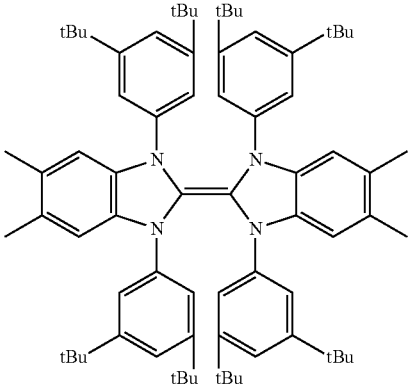
B10
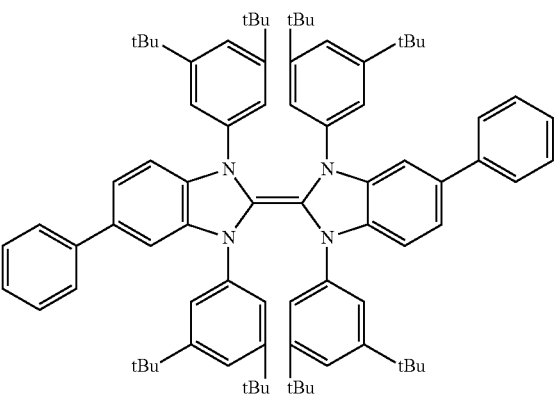

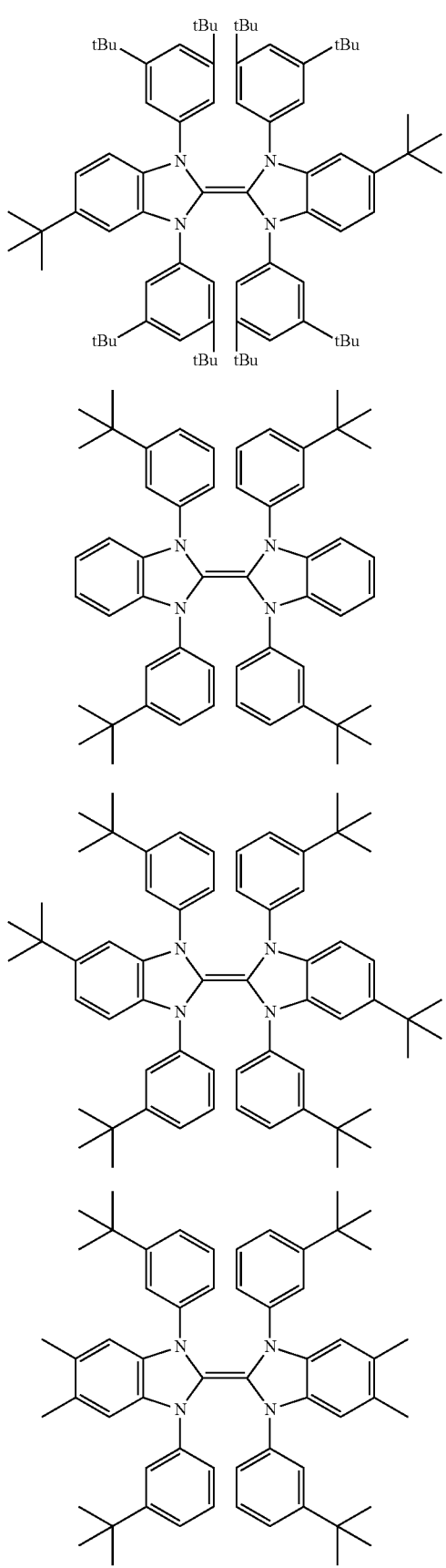
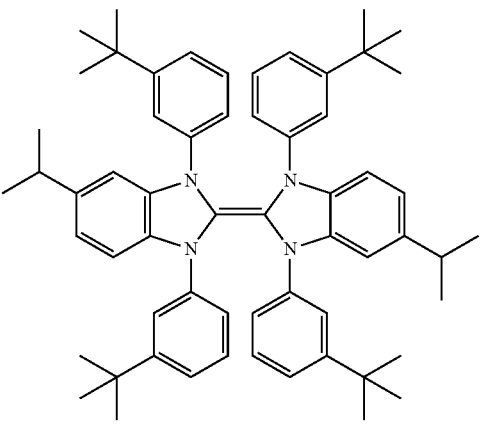

-continued
B18
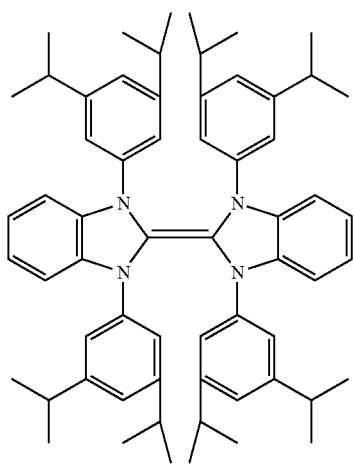
B19
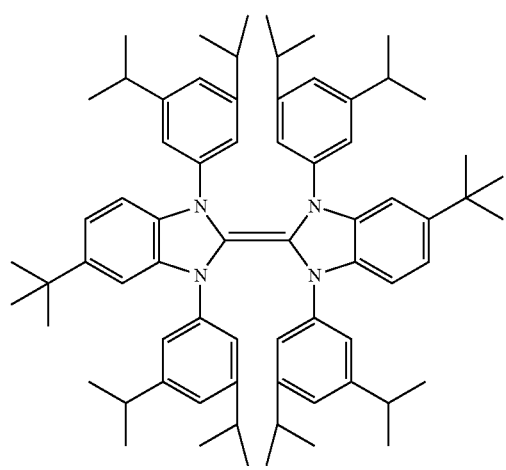
B20
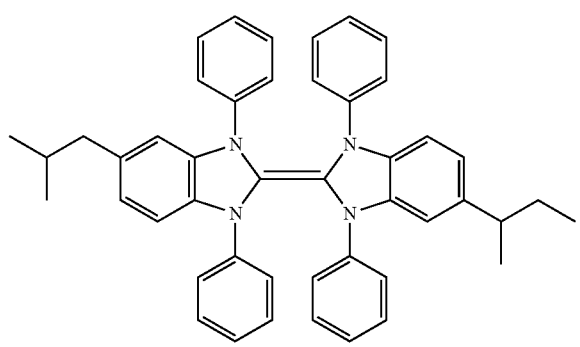
-continued
B21
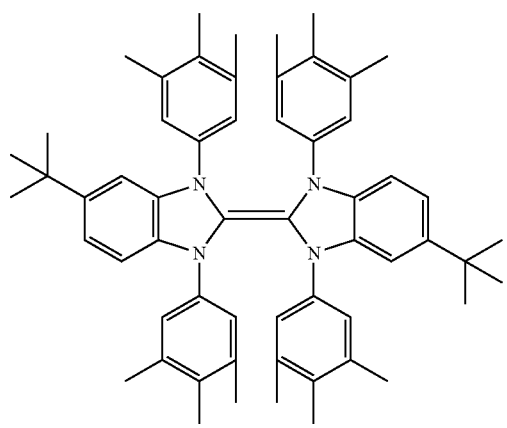
B22
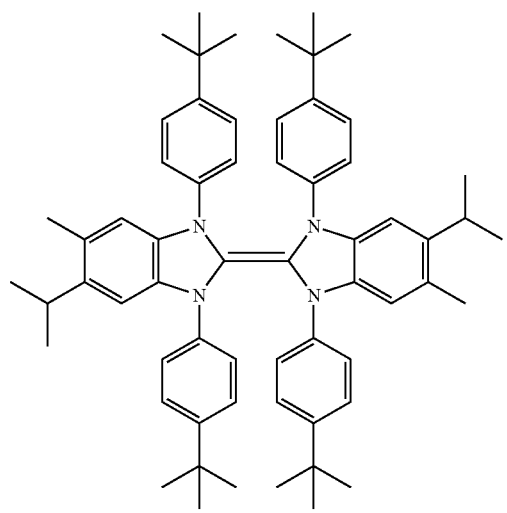
B23
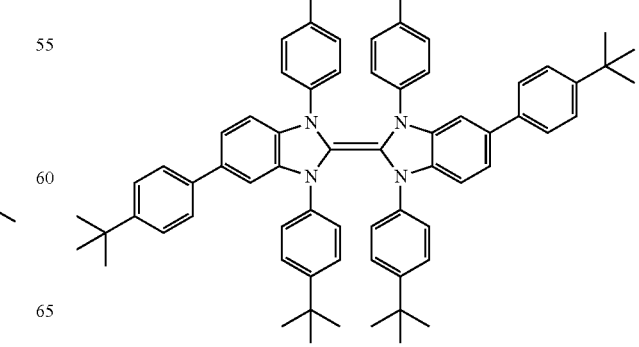

B24
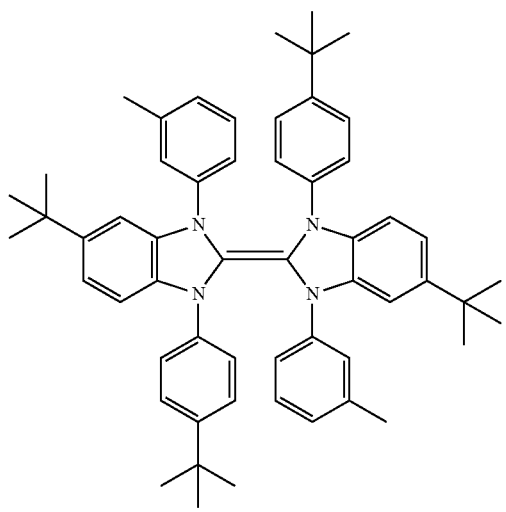
[Chem. 16]
B25
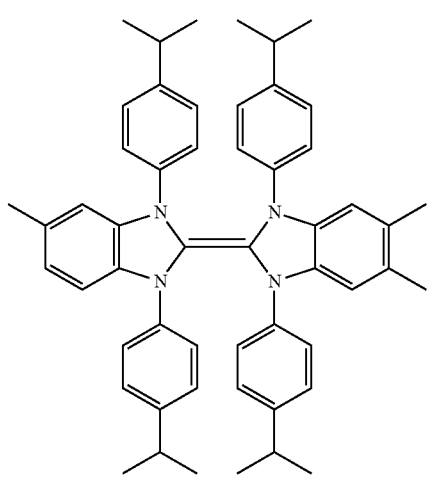
B26
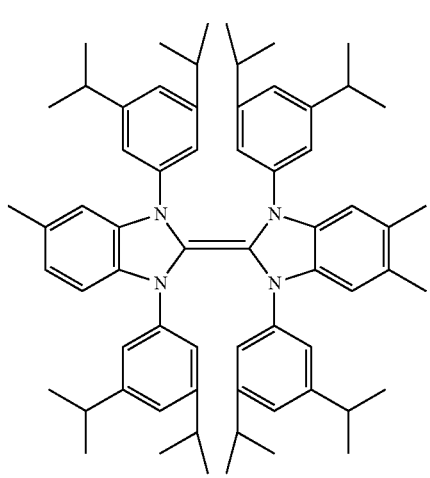
B27
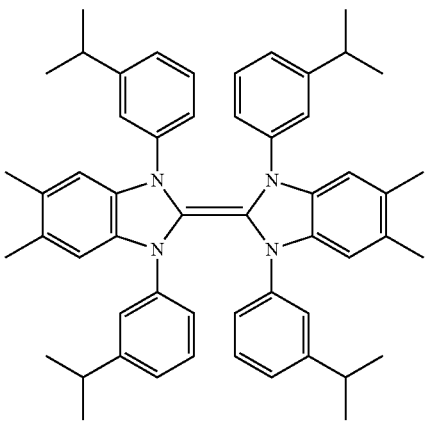
B28
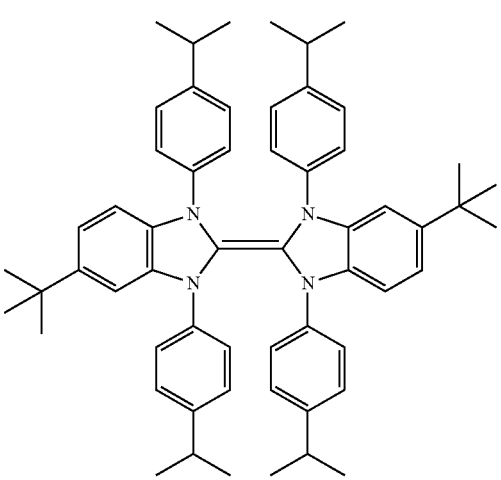
B29

B30 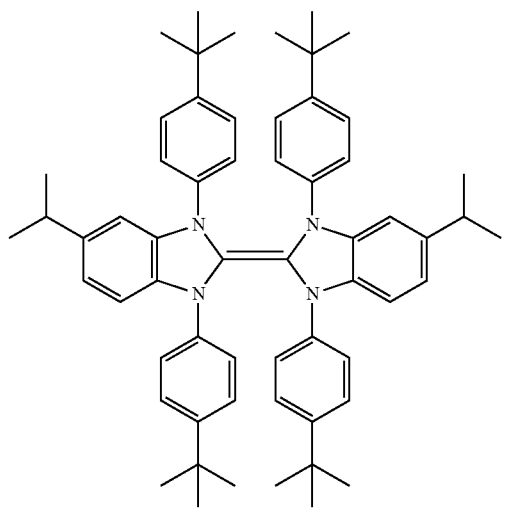
B33 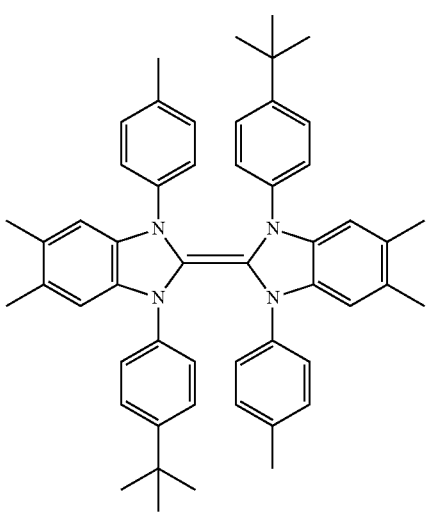
B31 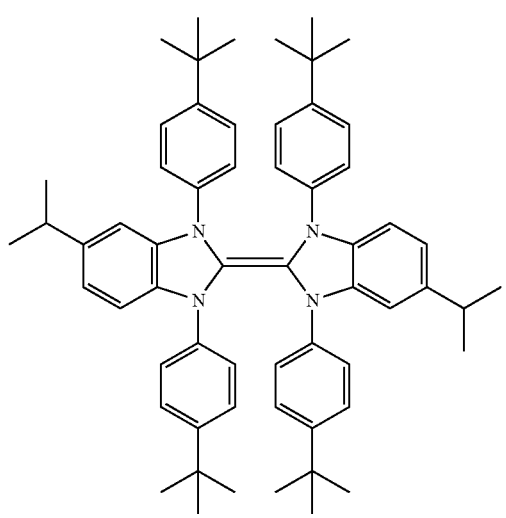
B34 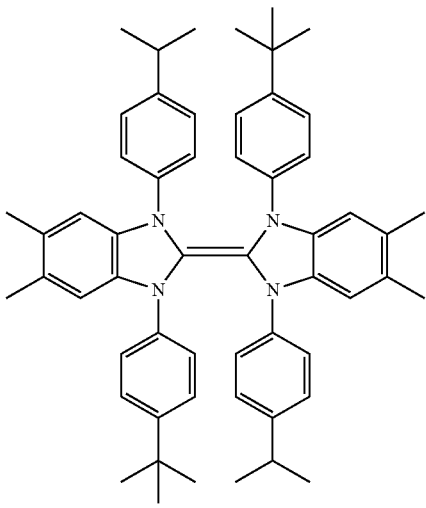
B32 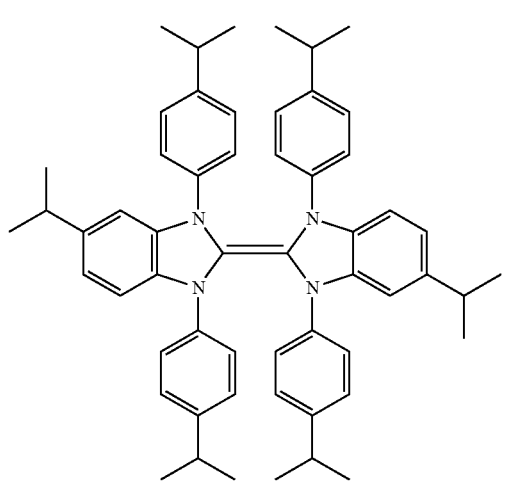
B35 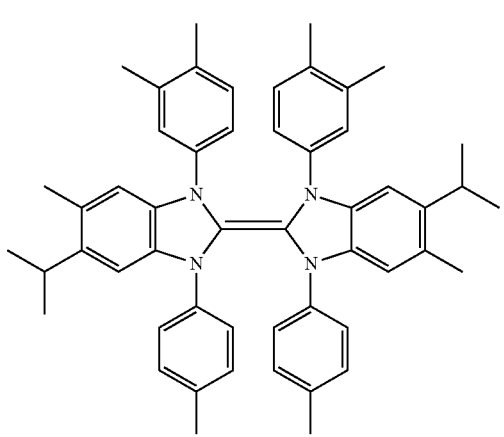

B36
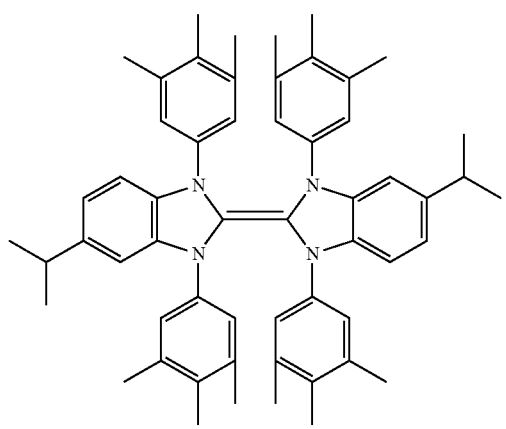
B37
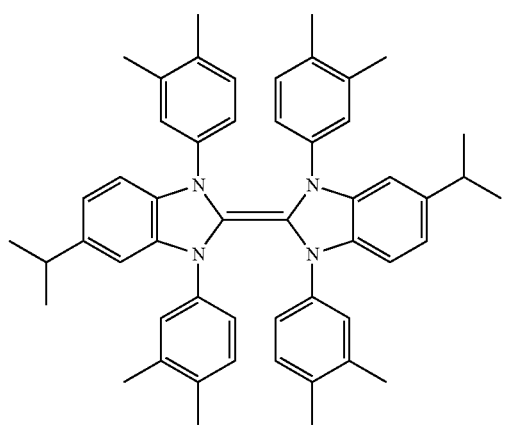
B38
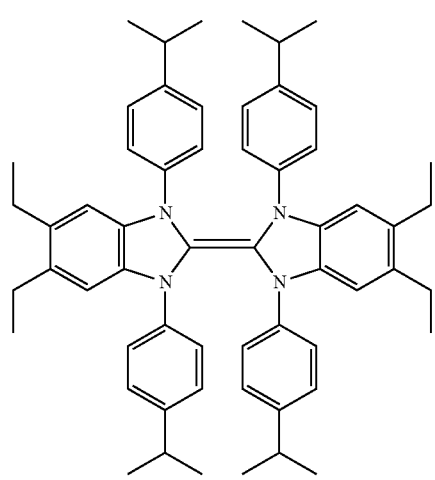
B39
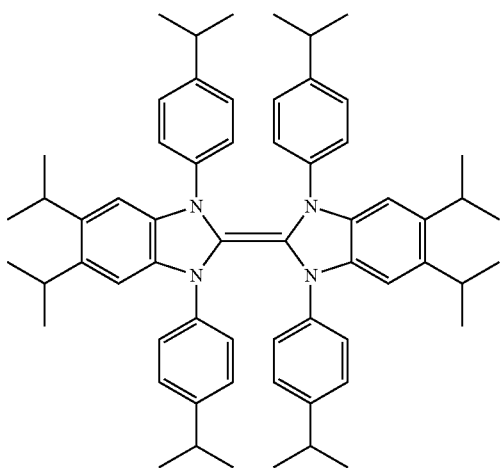
B40
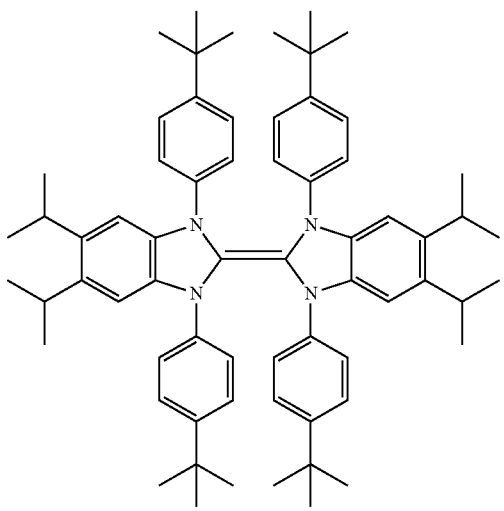
B41
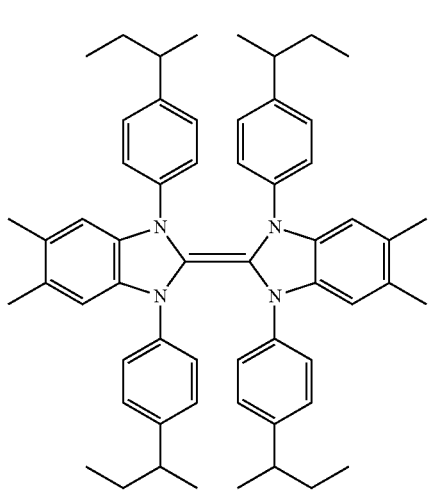

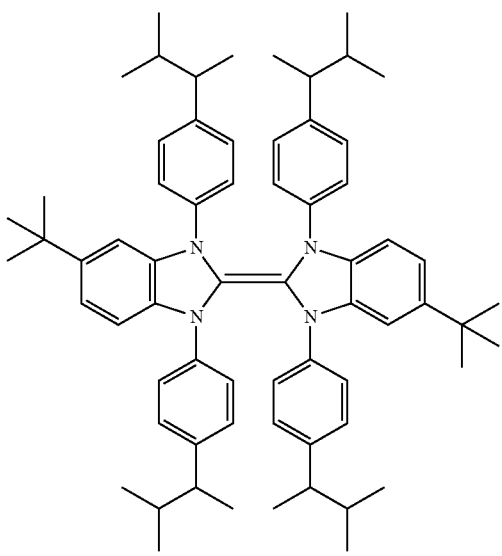
B42
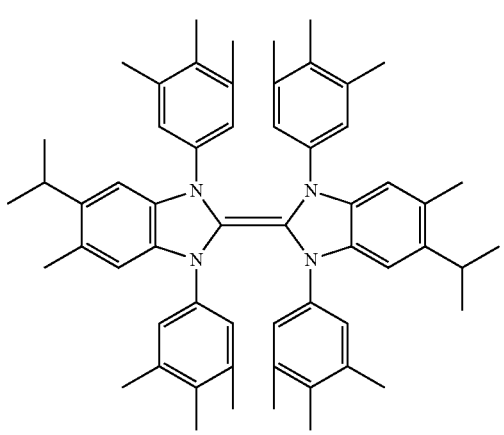
B45
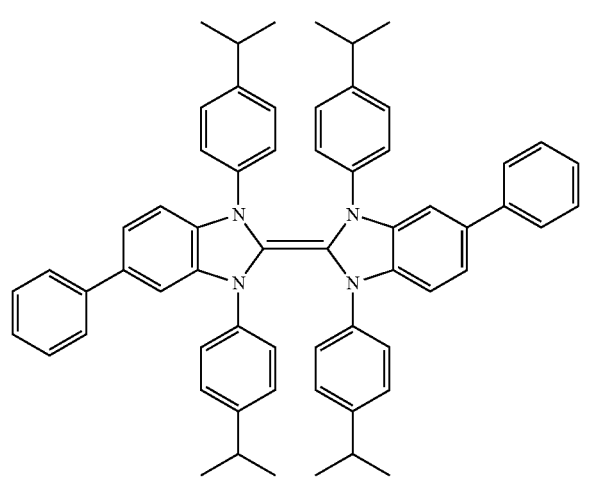
B43
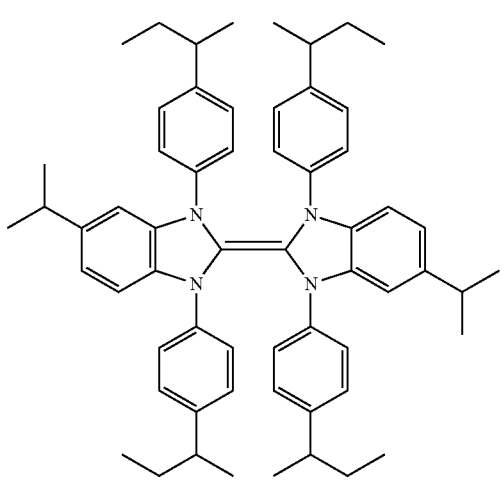
B46
B44
B47

[Chem. 17]
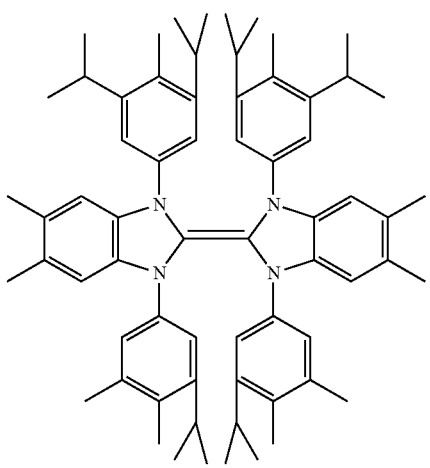
B48
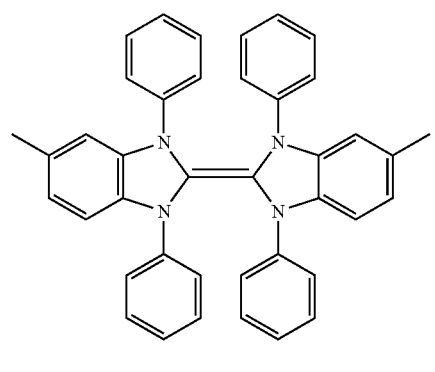
C1
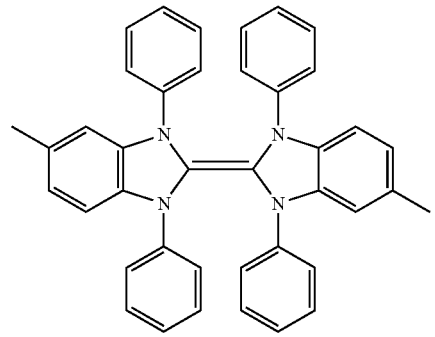
C2
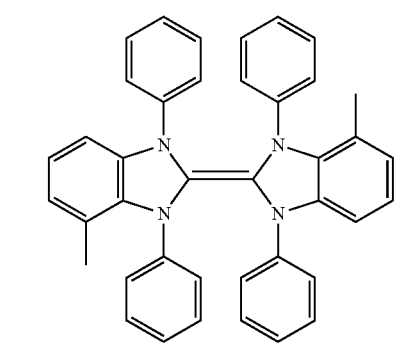
C3
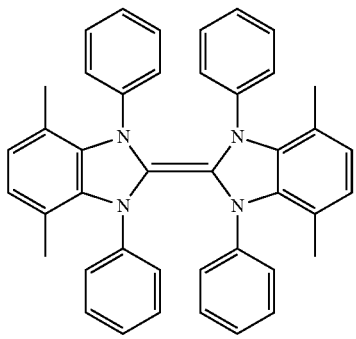
C4
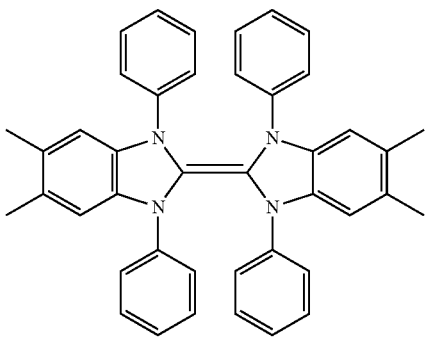
C5
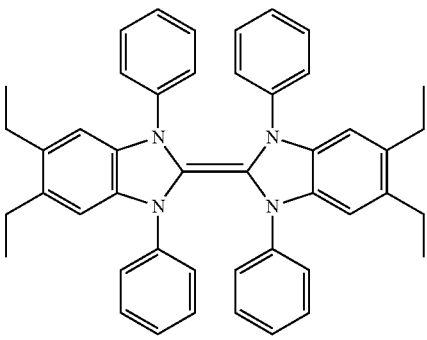
C6
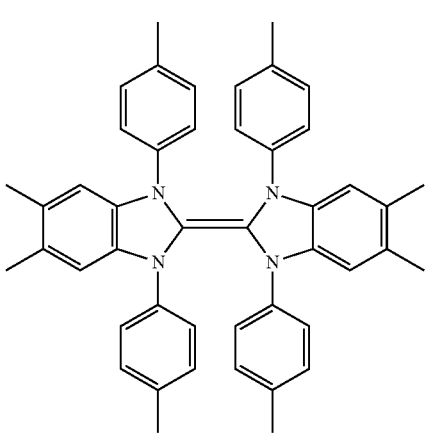
C7

C8
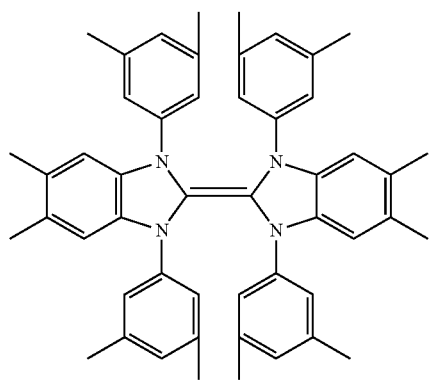
C9
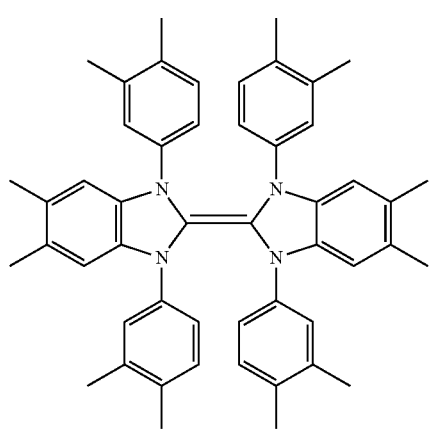
C10
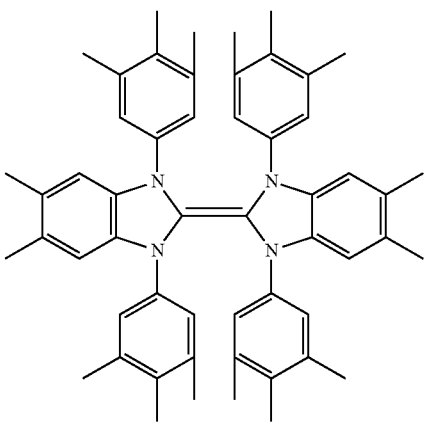
C11
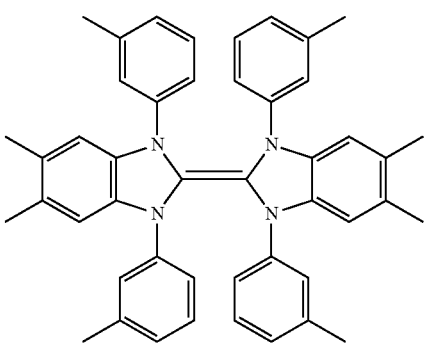
C12
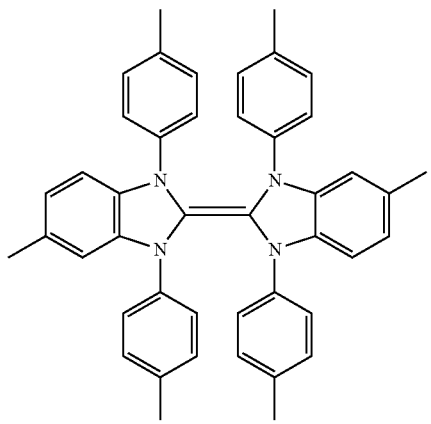
C13
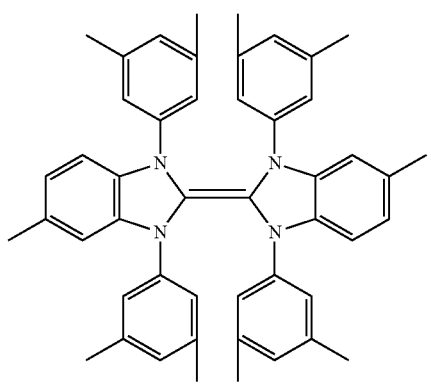
C14
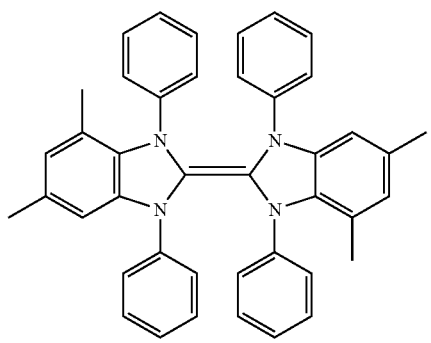
C15
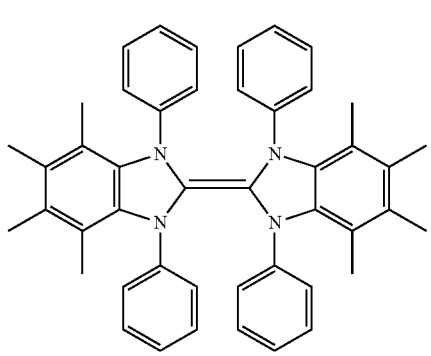

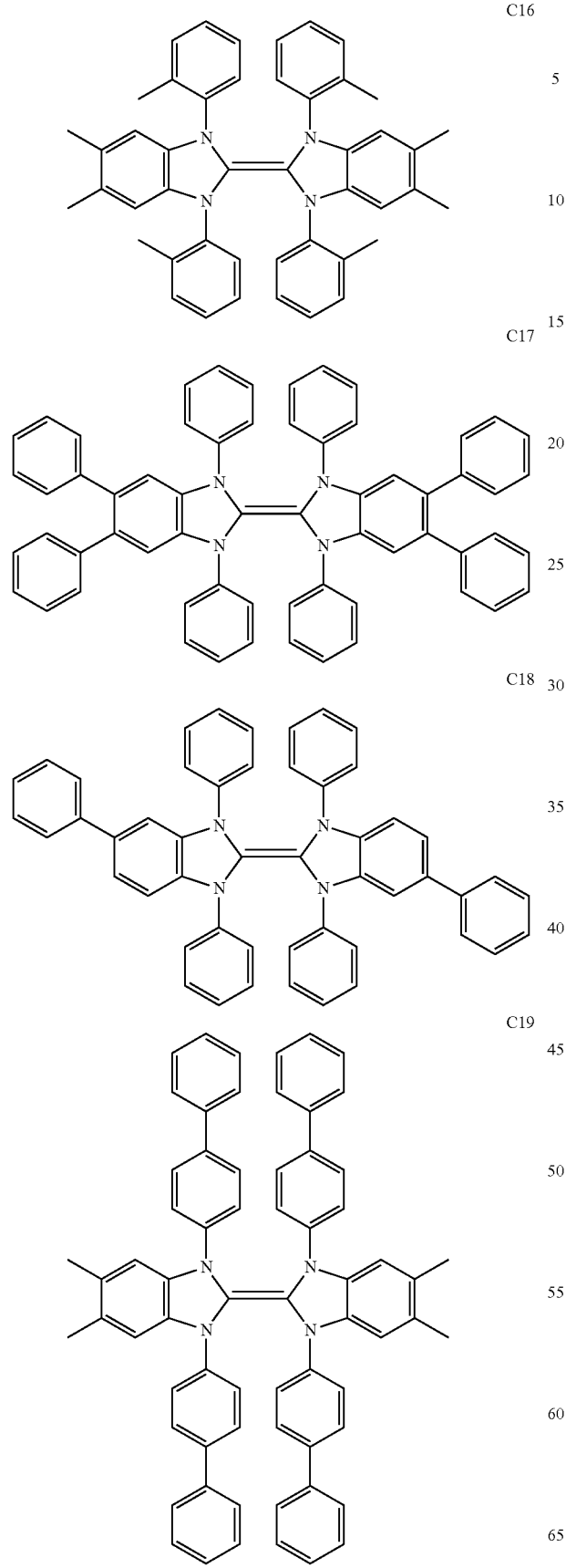
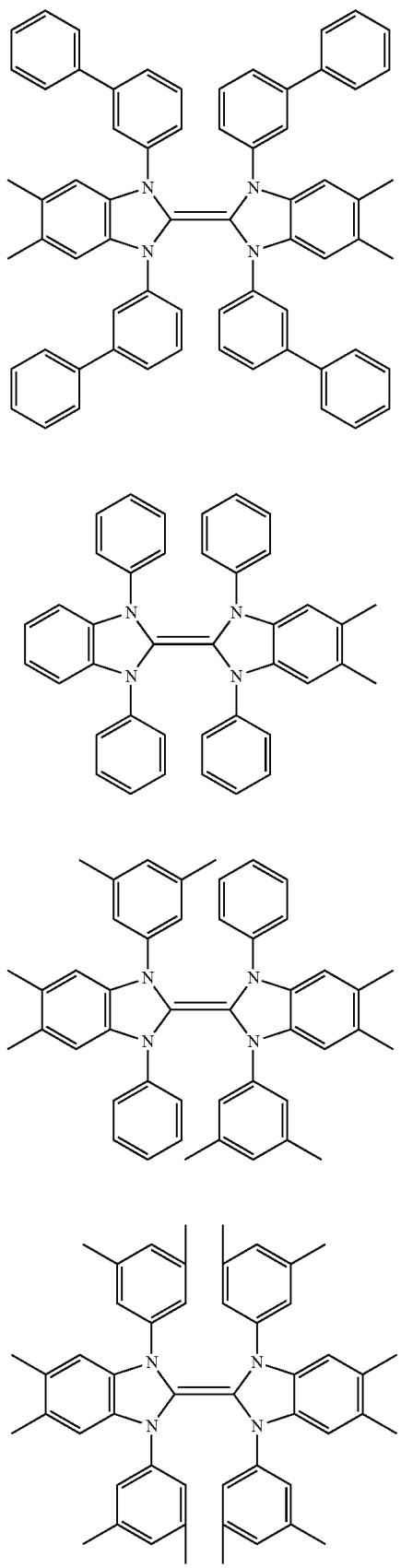

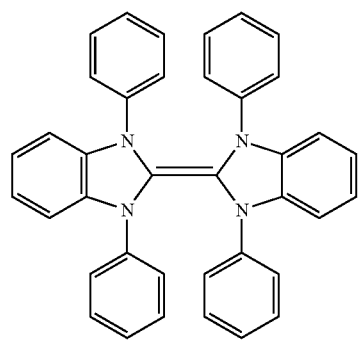
D2
Examples of the organic compound expressed by general formula (5) are shown below.
[Chem. 18]
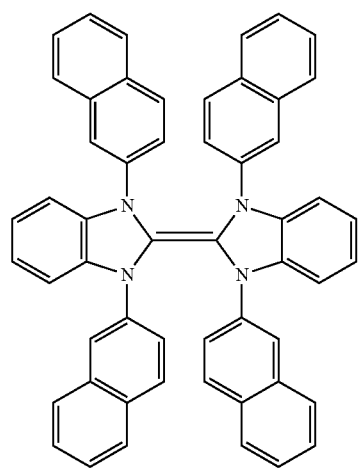
A1
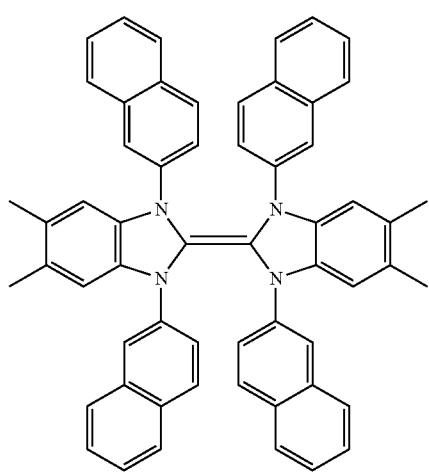
A2
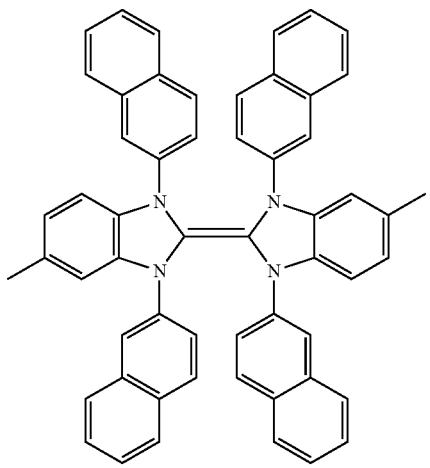
A3
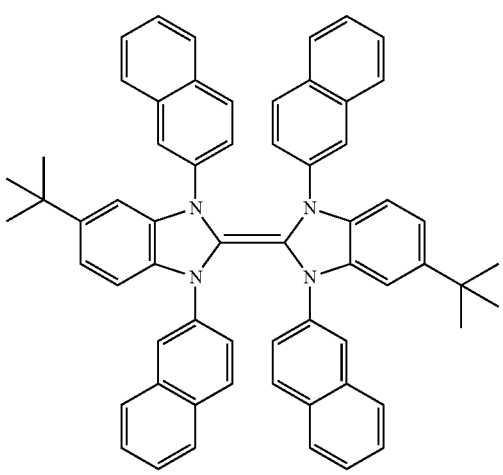
A4
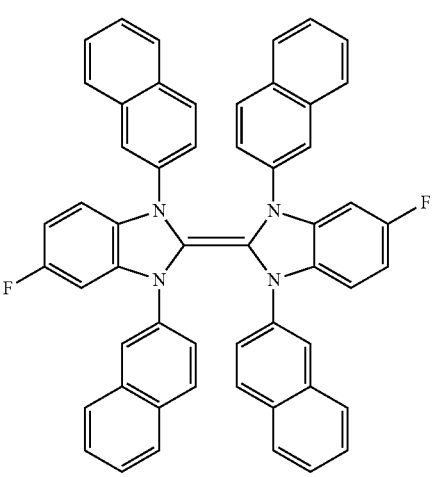
A5

A6 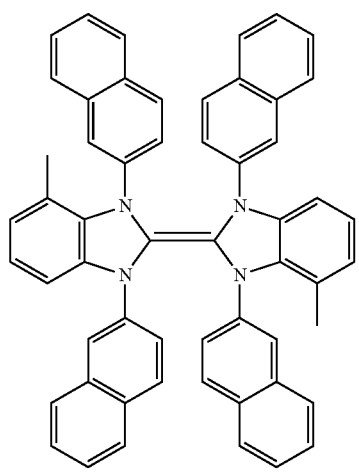
A9 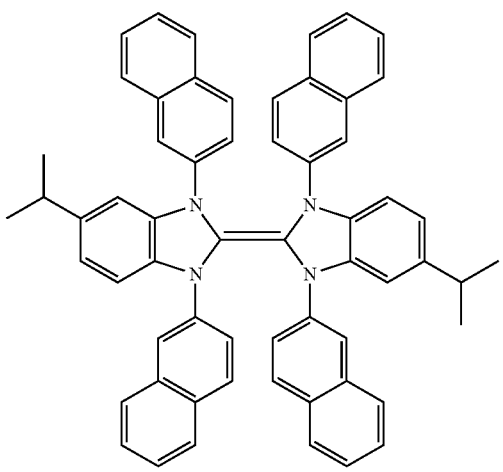
A7 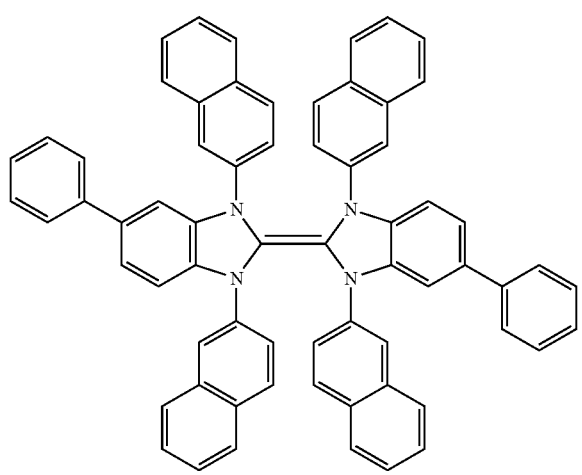
A10 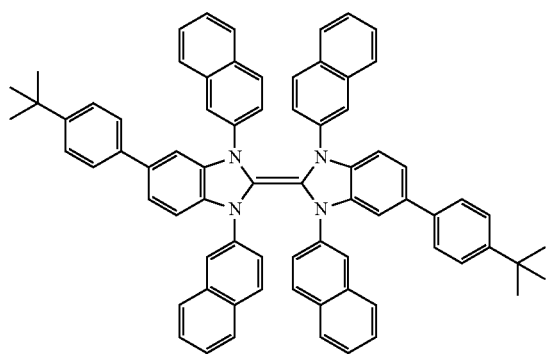
A8 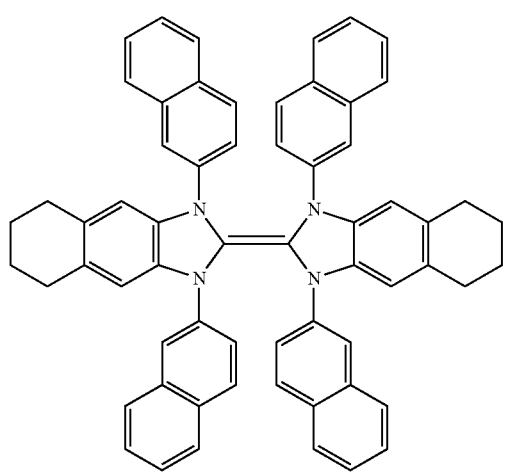
A11 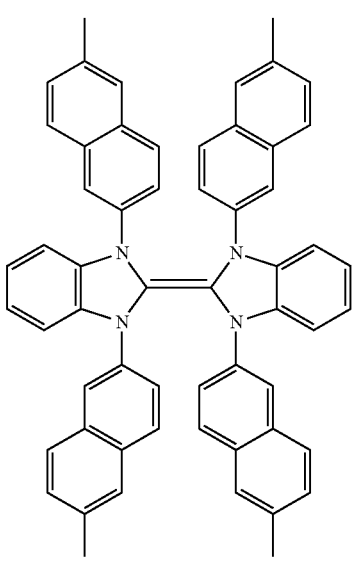

A12
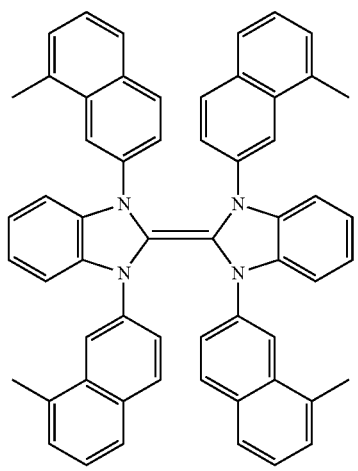
A13
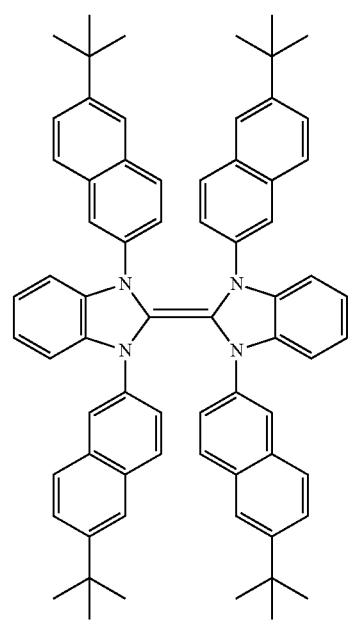
A14
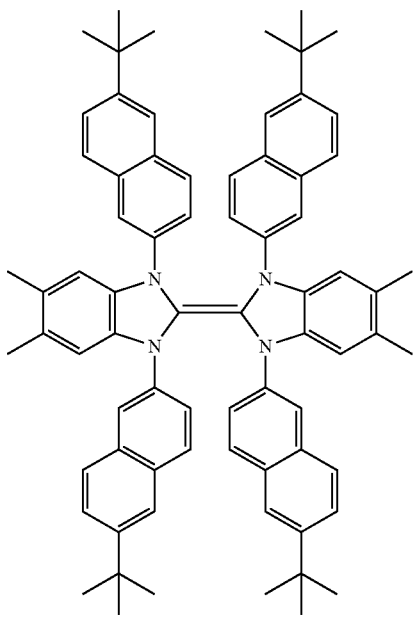
A15
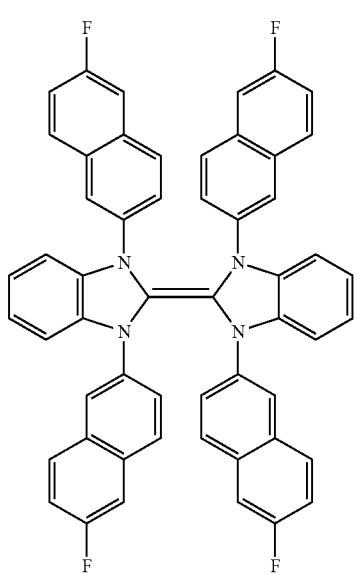
A16
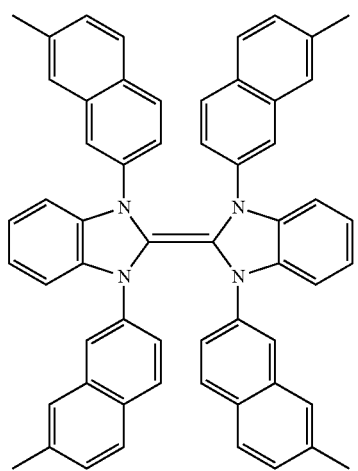

A17
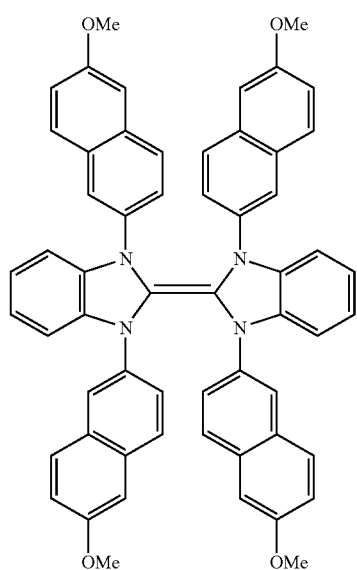
A19
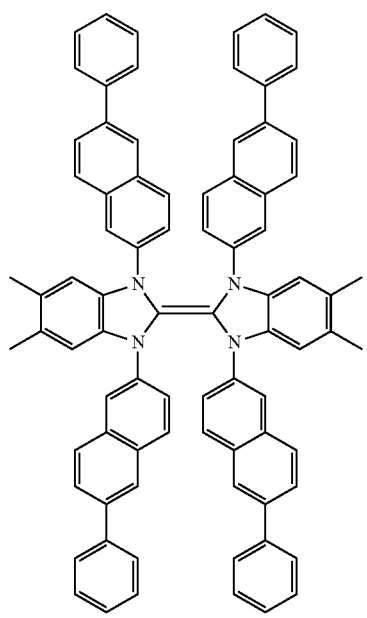
A18
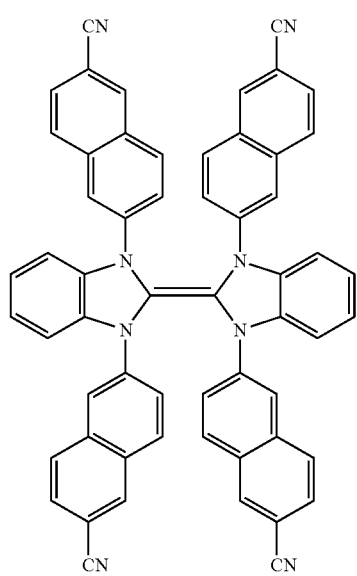
A20
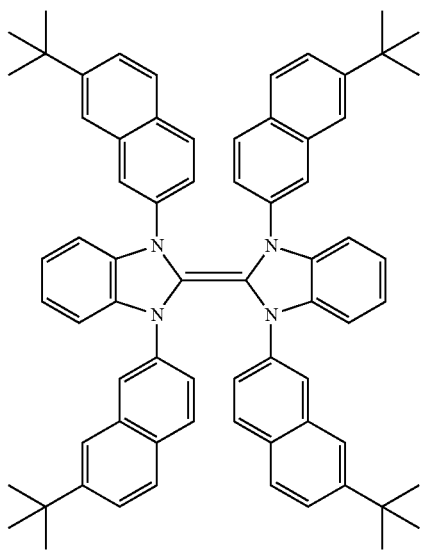

77
-continued
[Chem. 19]
78
-continued
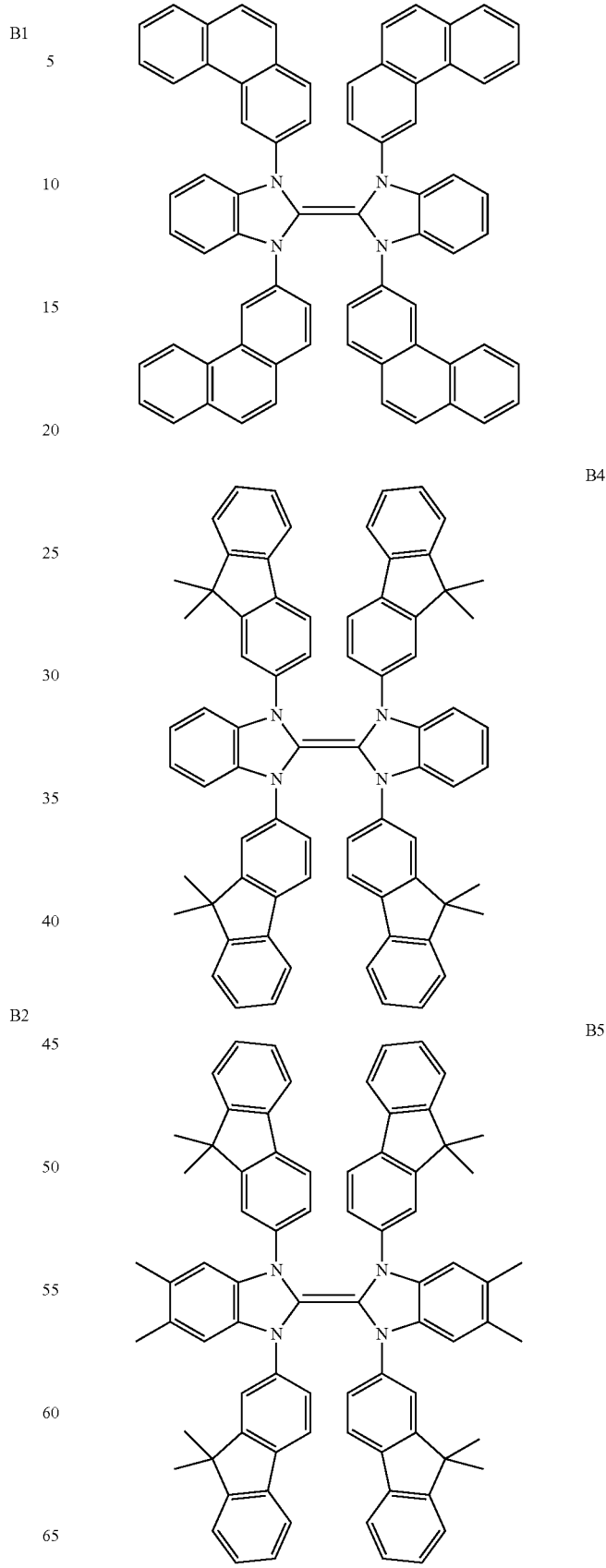

-continued
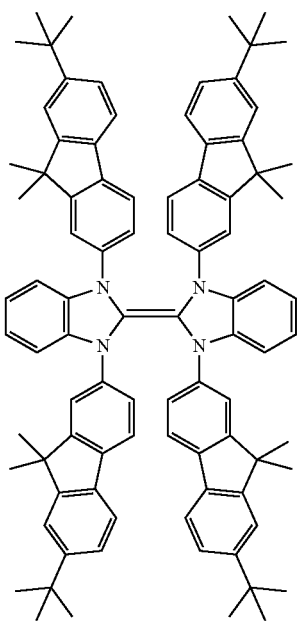
B6
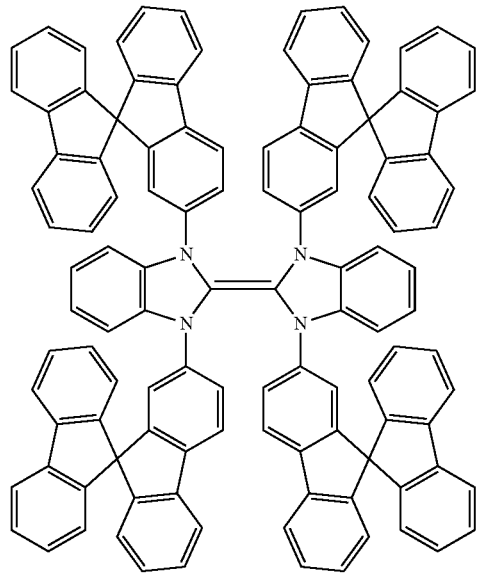
B8
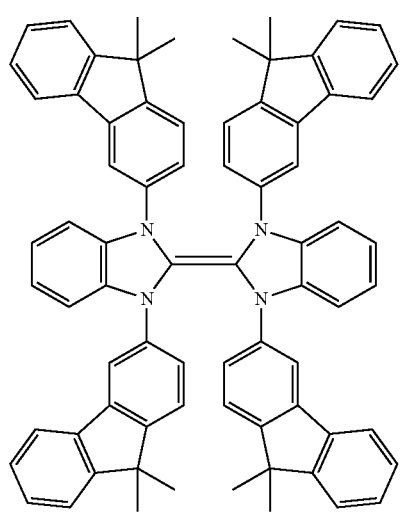
B7
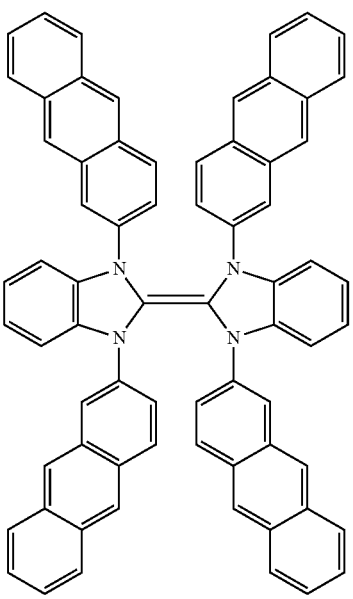
B5

B6 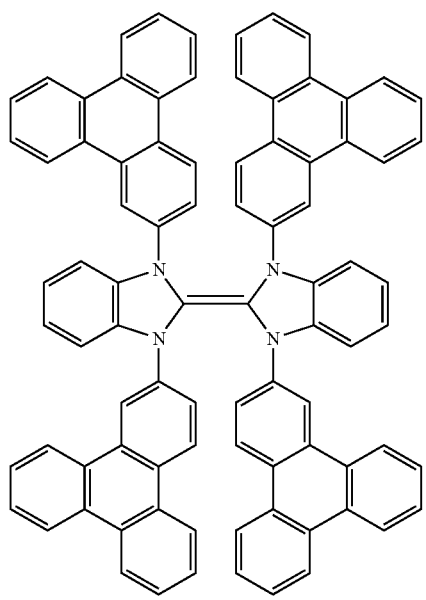
B7 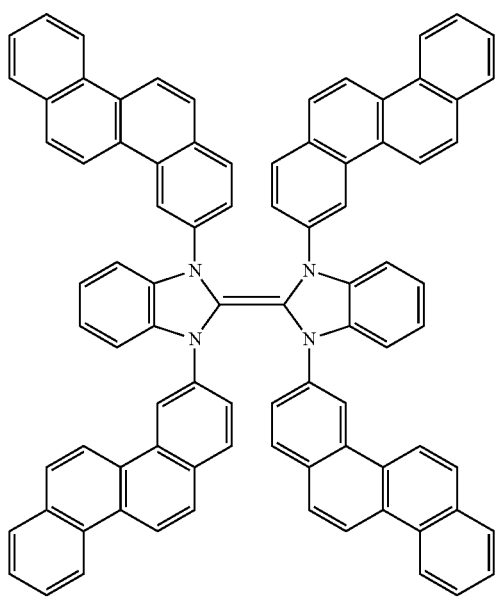
B8 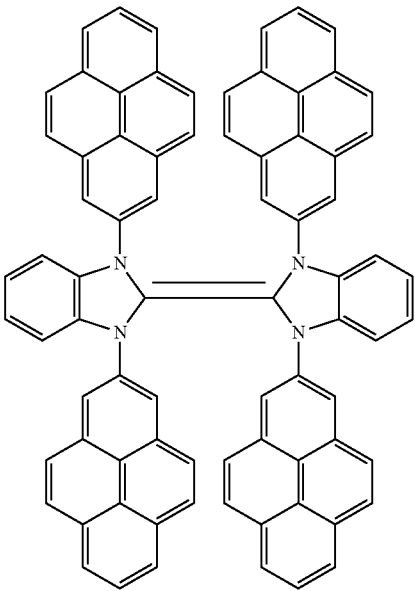
[Chem. 20]
C1 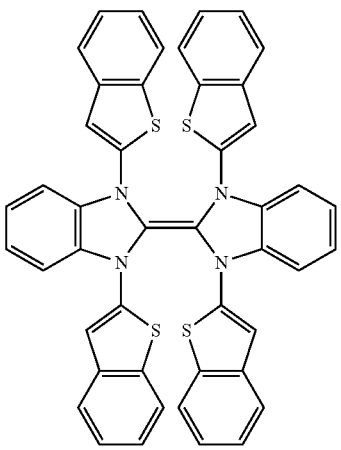
C2 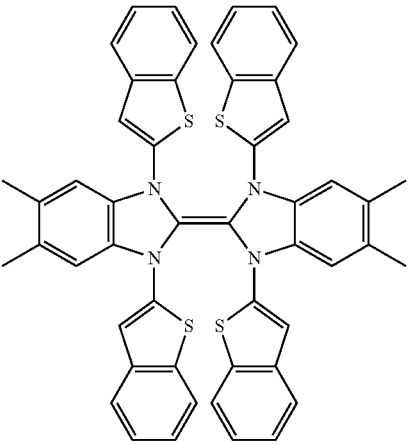

C3
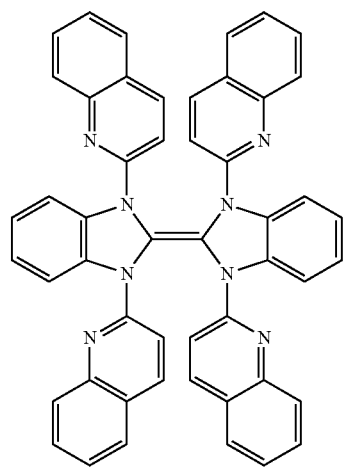
C4
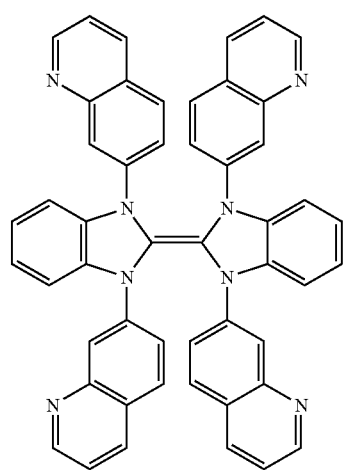
C5
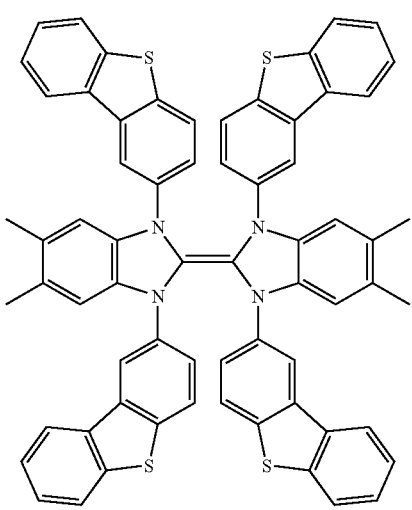
C6
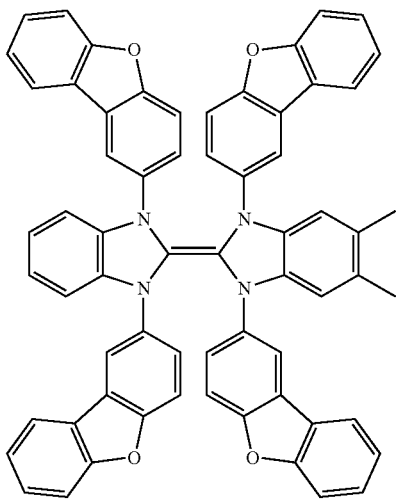
C7
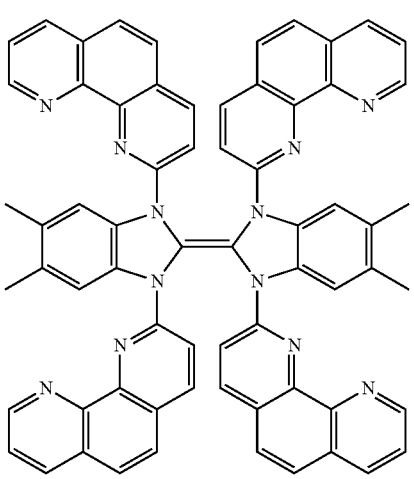
C8
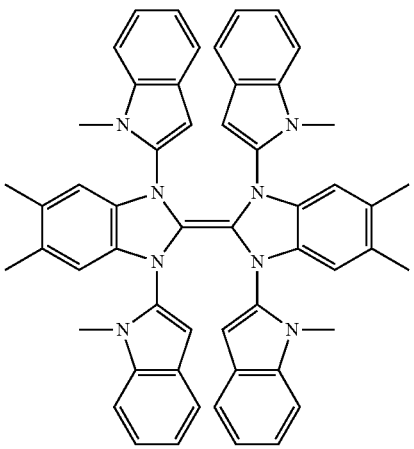

85
-continued
C9
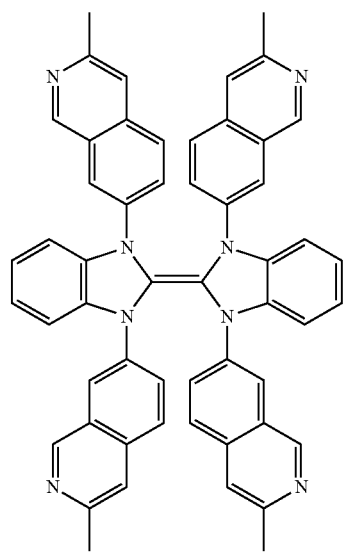
C10
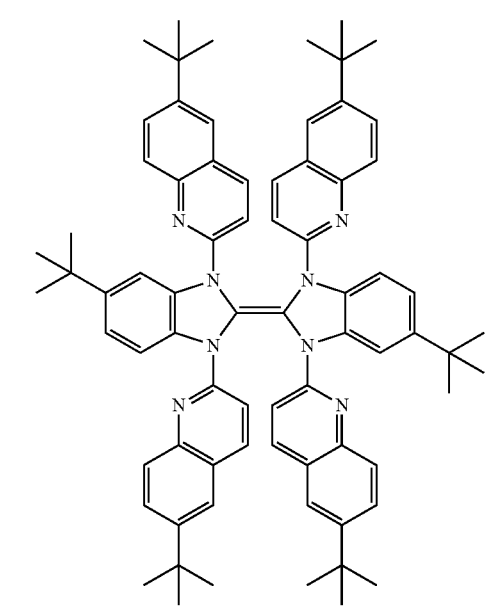
C11
86
-continued
C12
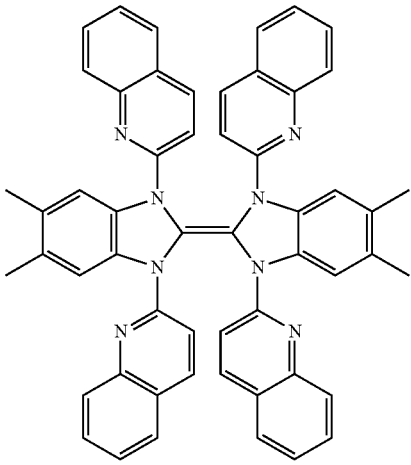
C13
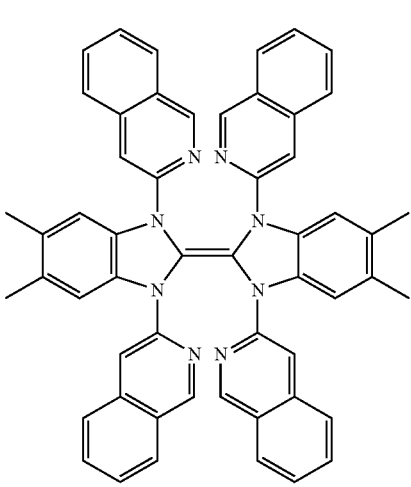
C14
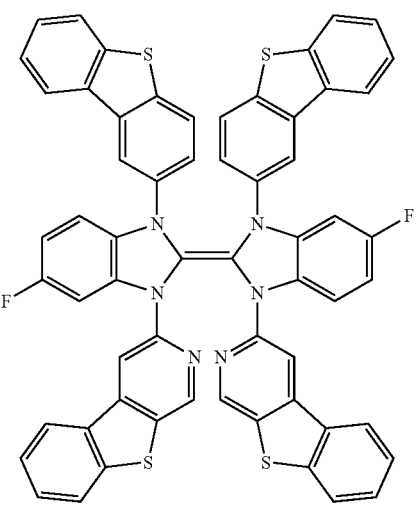

C15
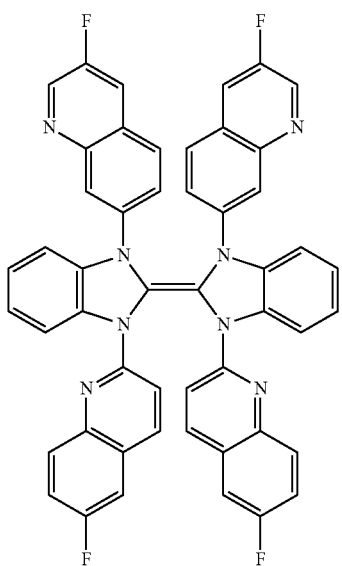
C16
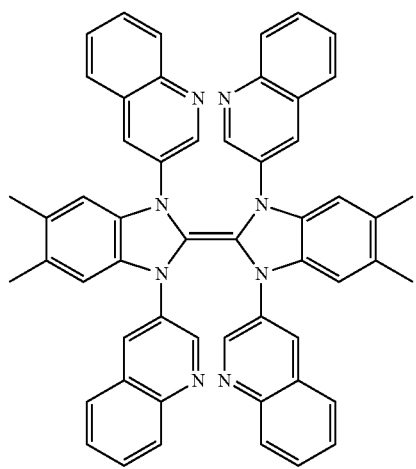
Examples of the organic compound expressed by general formula (6) are shown below.
[Chem. 21]
A1
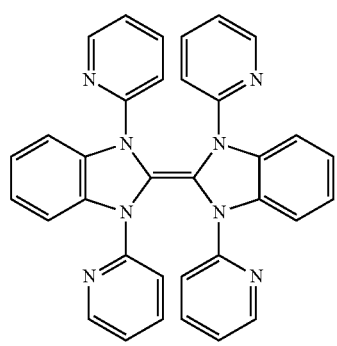
A2
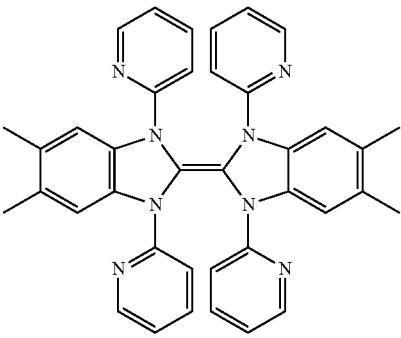
A3
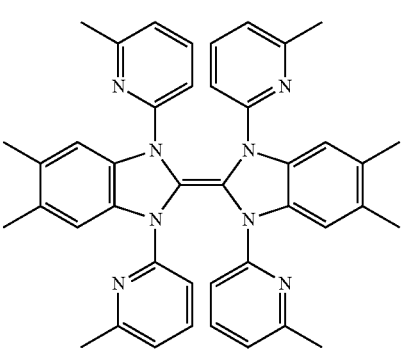
A4
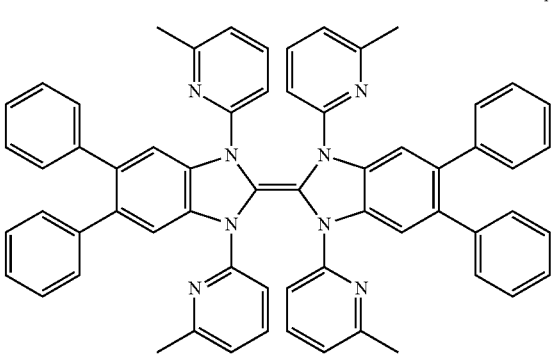
A5
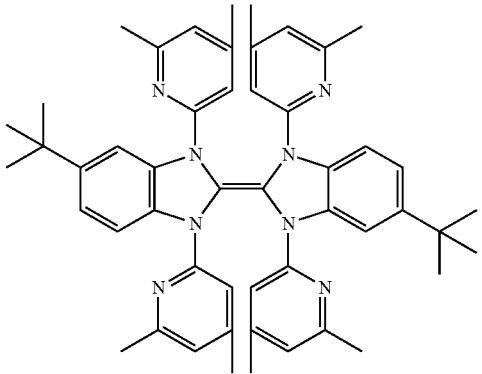

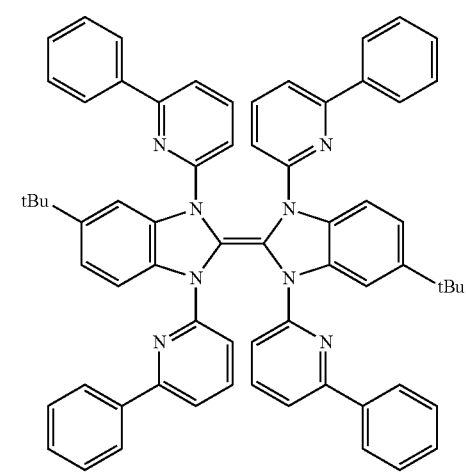
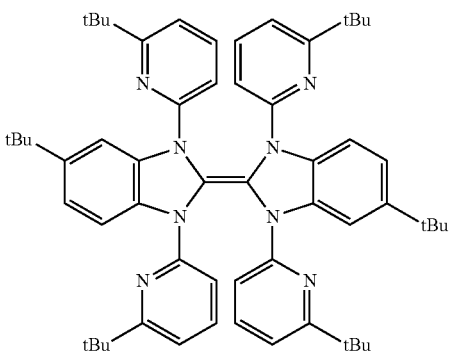
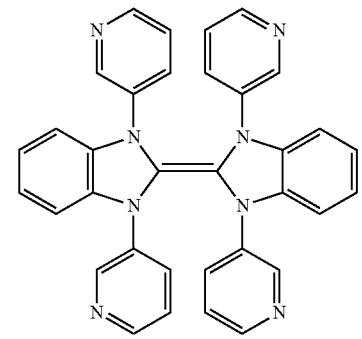

A14
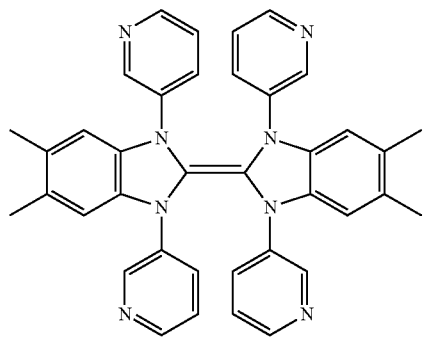
A15
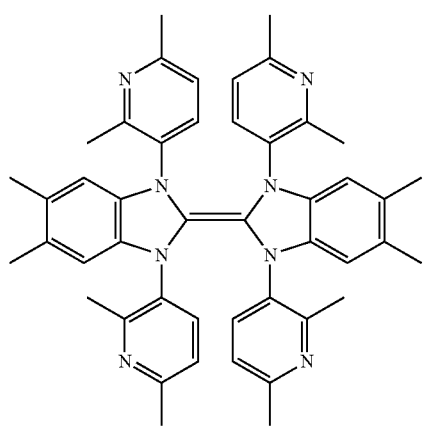
A16
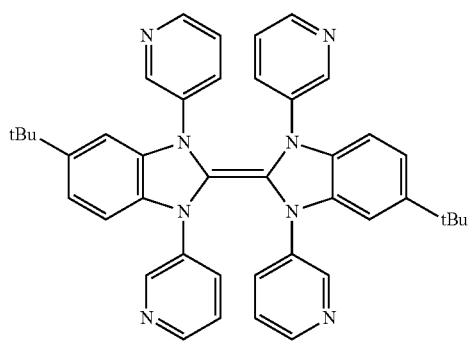
A17
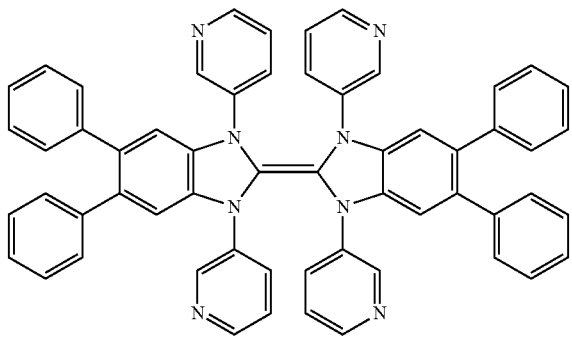
A18
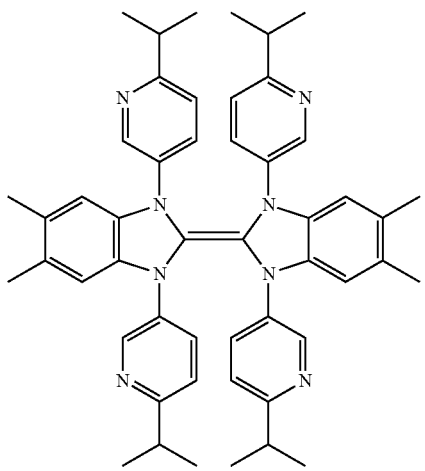
A19
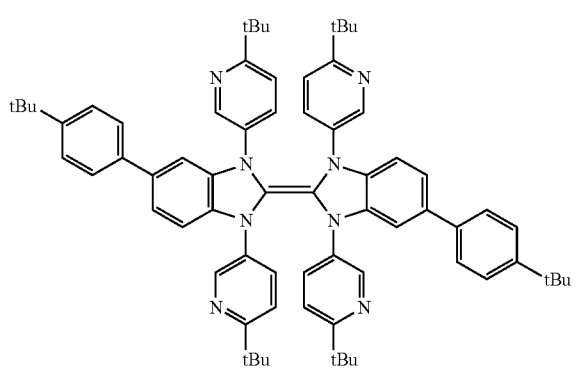
A20
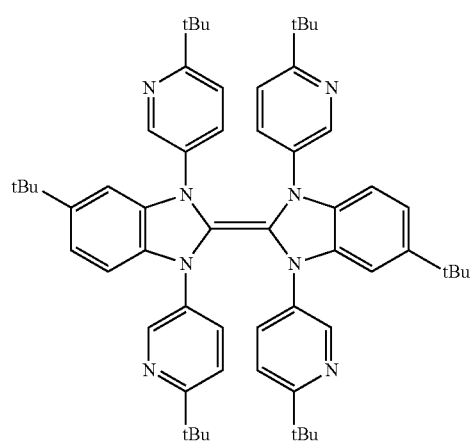

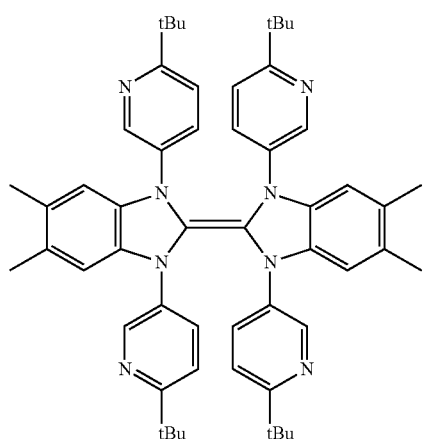
A21
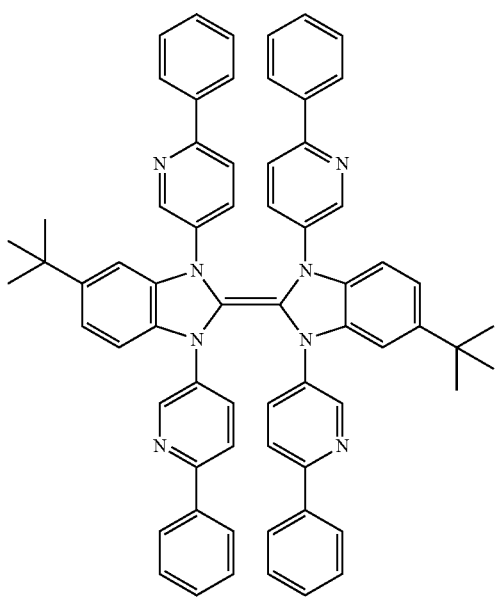
A24
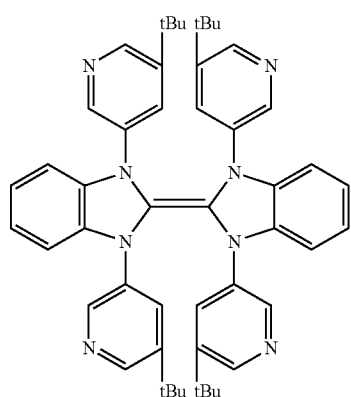
A22
[Chem. 22]
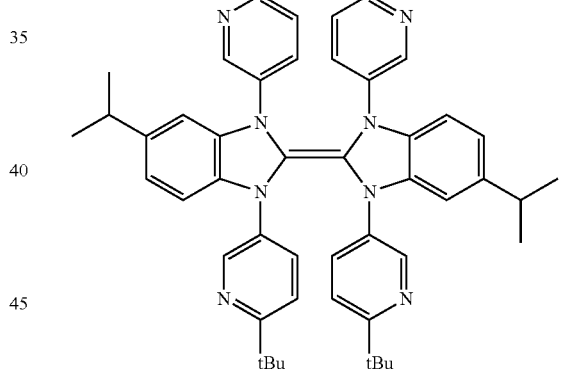
A25
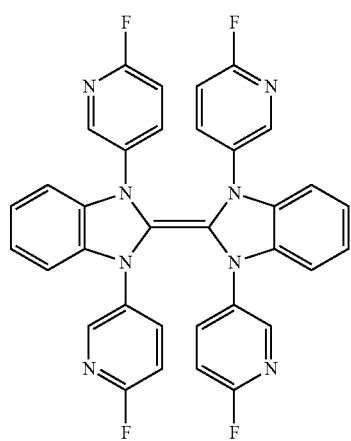
A23
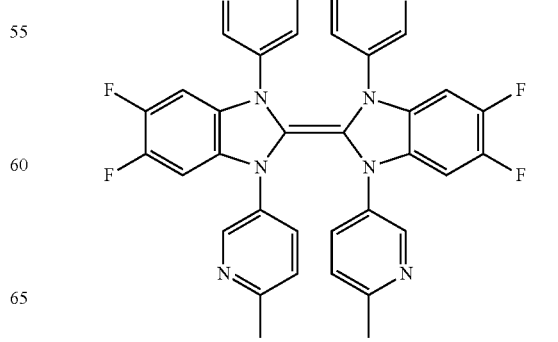
A26

A27
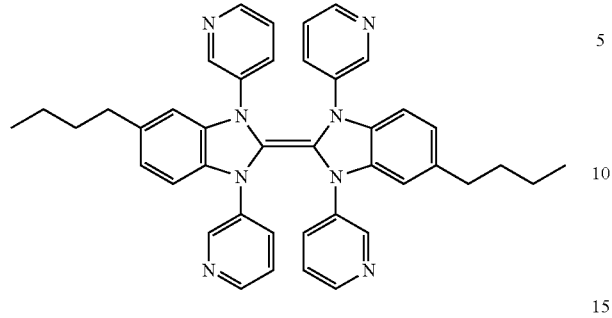
A28
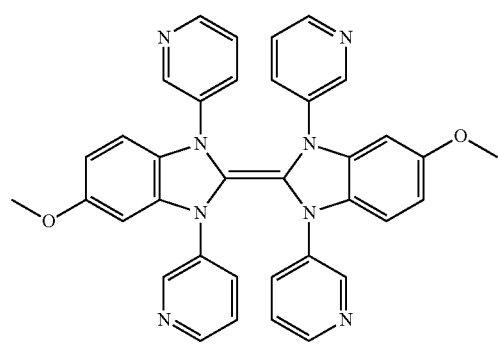
A29
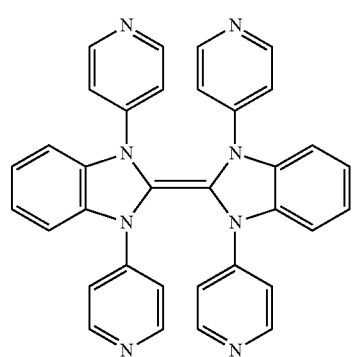
A30
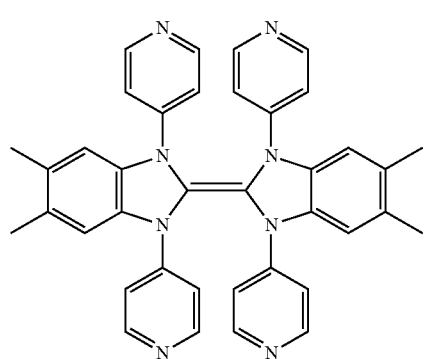
A31
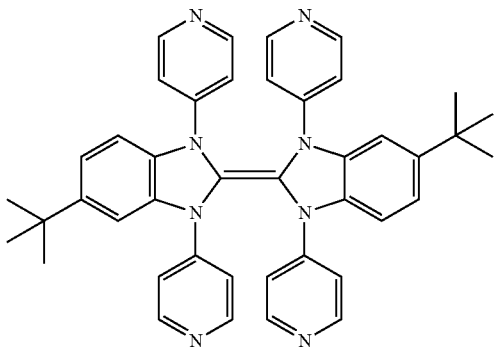
A32
A33
A34

-continued
A35
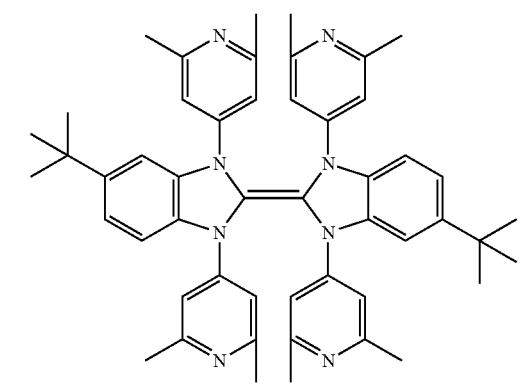
A36
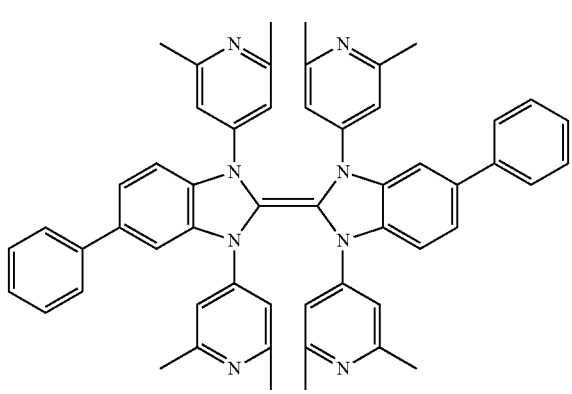
A37
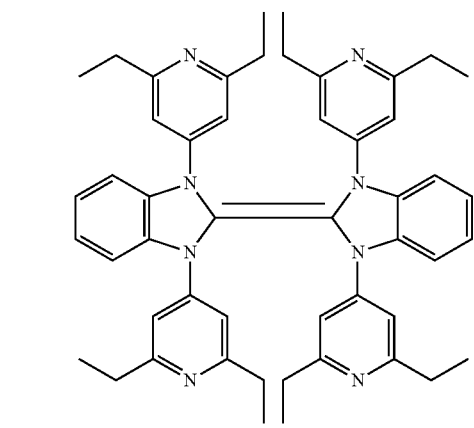
A38
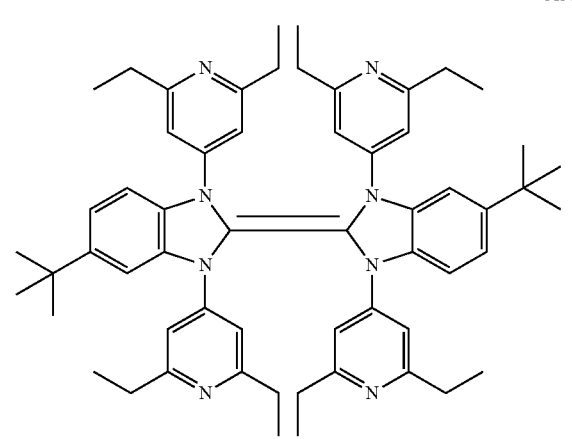
-continued
A39
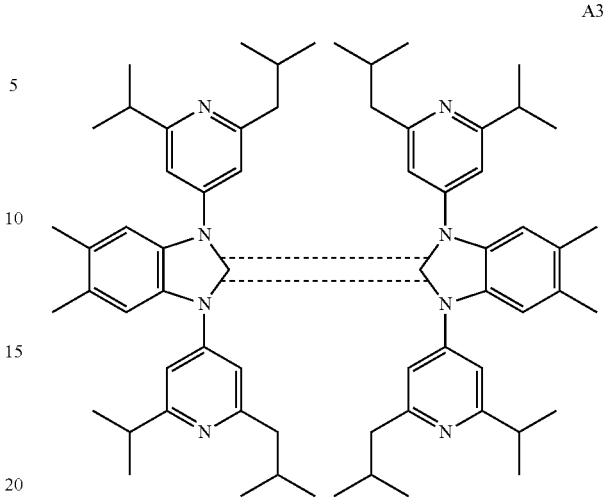
A40
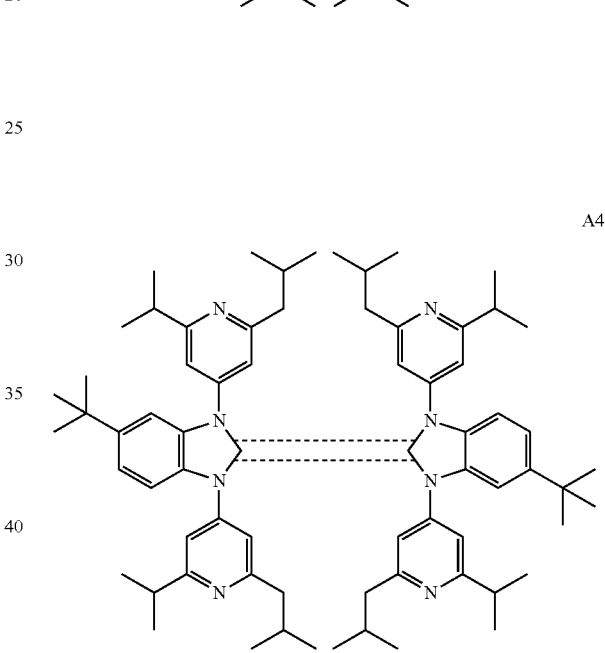
A41
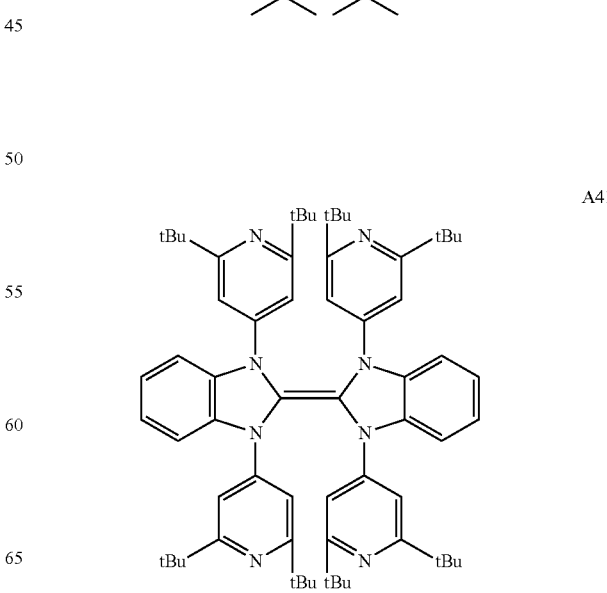

A42 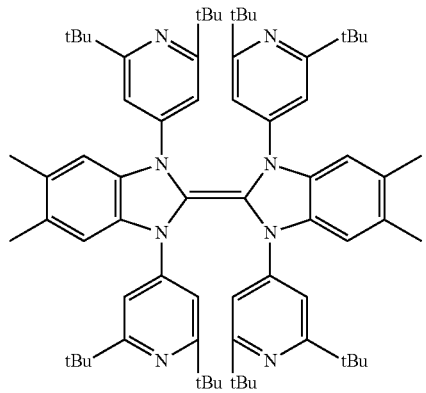
A43 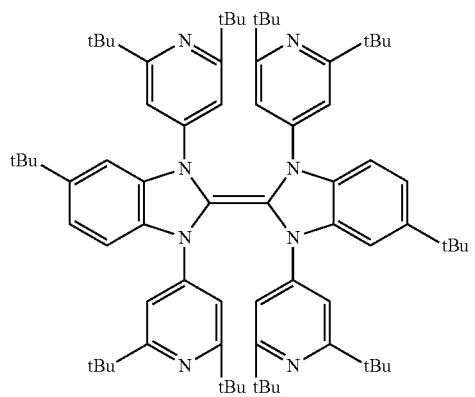
A44 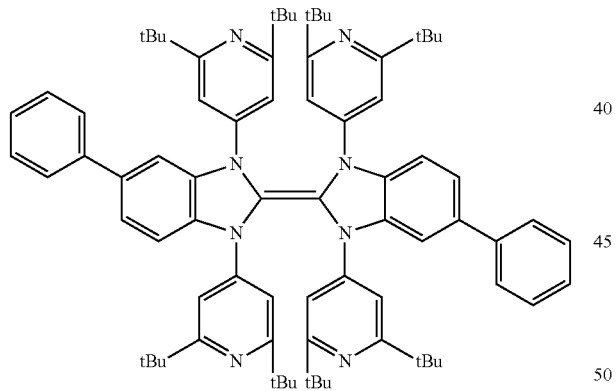
A45 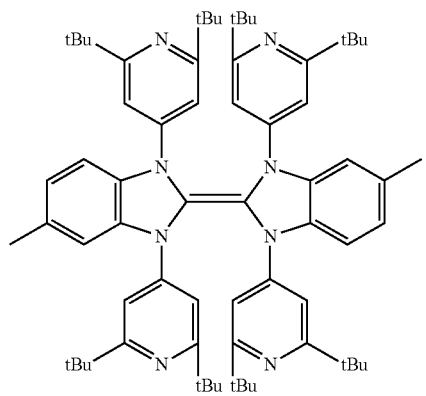
A46 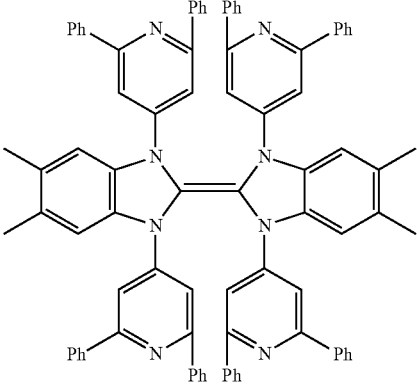
A47 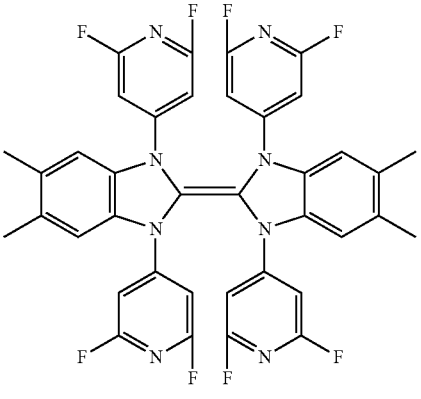
A48 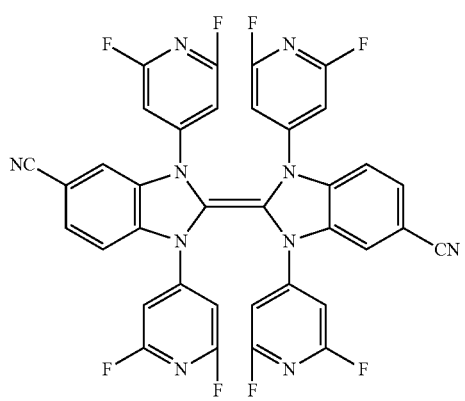
[Chem. 23]
B1 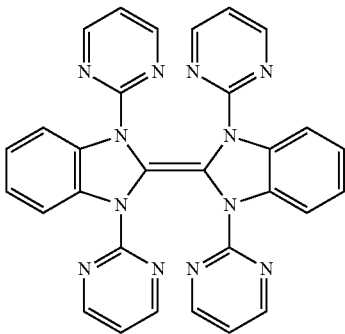

-continued
B2
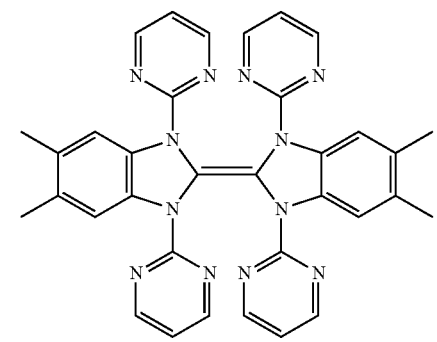
B3
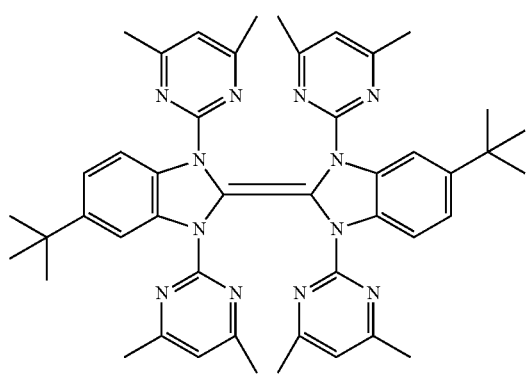
B4
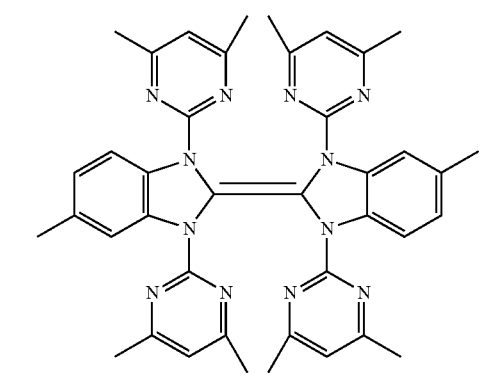
B5
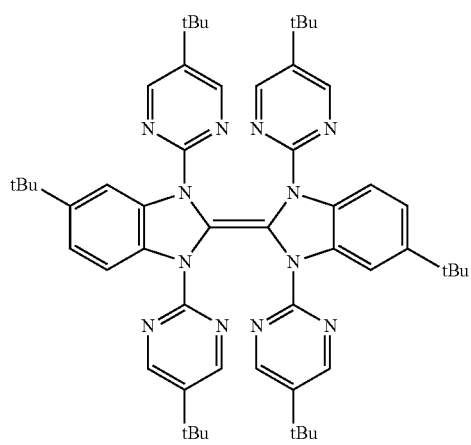
-continued
B6
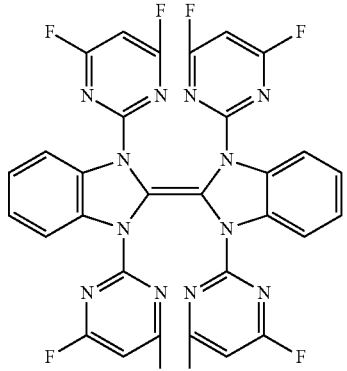
B7
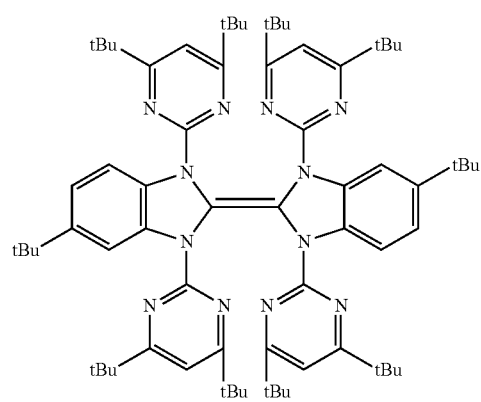
B8
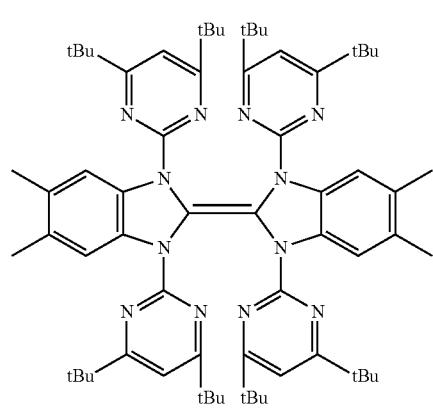
B9
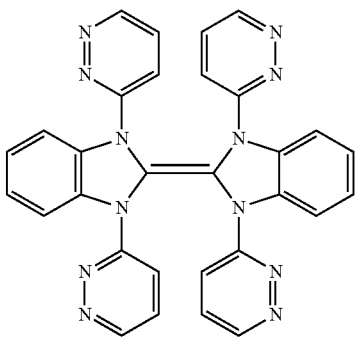

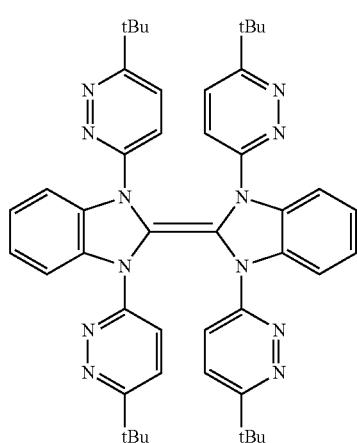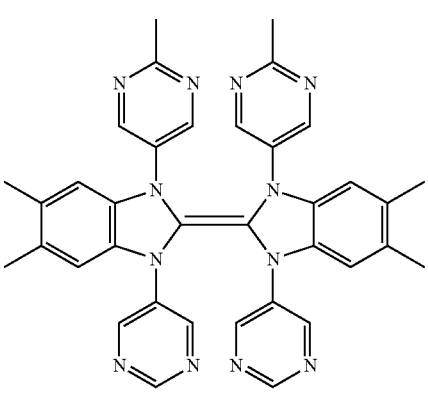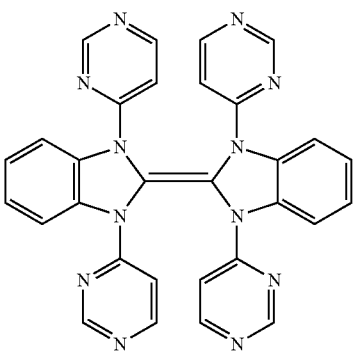

B18
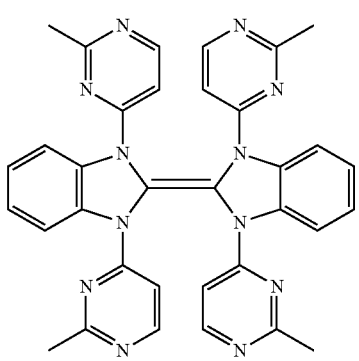
B19
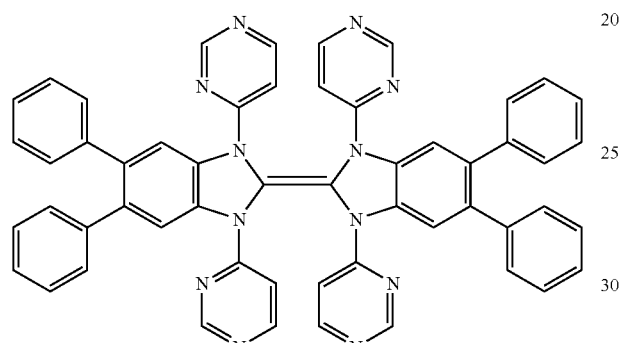
B20
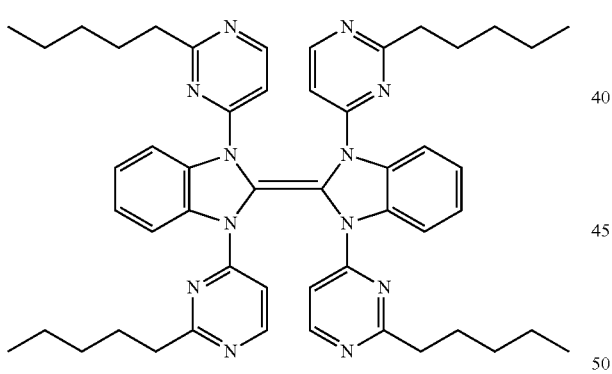
C1
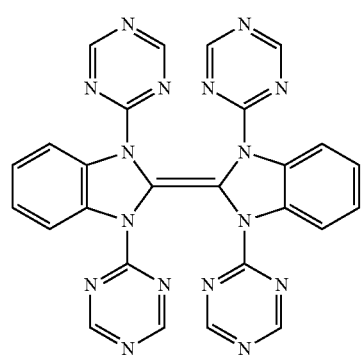
C2
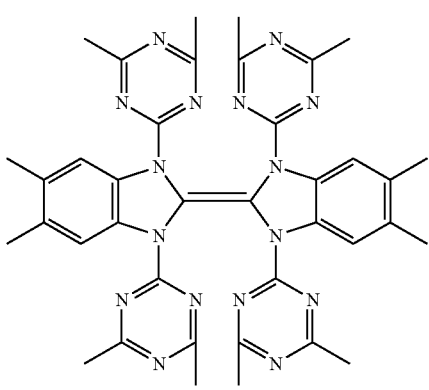
C3
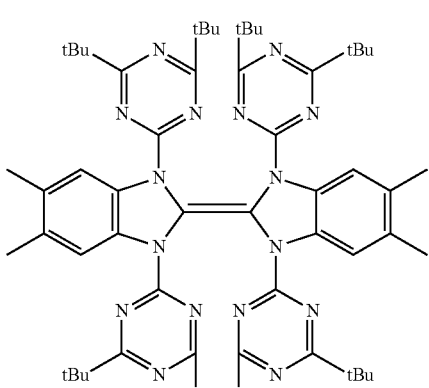
C4
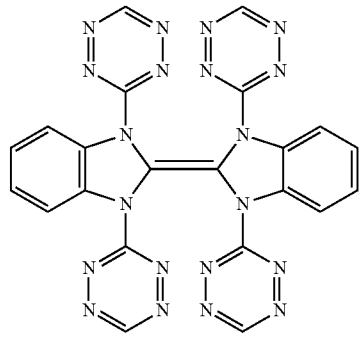
[Chem. 24]
D1
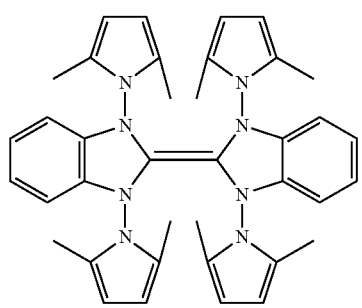

D2 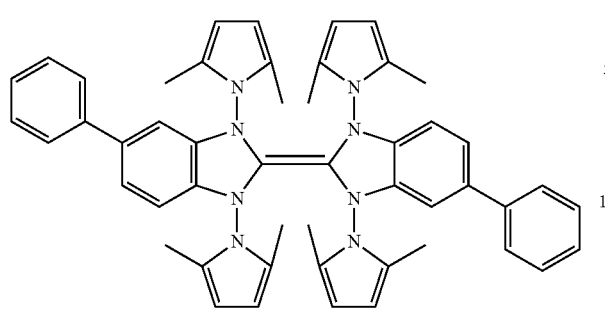
D3 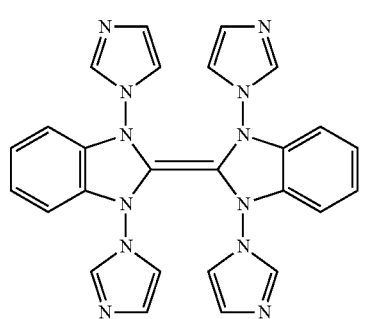
D4 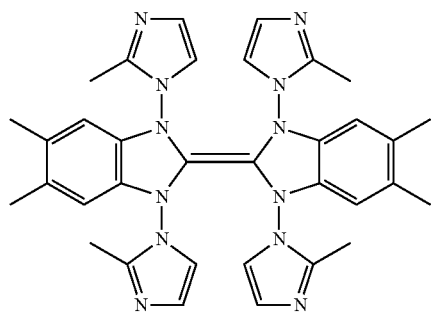
D5 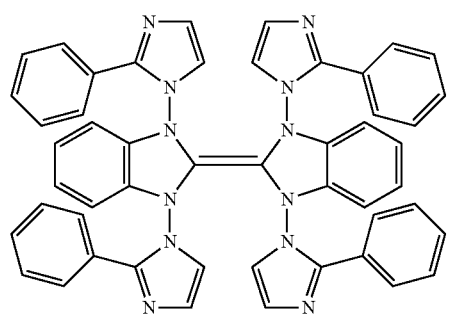
D6 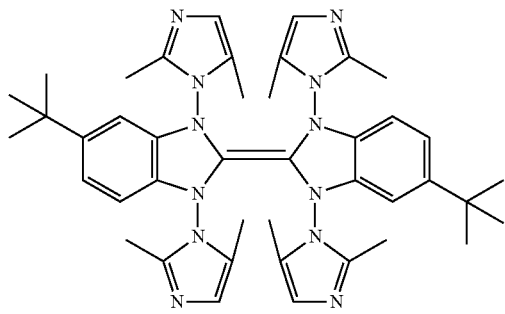
D7 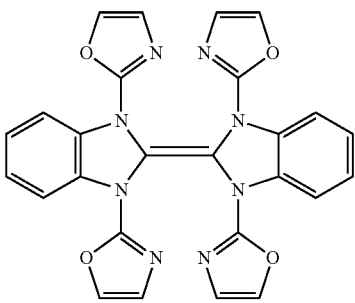
D8 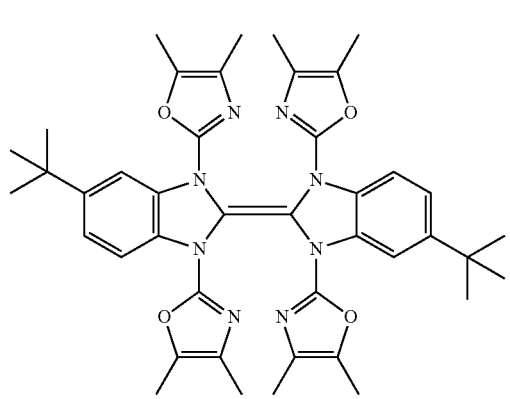
D9 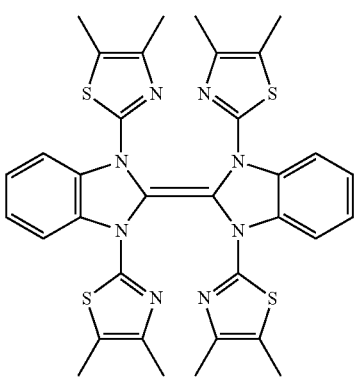
D10 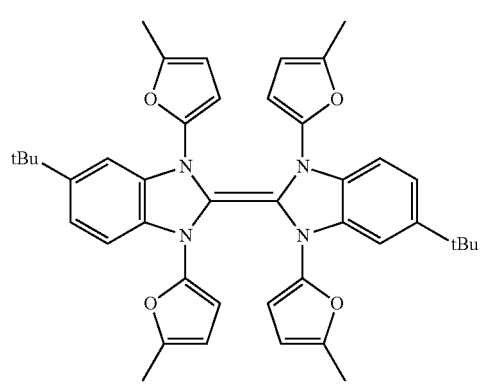

D11
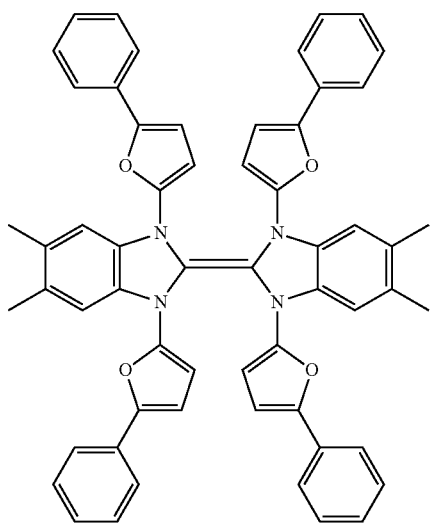
D12
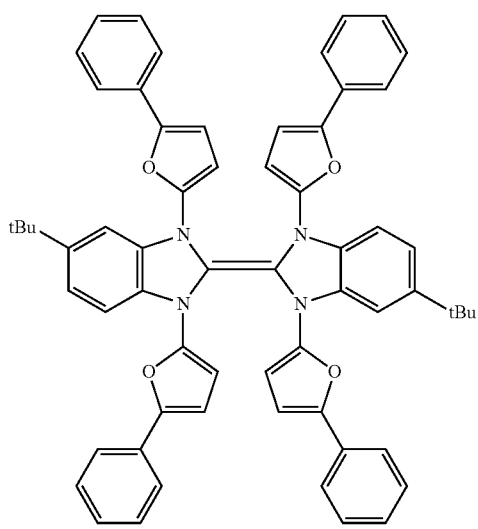
D13
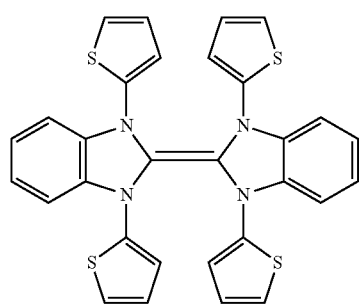
D14
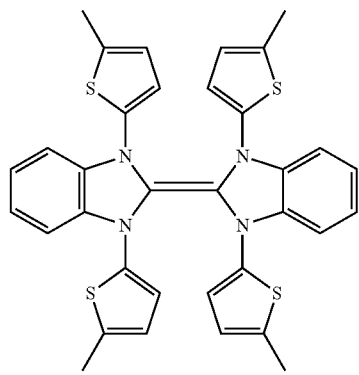
D15
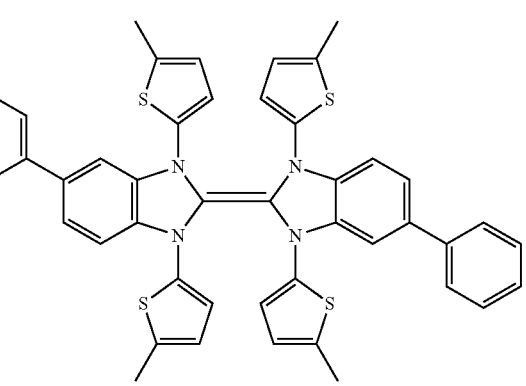
D16
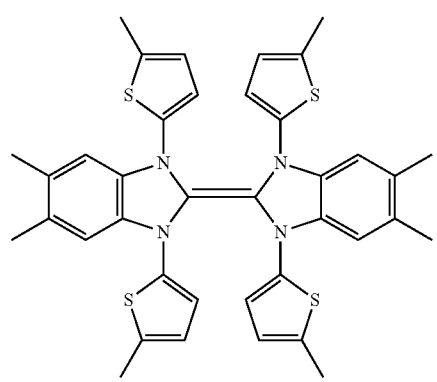
D17
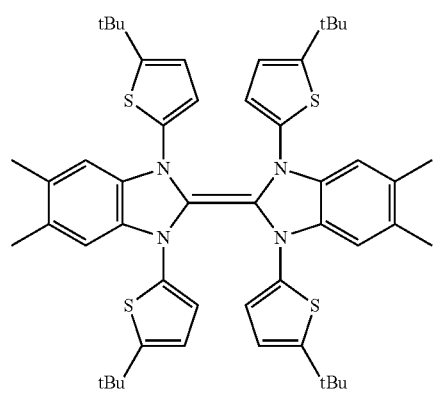

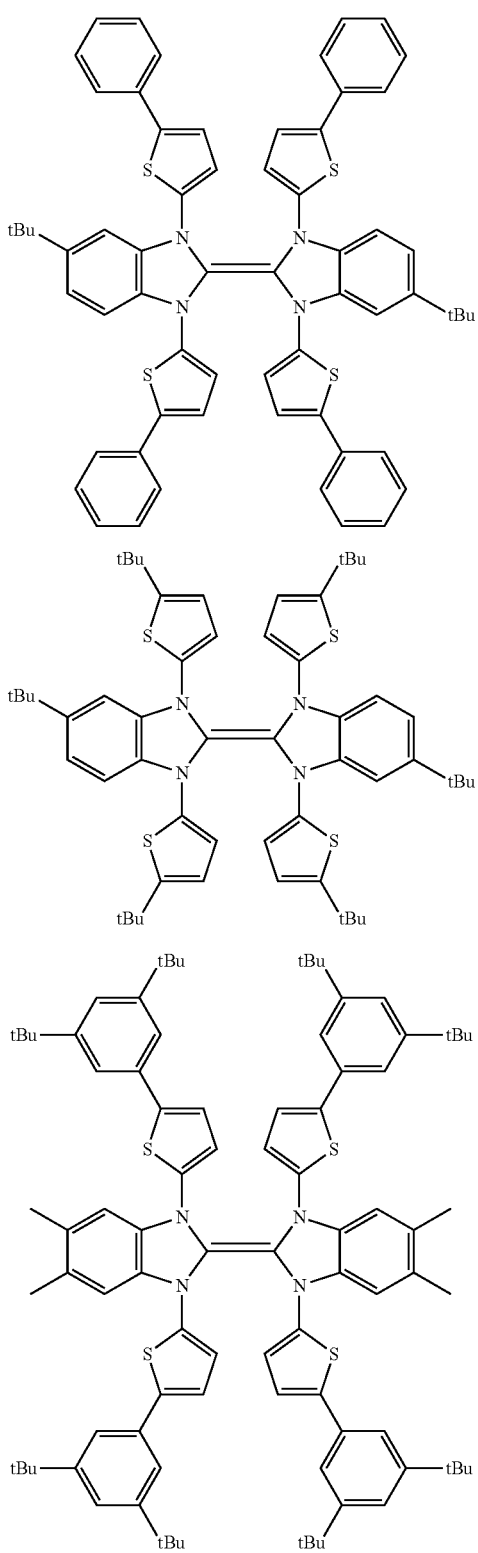

D18

D19

D20

Processes for Synthesizing Organic Compounds of General Formulas (1) to (6)

A process for synthesizing an organic compound of general formula (1) is disclosed by David M. Lemal in "Journal of American Chemical Society, 1964, 86 (12), pp 2518-2519". A variety of organic compounds represented by general formula (1) can be synthesized by appropriately replacing the reagent used in the disclosed process.

A process for synthesizing an organic compound of general formula (2) is disclosed by H. W. Wanzlick in "Organic Syntheses, Coll. Vol. 5, p. 115 (1973) and Vol. 47, p. 14 (1967)". A variety of organic compounds represented by general formula (2) can be synthesized by appropriately replacing the reagents used in the disclosed process.

Process for Synthesizing Organic Compound of General Formula (3)

An organic compound of general formula (3) may be synthesized by, for example, the following process.

[Chem. 25]

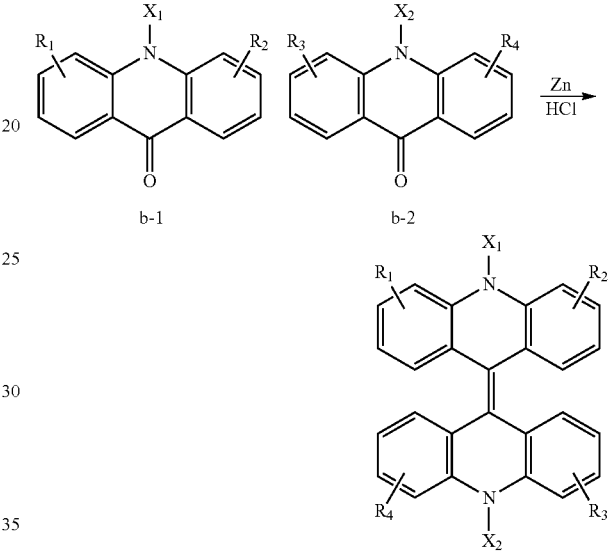

A variety of organic compounds represented by general formula (3) can be synthesized by appropriately replacing the reagents corresponding to $R_1$ to $R_4$, $X_1$ and $X_2$. For example, Exemplified Compound A-1 of general formula (3) was synthesized by the following scheme.

[Chem. 26]

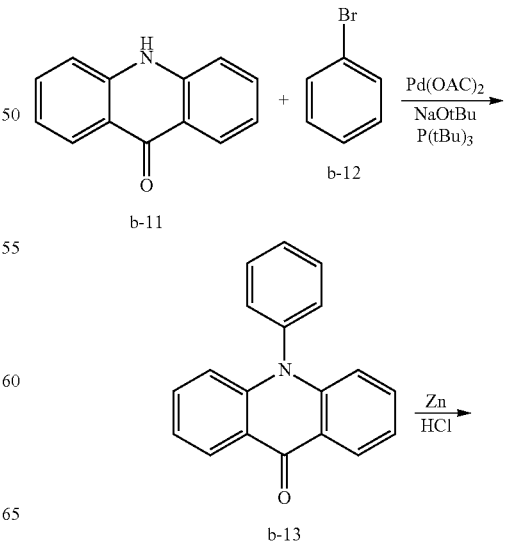

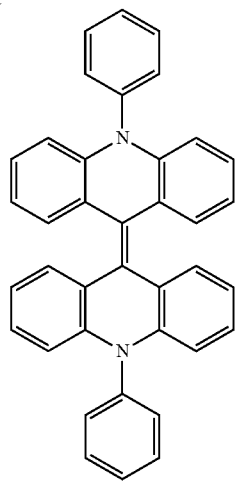

(1) Synthesis of Compound b-13

First, a 200 mL three-neck flask was charged with the following reagents:
Compound b-11: 1.50 g (7.68 mmol)
Compound b-12: 2.41 g (15.36 mmol)
Sodium tert-butoxide: 1.47 g (15.36 mmol)

Then, after adding 100 mL of chlorobenzene, 155 mg of tri-tert-butyl phosphine was added to the mixture with stirring in a nitrogen atmosphere at room temperature. Subsequently, 86 mg of palladium acetate was added. After being heated to 131° C., the reaction liquid is stirred at this temperature (131° C.) for 5 hours for reaction. After the completion of the reaction, 100 mL of water was added, and the organic phase was extracted with chloroform. Then, the organic phase was dried with anhydrous sodium sulfate and was subsequently concentrated under reduced pressure to yield a crude product. The crude product was purified through a silica gel column (toluene+ethyl acetate mixed eluent) to yield 1.31 g (yield 63%) of compound b-13 in white solid.

(2) Synthesis of Exemplified Compound A-1

A 50 mL three-neck flask was charged with 30 mL of acetone. The acetone was subjected to bubbling with argon for 15 minutes. Then, the following reagents were added into the flask:
Compound b-13: 271 mg (1.0 mmol)
Zinc powder: 1.30 g (20.0 mmol)

Subsequently, the reaction liquid was heated to 50° C. and then stirred at this temperature (50° C.) for 30 minutes. After 12.0 mL of concentrated hydrochloric acid was added over a period of 30 minutes while the reaction liquid was cooled with ice. Then, the reaction liquid was stirred at room temperature for 20 hours for reaction. After the completion of the reaction, 30 mL of water was added, and the resulting yellow solid precipitate was separated out by filtration. The separated solid was rinsed with water. Thus, 177 mg (yield: 69%) of Exemplified Compound A-1 was obtained in yellow solid.

Process for Synthesizing Organic Compound of General Formula (4)

An organic compound of general formula (4) may be synthesized by, for example, the following scheme.

[Chem. 27]

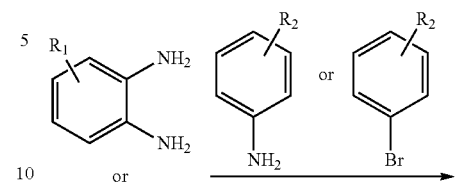

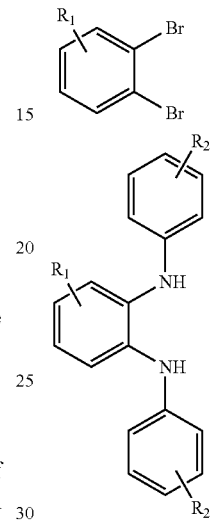

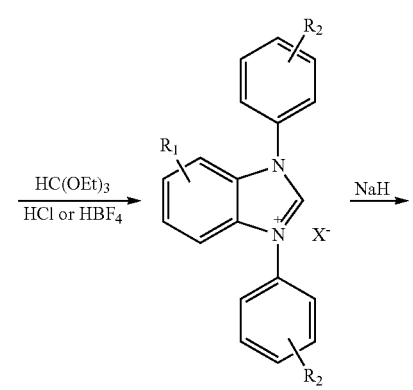

X: Cl or BF$_4$

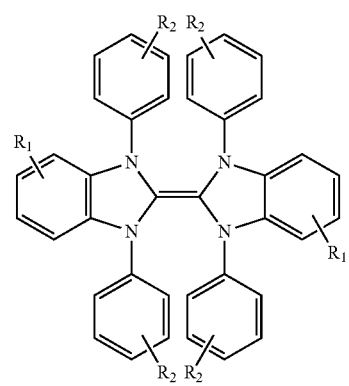

A variety of organic compounds represented by general formula (4) can be synthesized by appropriately replacing the reagents corresponding to R$_1$ and R$_2$. For example, Exemplified Compound A1 of general formula (4) was synthesized by the following scheme.

(1) Synthesis of Compound E3

[Chem. 28]

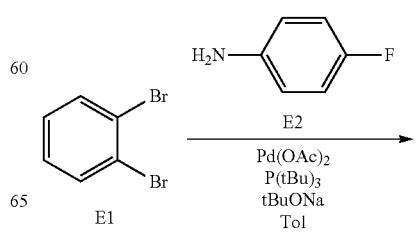

-continued

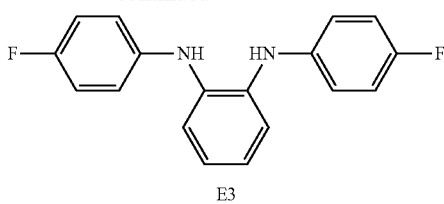

E3

The following compounds and solvents were added to a 100 mL recovery flask:

E1: 2.36 g (10.0 mmol)

E2: 2.33 g (21.0 mmol)

Palladium acetate: 67 mg (0.3 mmol)

Tri-tert-butylphosphine: 0.17 mL (0.7 mol)

Sodium tert-butoxide: 2.31 g (24.0 mmol)

Toluene: 50 mL

The resulting solution was heated to reflux with stirring for 8 hours. After the completion of the reaction, water was added for separation. The reaction product was purified by silica gel column chromatography (eluent: heptane/chloroform=3/1) to yield 2.34 g (yield: 79%) of Compound E3.

(2) Synthesis of Compound E4

[Chem. 29]

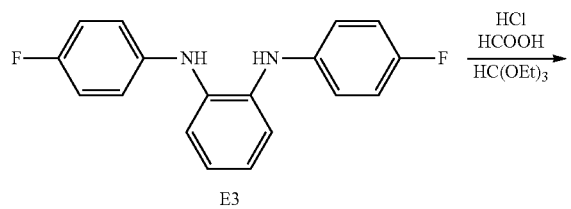

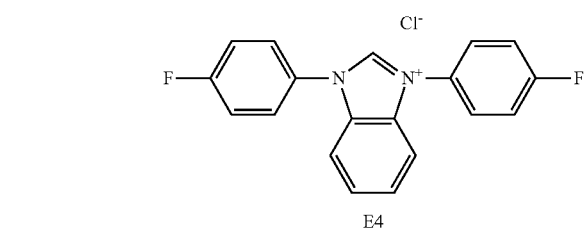

The following compound and solvent were added to a 100 mL recovery flask:

Compound E3: 1.48 g (5.00 mmol) Triethyl orthoformate: 25 mL

To the resulting solution, 0.5 mL of 12 N hydrochloric acid was added, and the mixture was stirred for 5 minutes. Then, 0.05 mL of formic acid was added, and the mixture was heated at 80° C. for 4 hours with stirring. After the completion of the reaction, triethyl orthoformate was removed under reduced pressure. Then, the resulting product was dissolved in chloroform and purified by silica gel column chromatography (eluent: chloroform/methanol=20/1) to yield 1.20 g (yield: 70%) of Compound E4.

(3) Synthesis of Exemplified Compound A1

[Chem. 30]

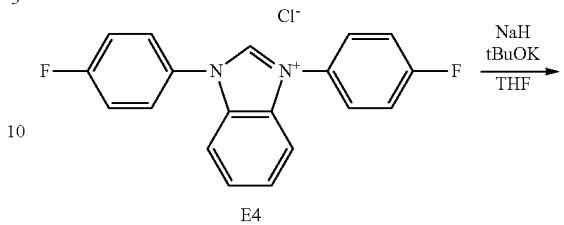

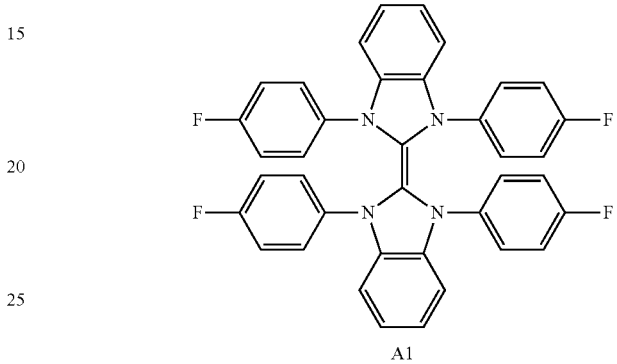

In a nitrogen flow, the following compound and solvent were added to a 100 mL recovery flask:

E4: 342 mg (1.00 mmol)

Dehydrated THF: 20 mL

To the resulting solution, 48 mg (2.00 mmol) of sodium hydride was added, and the mixture was stirred for 2 minutes. Then, 1 mg (0.01 mmol) of tBuOK was added, and the mixture was heated at 80° C. for 10 hours with stirring. After the completion of the reaction, 20 mL of dehydrated toluene was added and the sample was filtered through celite. The filtrate was concentrated to yield powder. The powder was washed by being dispersed in dehydrated hexane and filtered to yield 160 mg (yield: 52%) of Exemplified Compound A1 in yellow powder.

The resulting compound was subjected to matrix-assisted laser desorption/ionization time-of-flight mass spectrometry (MALDI-TOF-MS) using Autoflex LRF manufactured by Bruker.

Measured value: m/z=612.38; Calculated value: 612.19

CV measurement was performed in 0.1 M solution of tetrabutylammonium per-chlorate in N,N-dimethylformamide with a Ag/Ag$^+$ reference electrode, a Pt counter electrode, and a glassy carbon working electrode. The potential scan rate was 0.5 V/s.

For this measurement, an electrochemical analyzer Model 660C manufactured by ALS was used. Oxidation potential was −0.85 V.

Process for Synthesizing Organic Compound of General Formula (5)

An organic compound of general formula (5) may be synthesized by, for example, the following process.

[Chem. 31]

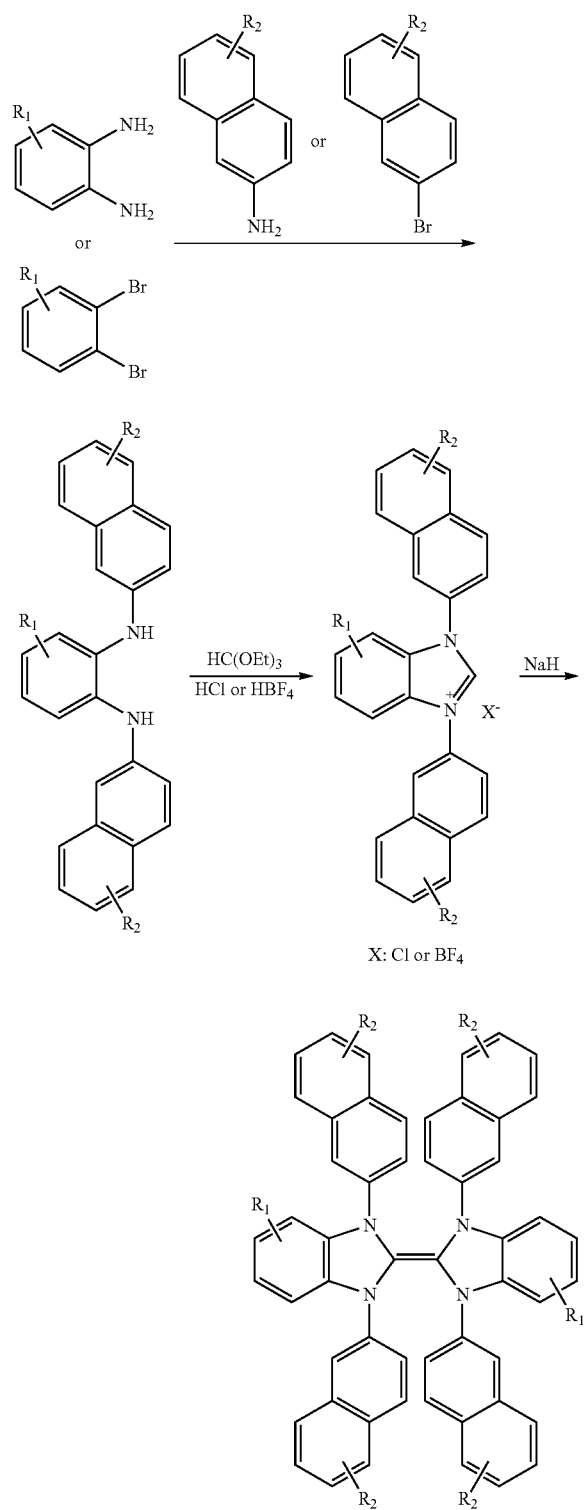

X: Cl or BF$_4$

A variety of organic compounds represented by general formula (5) can be synthesized by appropriately replacing the reagents corresponding to R$_1$ and R$_2$.

For example, Exemplified Compound A2 of general formula (5) was synthesized by the following scheme.

(1) Synthesis of Compound E3

[Chem. 32]

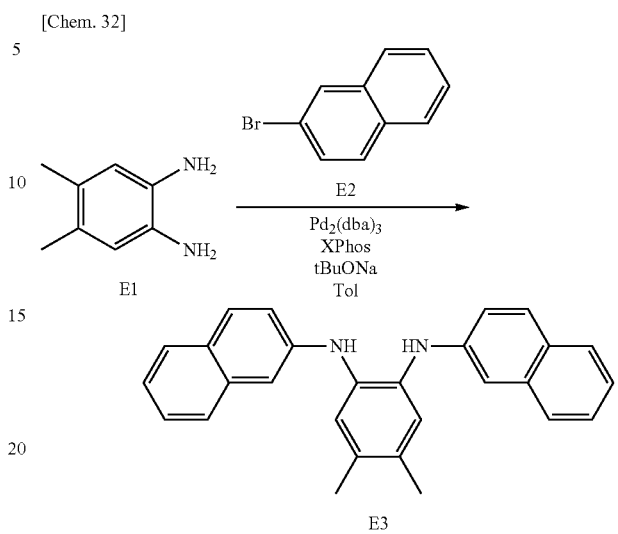

The following compounds and solvents were added to a 100 mL recovery flask:
E11: 1.36 g (10.0 mmol)
E15: 4.35 g (21.0 mmol)
Tris(dibenzylideneacetone)dipalladium (0): 274 mg (0.3 mmol)
2-Dicyclohexylphosphino-2',4',6'-triisopropylbiphenyl: 333 mg (0.7 mmol)
Sodium tert-butoxide: 2.31 g (24.0 mmol)
Toluene: 50 mL
The resulting solution was heated to reflux for 8 hours with stirring. After the completion of the reaction, the reaction mixture was filtered through celite and then subjected to separation by adding water. The separated reaction product was purified by silica gel column chromatography (eluent: heptane/chloroform=3/1 to 2/1) to yield 2.53 g (yield: 65%) of Compound E3.

(2) Synthesis of Compound E4

[Chem. 33]

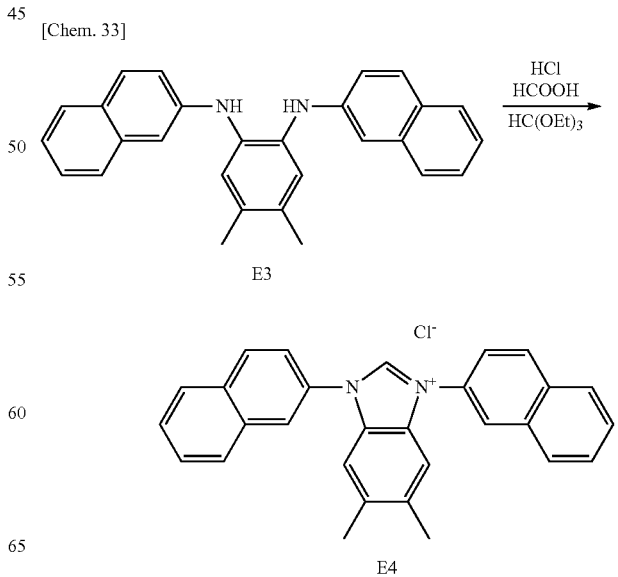

The following compound and solvent were added to a 100 mL recovery flask:

E27: 1.94 g (5.00 mmol)

Triethyl orthoformate: 50 mL

To the resulting solution, 0.8 mL of 12 N hydrochloric acid was added, and the mixture was stirred for 5 minutes. Then, 0.05 mL of formic acid was added, and the mixture was heated at 80° C. for 4 hours with stirring. After the completion of the reaction, 20 mL of diethyl ether was added to the cooled reaction mixture. Precipitated crystals were collected by filtration. After being washed with diethyl ether, the crystals were dried at 120° C. under reduced pressure to yield 1.73 g (yield: 80%) of Compound E28

(3) Synthesis of Exemplified Compound A2

[Chem. 34]

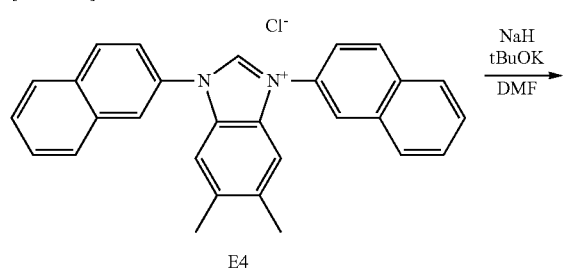

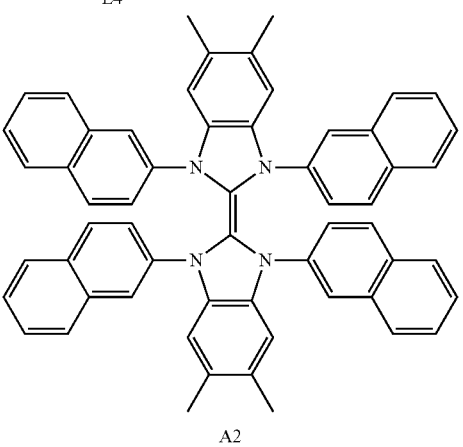

In a nitrogen flow, the following compound and solvent were added to a 100 mL recovery flask:

E4: 435 mg (1.00 mmol)

Dehydrated DMF: 5 mL

After degassing the resulting solution with nitrogen, 96 mg (4.00 mmol) of sodium hydride was added, and the mixture was stirred for 2 minutes. Then, 44 mg (0.4 mmol) of tBuOK was added, and the mixture was heated at 30° C. for 24 hours with stirring. After the completion of the reaction, 10 mL of water degassed with nitrogen was gradually added to the sample with stirring to precipitate the reaction product, and then the solvent was removed using a syringe. After the operation of adding 10 mL of water degassed with nitrogen and then removing the solvent using the syringe was performed twice, 10 mL of degassed hexane was added, and the sample was washed and dispersed with ultrasonic waves. Then, the reaction product was collected by filtration through a membrane filter and washed with hexane to yield 267 mg (yield: 67%) of Exemplified Compound A2 in yellow powder.

The resulting compound was subjected to matrix-assisted laser desorption/ionization time-of-flight mass spectrometry (MALDI-TOF-MS) using Autoflex LRF manufactured by Bruker.

Measured value: m/z=796.33; Calculated value: 796.36

CV measurement was performed in 0.1 M solution of tetrabutylammonium per-chlorate in N,N-dimethylformamide with a Ag/Ag$^+$ reference electrode, a Pt counter electrode, and a glassy carbon working electrode. The potential scan rate was 0.5 V/s.

For this measurement, an electrochemical analyzer Model 660C manufactured by ALS was used. Oxidation potential was −0.98 V.

Process for Synthesizing Organic Compound of General Formula (6)

[Chem. 35]

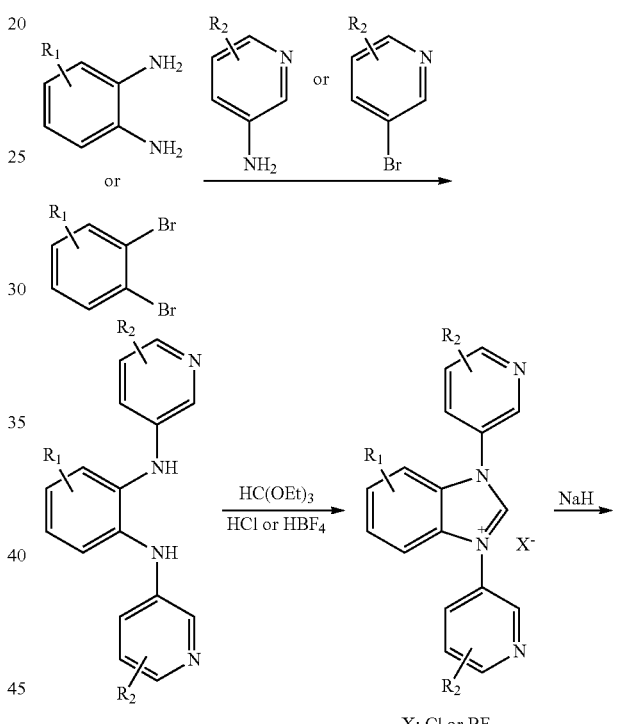

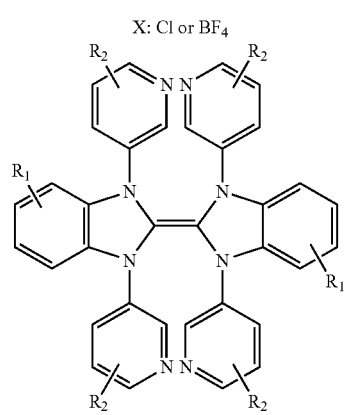

A variety of organic compounds represented by general formula (6) can be synthesized by appropriately replacing the reagents corresponding to $R_1$ and $R_2$. For example, Exemplified Compound A2 of general formula (6) was synthesized by the following scheme.

121

(1) Synthesis of Compound E3

[Chem. 36]

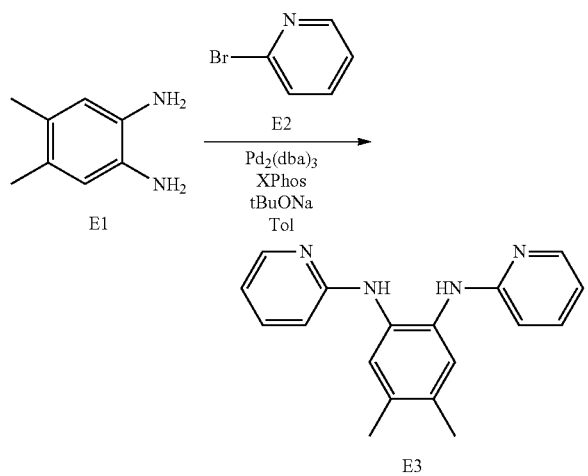

The following compounds and solvents were added to a 100 mL recovery flask:
E1: 1.36 g (10.0 mmol)
E2: 3.30 g (21.0 mmol)
Tris(dibenzylideneacetone)dipalladium (0): 274 mg (0.3 mmol)
2-Dicyclohexylphosphino-2',4',6'-triisopropylbiphenyl: 333 mg (0.7 mmol)
Sodium tert-butoxide: 2.31 g (24.0 mmol)
Toluene: 50 mL The resulting solution was heated to reflux for 8 hours with stirring. After the completion of the reaction, the reaction mixture was filtered through celite and then subjected to separation by adding water. The separated reaction product was purified by silica gel column chromatography (eluent: heptane/chloroform=3/1 to 2/1) to yield 1.77 g (yield: 61%) of Compound E3.

(2) Synthesis of Compound E4

[Chem. 37]

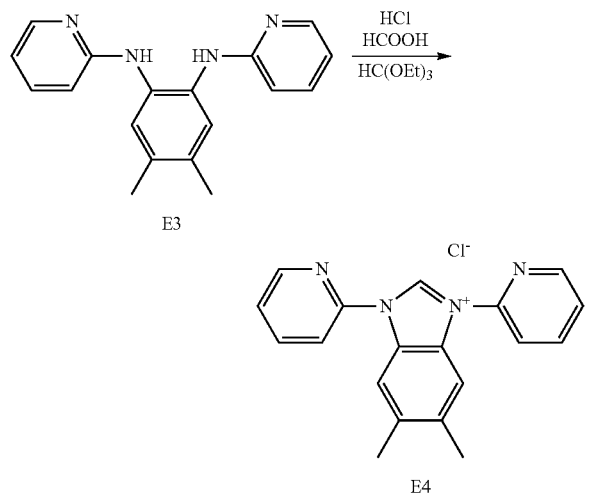

The following compound and solvent were added to a 100 mL recovery flask:
E27: 1.45 g (5.00 mmol)
Triethyl orthoformate: 50 mL
To the resulting solution, 0.8 mL of 12 N hydrochloric acid was added, and the mixture was stirred for 5 minutes.

122

Then, 0.05 mL of formic acid was added, and the mixture was heated at 80° C. for 4 hours with stirring. After the completion of the reaction, 20 mL of diethyl ether was added to the cooled reaction mixture. Precipitated crystals were collected by filtration. After being washed with diethyl ether, the crystals were dried at 120° C. under reduced pressure to yield 1.51 g (yield: 90%) of Compound E4.

(3) Synthesis of Exemplified Compound A2

[Chem. 38]

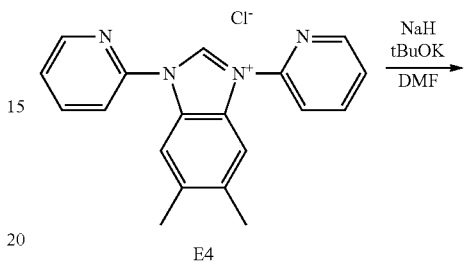

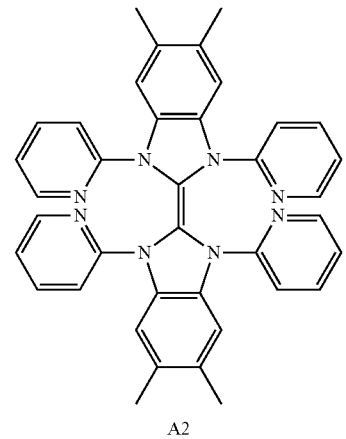

In a nitrogen flow, the following compound and solvent were added to a 100 mL recovery flask:
E4: 336 mg (1.00 mmol)
Dehydrated DMF: 5 mL After degassing the resulting solution with nitrogen, 96 mg (4.00 mmol) of sodium hydride was added, and the mixture was stirred for 2 minutes. Then, 44 mg (0.4 mmol) of tBuOK was added, and the mixture was heated at 30° C. for 24 hours with stirring. After the completion of the reaction, 10 mL of water degassed with nitrogen was gradually added to the sample with stirring to precipitate the reaction product, and then the solvent was removed using a syringe. After the operation of adding 10 mL of water degassed with nitrogen and then removing the solvent using the syringe was performed twice, 10 mL of degassed hexane was added, and the sample was washed and dispersed with ultrasonic waves. Then, the reaction product was collected by filtration through a membrane filter and washed with hexane to yield 210 mg (yield: 77%) of Exemplified Compound A2 in yellow powder.

The resulting compound was subjected to matrix-assisted laser desorption/ionization time-of-flight mass spectrometry (MALDI-TOF-MS) using Autoflex LRF manufactured by Bruker.

Measured value: m/z=600.29; Calculated value: 600.27

CV measurement was performed in 0.1 M solution of tetrabutylammonium per-chlorate in N,N-dimethylformamide with a Ag/Ag$^+$ reference electrode, a Pt counter electrode, and a glassy carbon working electrode. The potential scan rate was 0.5 V/s.

For this measurement, an electrochemical analyzer Model 660C manufactured by ALS was used. Oxidation potential was −0.74V.

Imaging Device Including Organic Photoelectric Conversion Element

By replacing the organic compound used in the first organic compound layer, another organic photoelectric conversion element for light having a different color can be produced. An organic photoelectric conversion element for light having a different color implies that the element converts light in a different wavelength range from the light to be photoelectrically converted by other photoelectric conversion elements.

The organic photoelectric conversion element of an embodiment of the present invention may be used in an optical area sensor. The optical area sensor includes a plurality of organic photoelectric conversion elements arranged in a two-dimensional array defined by rows and columns. In this structure, the organic photoelectric conversion elements each generate charges and independently output the charges, and thus the optical area sensor provides information representing the distribution of light intensity in a specific light-receiving area.

Each of the plurality of organic photoelectric conversion elements of the optical area sensor may be provided with an additional optical photoelectric conversion element capable of converting light having a different color into electric energy. The additional organic photoelectric conversion element is disposed on the other organic photoelectric conversion element. The additional organic photoelectric conversion element photoelectrically converts light having a wavelength different from the light to be converted by the other organic photoelectric conversion element.

The organic photoelectric conversion element of an embodiment of the present invention may be used in an imaging device. The imaging device includes a plurality of pixels and a signal processing section. The plurality of pixels are arranged in a matrix manner including a plurality of rows and a plurality of columns. Each pixel in this structure outputs a signal to provide an image signal.

In the imaging device, each pixel includes at least one organic photoelectric conversion element.

The pixel may include a readout circuit connected to the organic photoelectric conversion element. The readout circuit includes a transistor that outputs, for example, signals according to the charge generated in the organic photoelectric conversion element.

The pixel may further include an additional organic photoelectric conversion element capable of photoelectrically converting light having a different color from the light to be converted by the other organic photoelectric conversion element. The additional organic photoelectric conversion element is disposed on the other organic photoelectric conversion element. The additional organic photoelectric conversion element photoelectrically converts light having a wavelength different from the light to be converted by the other organic photoelectric conversion element. When these two types of organic photoelectric conversion elements are combined, the imaging device does not need color filters.

The pixel may include a plurality of organic photoelectric conversion elements. Such a structure enables phase difference auto-focusing on an imaging surface. Two or more of the plurality of pixels may share a readout circuit.

The imaging device may include a wavelength selecting section. The wavelength selecting section may be a color filter. The color filter is disposed near the side through which light enters. For an organic photoelectric conversion element for a specific color, it is desirable that the color filter transmit light having the specific color. A specific color refers to light in a range of specific wavelengths. In the imaging device, a plurality of color filters may be provided, one for each pixel, or a single color filter may be shared by the plurality of pixels.

Alternatively, the wavelength selecting section may be a prism that separates out light having a specific wavelength.

The imaging device may include a microlens. The microlens is disposed near the side through which light enters and is adapted to collect incoming light to a photoelectric conversion portion. A plurality of microlenses may be provided, one for each pixel, or a single microlens may be shared by the plurality of pixels.

When the organic photoelectric conversion element of an embodiment of the present invention is used in an imaging device, an optical filter may be disposed near the side of the imaging device through which light enters. The optical filter may be a low-pass filter, a UV-cut filter capable of removing light having wavelengths lower than or equal to the wavelengths of ultraviolet radiation, or an IR-cut filter capable of removing infrared radiation. Since the optical filter reduces noise, the imaging device can form high-quality images.

The organic photoelectric conversion element of an embodiment of the present invention may be used in an imaging apparatus. An imaging apparatus includes an imaging optical system having a plurality of lenses, and an imaging device capable of receiving light that has passed through the imaging optical system. Alternatively, the imaging apparatus includes a joint section that can be connected to an imaging optical system, and an imaging device.

More specifically, the imaging apparatus may be a digital camera or a digital still camera.

The imaging apparatus may further include a receiver adapted to receive a signal from the outside. The signal that the receiver receives is used for controlling at least the imaging range, imaging start point and imaging end point of the imaging apparatus. The imaging apparatus may further include a transmitter adapted to transmit an obtained image to the outside. The transmission is performed in a wired manner or a wireless manner. For the wireless transmission, a known communication system may be used, such as Wi-Fi or Bluetooth (registered trademark).

The presence of the receiver and the transmitter enables the imaging apparatus to be used as a network camera.

Measurement of Ionization Potential of Organic compound

The ionization potential of Exemplified Compound A1, which is represented by general formula (1), was measured in accordance with the following procedure.

A layer of the organic compound was formed on an Al/Nd substrate by vacuum deposition using resistance heating at $5 \times 10^{-3}$ Pa in a vacuum chamber. The organic compound layer was formed to a thickness of 150 nm to 200 nm. The ionization potential of the resulting layer was measured with an atmospheric photoelectron spectrometer (AC-2 manufactured by Riken Keiki).

Measurement of Band Gap of Organic Compound

The band gap of Exemplified Compound A1, which is represented by general formula (1), was measured in accordance with the following procedure.

A layer of the organic compound was formed on an Al/Nd substrate by vacuum deposition using resistance heating at $5 \times 10^{-3}$ Pa in a vacuum chamber. The organic compound layer was formed to a thickness of 150 nm to 200 nm.

The absorption spectrum of the organic compound layer was measured with an ultraviolet-visible spectrophotometer (V-560 manufactured by JASCO Corporation). The band gap was determined from the absorption edge of the absorption spectrum.

Measurement of Water Resistance

A 50 nm-thick organic compound layer was formed of Exemplified Compound A3 on a silicon substrate by vapor deposition.

Water was dropped onto the resulting organic compound layer and was allowed to stand for 10 minutes. The thickness of the organic compound layer was however not reduced. This suggests that the rate of decrease in thickness was 1% or less. It was confirmed that Exemplified Compound A3 has a high water resistance.

According to the present invention, there is provided an organic photoelectric conversion element in which holes generated by photoelectric conversion can efficiently move to the cathode.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. An organic photoelectric conversion element comprising:
   an anode;
   a cathode;
   a photoelectric conversion portion disposed between the anode and the cathode, the photoelectric conversion portion including a first organic compound layer containing an organic compound; and
   a second organic compound layer disposed between the cathode and the photoelectric conversion portion,
   wherein the second organic compound layer contains at least one selected from the group consisting of imidazolidene derivatives, benzoimidazolidene derivatives, and acridinylidene derivatives.

2. The organic photoelectric conversion element according to claim 1, wherein the second organic compound layer contains an organic compound having an ionization potential of 5.1 eV or less and a band gap of 2.5 eV or more.

3. The organic photoelectric conversion element according to claim 1, wherein the electron affinity of the organic compound in the second organic compound layer is 0.5 eV or more lower than the electron affinity of the organic compound in the first organic compound layer.

4. The organic photoelectric conversion element according to claim 1, wherein the electron affinity of the organic compound in the second organic compound layer is 1.0 eV or more lower than the work function of the cathode.

5. The organic photoelectric conversion element according to claim 1, wherein an ionization potential of the organic compound in the second organic compound layer is lower than that of the organic compound in the first organic compound layer.

6. The organic photoelectric conversion element according to claim 5, wherein the ionization potential of the organic compound in the second organic compound layer is 0.5 eV or more lower than the ionization potential of the organic compound in the first organic compound layer.

7. The organic photoelectric conversion element according to claim 1, wherein the first organic compound layer contains a plurality of organic compounds.

8. The organic photoelectric conversion element according to claim 1, wherein the photoelectric conversion portion further includes a third organic compound layer disposed between the first organic compound layer and the anode.

9. The organic photoelectric conversion element according to claim 1, wherein the second organic compound layer contains an organic compound represented by any one of formulas (1) to (3) and (5):

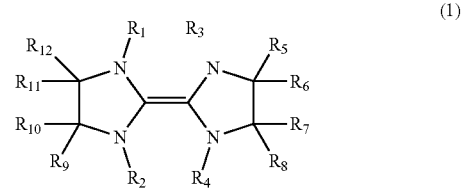

in formula (1), $R_1$ to $R_4$ each represent a group selected from the groups consisting of substituted or unsubstituted phenyl groups, substituted or unsubstituted benzyl groups, substituted or unsubstituted biphenyl groups, substituted or unsubstituted naphthyl groups, substituted or unsubstituted phenanthrenyl groups, substituted or unsubstituted fluorenyl groups, substituted or unsubstituted triphenylenyl groups, substituted or unsubstituted dibenzofuranyl groups, and substituted or unsubstituted dibenzothiophenyl groups;

$R_5$ to $R_{12}$ each represent a hydrogen atom or a group selected from the group consisting of alkyl groups having a carbon number in the range of 1 to 4 and substituted or unsubstituted aryl groups;

the aryl group may have an alkyl group having a carbon number in the range of 1 to 4 as a substituent,

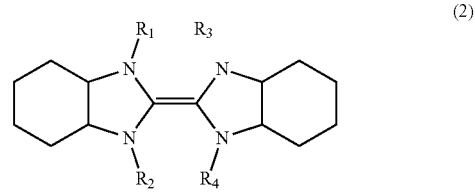

in formula (2), $R_1$ to $R_4$ each represent a group selected from the groups consisting of substituted or unsubstituted phenyl groups, substituted or unsubstituted biphenyl groups, substituted or unsubstituted naphthyl groups, substituted or unsubstituted phenanthrene groups, substituted or unsubstituted fluorenyl groups, substituted or unsubstituted triphenylene groups, substituted or unsubstituted dibenzofuran groups, and substituted or unsubstituted dibenzothiophene groups;

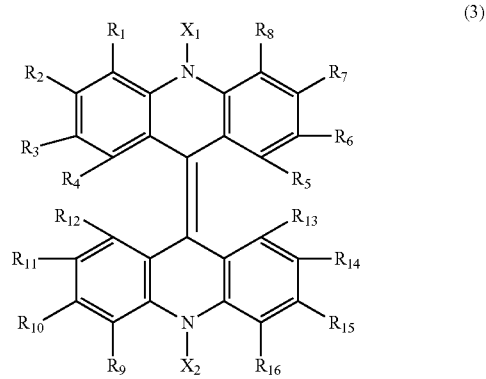

in formula (3), $X_1$ and $X_2$ each represent an aryl group which may have a halogen atom or an alkyl group;

$R_1$ to $R_{16}$ each represent a hydrogen atom or a substituent selected from the group consisting of halogen atoms, alkyl groups, and aryl groups,

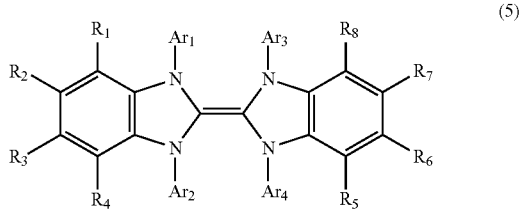
(5)

in formula (5), $Ar_1$ to $Ar_4$ each represent a substituted or unsubstituted aryl group or a substituted or unsubstituted heteromonocyclic group;
$R_1$ to $R_8$ each represent a hydrogen atom or a substituent selected from the group consisting of halogen atoms, alkyl groups having a carbon number in the range of 1 to 8, and substituted or unsubstituted aryl groups.

10. The organic photoelectric conversion element according to claim 1, wherein the second organic compound layer is in contact with the cathode.

11. An imaging device comprising:
a plurality of pixels arranged in a two-dimensional array including a plurality of rows and a plurality of columns; and
a signal processing section connected to the pixels,
wherein each of the pixels includes the organic photoelectric conversion element as set forth in claim 1, and a readout circuit connected to the organic photoelectric conversion element.

12. The imaging device according to claim 11, wherein each of the pixels further includes an additional organic photoelectric conversion element capable of photoelectrically converting light having a different color from the light to be converted by the other organic photoelectric conversion element, wherein the organic photoelectric conversion elements of each pixel are disposed one on the other.

13. The imaging device according to claim 12, further comprising at least one member selected from the group consisting of a wavelength selecting section, a microlens, and an optical filter near a side through which light enters.

14. The imaging device according to claim 13, wherein the at least one member is provided for each of the plurality of pixels.

15. An imaging apparatus comprising:
an imaging optical system; and
an imaging device as set forth in claim 11, the imaging device being capable of receiving light that has passed through the imaging optical system.

16. The imaging apparatus according to claim 15, wherein the imaging apparatus is a digital camera or a digital still camera.

17. The imaging apparatus according to claim 15, further comprising a receiver configured to receive a signal from the outside, the signal being used for at least one control of an imaging range thereof, an imaging start point thereof, and an imaging end point thereof.

18. The imaging apparatus according to claim 15, further comprising a transmitter configured to transmit an obtained image to the outside.

19. An imaging apparatus comprising:
a joint section capable of being connected to an imaging optical system; and
an imaging device as set forth in claim 11, the imaging device being capable of receiving light that has passed through the imaging optical system.

20. An organic device comprising:
an anode;
a cathode; and
an organic compound layer disposed between the anode and the cathode, wherein the organic compound layer contains an organic compound selected from the group consisting of imidazolidene derivatives, benzoimidazolidene derivatives, and acridinylidene derivatives.

21. The organic device according to claim 20, wherein the organic compound is represented by any one of formulas (1) to (3) and (5):

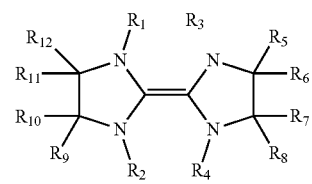
(1)

in formula (1), $R_1$ to $R_4$ each represent a group selected from the groups consisting of substituted or unsubstituted phenyl groups, substituted or unsubstituted benzyl groups, substituted or unsubstituted biphenyl groups, substituted or unsubstituted naphthyl groups, substituted or unsubstituted phenanthrenyl groups, substituted or unsubstituted fluorenyl groups, substituted or unsubstituted triphenylenyl groups, substituted or unsubstituted dibenzofuranyl groups, and substituted or unsubstituted dibenzothiophenyl groups;
$R_5$ to $R_{12}$ each represent a hydrogen atom or a group selected from the group consisting of alkyl groups having a carbon number in the range of 1 to 4 and substituted or unsubstituted aryl groups;
the aryl group may have an alkyl group having a carbon number in the range of 1 to 4 as a substituent,

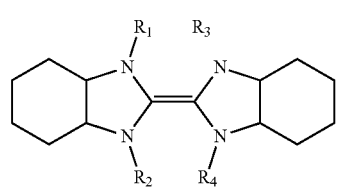
(2)

in formula (2), $R_1$ to $R_4$ each represent a group selected from the groups consisting of substituted or unsubstituted phenyl groups, substituted or unsubstituted biphenyl groups, substituted or unsubstituted naphthyl groups, substituted or unsubstituted phenanthrene groups, substituted or unsubstituted fluorenyl groups, substituted or unsubstituted triphenylene groups, substituted or unsubstituted dibenzofuran groups, and substituted or unsubstituted dibenzothiophene groups;

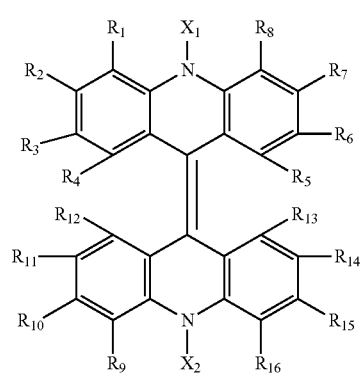
(3)

in formula (3), $X_1$ and $X_2$ each represent an aryl group which may have a halogen atom or an alkyl group;

$R_1$ to $R_{16}$ each represent a hydrogen atom or a substituent selected from the group consisting of halogen atoms, alkyl groups, and aryl groups,

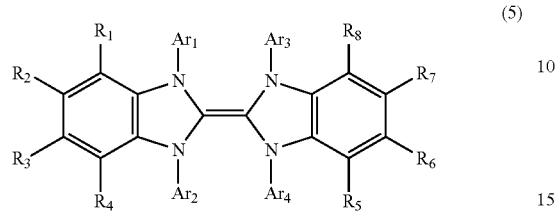

(5)

in formula (5), $Ar_1$ to $Ar_4$ each represent a substituted or unsubstituted aryl group or a substituted or unsubstituted heteromonocyclic group;

$R_1$ to $R_8$ each represent a hydrogen atom or a substituent selected from the group consisting of halogen atoms, alkyl groups having a carbon number in the range of 1 to 8, and substituted or unsubstituted aryl groups, (supported by paragraph 0062-0078 in the specification as filed).

22. The organic device according to claim 21, wherein the organic compound having an ionization potential of 5.1 eV or less and a band gap of 2.5 eV or more.

* * * * *